United States Patent [19]

Sugano et al.

[11] Patent Number: 5,202,285
[45] Date of Patent: Apr. 13, 1993

[54] SEMICONDUCTOR LASER HAVING DOUBLE HETEROSTRUCTURE AND METHOD OF PRODUCING SAME

[75] Inventors: Mami Sugano, Hadano; Akira Furuya; Toshiyuki Tanahashi, both of Atsugi; Makoto Kondo; Chikashi Anayama, both of Isehara, all of Japan

[73] Assignee: Fujitsu Limited, Kawasaki, Japan

[21] Appl. No.: 892,680

[22] Filed: Jun. 4, 1992

Related U.S. Application Data

[63] Continuation of Ser. No. 691,620, Apr. 25, 1991, abandoned.

[30] Foreign Application Priority Data

Apr. 26, 1990 [JP] Japan .................................. 2-108889
Jun. 20, 1990 [JP] Japan .................................. 2-159997

[51] Int. Cl.$^5$ .......................................... H01L 21/208
[52] U.S. Cl. ................................... 437/129; 437/126; 148/DIG. 95; 372/46; 257/79
[58] Field of Search ............... 437/129, 130, 131, 132, 437/133, 126; 148/DIG. 95; 372/45, 46; 357/17

[56] References Cited

U.S. PATENT DOCUMENTS

| | | | |
|---|---|---|---|
| 4,692,927 | 9/1987 | Sawai et al. | 357/17 |
| 4,701,927 | 10/1987 | Naka et al. | 357/17 |
| 4,813,050 | 3/1989 | Shima et al. | 372/45 |
| 4,894,840 | 1/1990 | Liau et al. | 372/46 |
| 4,940,672 | 7/1990 | Zavracky | 437/129 |
| 4,974,232 | 11/1990 | Morinaga et al. | 372/46 |
| 4,984,244 | 1/1991 | Yamamoto | 437/129 |
| 4,994,143 | 2/1991 | Kim | 437/129 |

FOREIGN PATENT DOCUMENTS

| | | |
|---|---|---|
| 136097A3 | 4/1985 | European Pat. Off. . |
| 234955A3 | 9/1987 | European Pat. Off. . |
| 55-158689 | 12/1980 | Japan . |
| 58-64085 | 7/1983 | Japan . |
| 62-200784 | 9/1987 | Japan . |
| 63-81884 | 4/1988 | Japan . |
| 64-30287 | 2/1989 | Japan . |
| 64-32692 | 9/1989 | Japan . |
| 1-313982 | 12/1989 | Japan . |

OTHER PUBLICATIONS

Kenneth M. Dzurko et al, "Low Threshold Quantum Well Lasers Grown by Metalorganic Chemical Vapor Deposition on Nonplanar Substrates", *IEEE Journal of Quantum Electronics*. New York: Jun. 1989.

*Primary Examiner*—Brian E. Hearn
*Assistant Examiner*—Kevin M. Picardat
*Attorney, Agent, or Firm*—Nikaido, Marmelstein, Murray & Oram

[57] ABSTRACT

A semiconductor laser includes a substrate having a (100) face as its main surface, where the substrate has a stripe of a first mesa extending in a <110> direction of the substrate and including a (111)B face as its sloping surface, a buried layer formed on the substrate excluding a top surface of the stripe of the first mesa so that the (111)B face of the stripe of the first mesa is covered a sloping surface part of the buried layer, where the top surface of the stripe of the first mesa is the (100) face of the substrate and forms a stripe of a second mesa together with the sloping surface of the buried layer and the stripe of the second mesa has a smaller inclination than the stripe of the first mesa, and a double heterostructure made up of a plurality of semiconductor layers and formed on the stripe of the second mesa. The double heterostructure has a substantially trapezoidal cross section which is determined by the stripe of the second mesa.

20 Claims, 43 Drawing Sheets

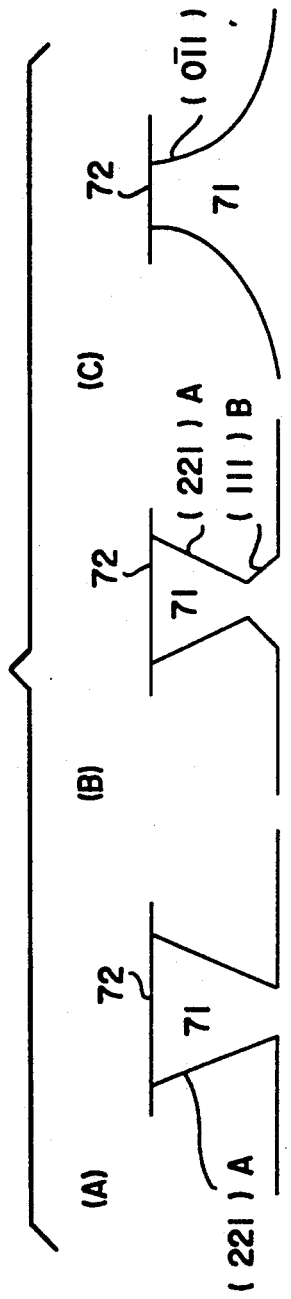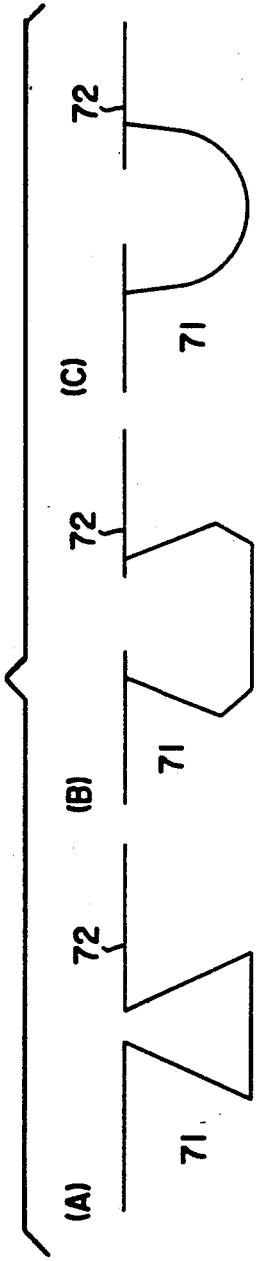

⊙⟨110⟩

$h_1 \approx h_2$ $h_2 < h_1$

730°C

SEMICONDUCTOR LASER HAVING DOUBLE HETEROSTRUCTURE AND METHOD OF PRODUCING SAME

This application is a continuation of application Ser. No. 691,620 filed Apr. 25, 1991, now abandoned.

BACKGROUND OF THE INVENTION

The present invention generally relates to semiconductor lasers and methods of producing the same, and more particularly to a semiconductor laser which has a double heterostructure and is designed to produce a large output and to a method of producing such a semiconductor laser.

Presently, as one means for increasing the memory capacity of computer systems, there are proposals to use an optical disk unit or a magneto-optic disk unit as a memory device. Accordingly, there is a demand for a semiconductor laser which can produce a large output so that the semiconductor laser may be used as a light source when storing information on the disk unit with a high density. For example, a visible-light semiconductor laser which emits a laser beam having a wavelength in the order of 0.6 μm is suited as the above light source.

Generally, AlGaInP system semiconductor lasers are made using metal organic vapor phase epitaxy (MOVPE). The reason for using the MOCVD is that the segregation coefficient of Al is too large and it becomes impossible to control the Al content when an attempt is made to grow the AlGaInP system semiconductor crystal by liquid phase epitaxy (LPE).

Various structures for controlling the mode f the semiconductor laser have been proposed and reduced to practice. However, most of the proposed structures are made using the LPE and utilize the growth peculiarity of the LPE such as the anisotropy. Very few of the proposed structures use the peculiarity of the MOVPE. In addition, even when an attempt is made to make using the MOVPE the semiconductor laser having the structure which is intended to be made by the LPE, it is extremely difficult to make the semiconductor laser by the MOVPE due to the growth peculiarity of the MOVPE.

For the above described reasons, there is a need to realize a semiconductor laser structure which is suited to be made utilizing the growth peculiarity of the MOVPE. Particularly, the realization of such a semiconductor laser structure is essential in the AlGaInP system semiconductor lasers.

The mode control structure of the known semiconductor lasers can roughly be divided into three kinds.

According to a first kind of mode control structure, a substrate side cladding layer, an active layer and a surface side cladding layer are successively formed on a flat substrate, and a current confinement structure for achieving lateral confinement of the current path or a ridge structure is formed at a part above the active layer. In this specification, this first kind of mode control structure will be referred to as the ridge type structure.

On the other hand, according to a second kind of mode control structure, a substrate side cladding layer, an active layer and a surface side cladding layer are successively formed on a flat substrate. Then, a mesa etching is made to a part which is deeper than the active layer, and a buried layer is formed to bury the mesa structure. In this specification, this second kind of mode control structure will be referred to as the buried type structure.

Furthermore, according to a third kind of mode control structure, a substrate is subjected to a predetermined process to make the substrate surface non-uniform, and a substrate side cladding layer, an active layer and a surface side cladding layer are successively formed on the non-uniform substrate surface. In this specification, this third kind of mode control structure will be referred to as the shaped substrate type structure.

In the following description, the index of crystal face and the stripe direction are defined as follows. That is, it is known that from the crystal point of view, there exist a plurality of faces which are equivalent to the (100) face. For example, the (001) face is equivalent to the (100) face, and in this case, the $<110>$ and $<1\bar{1}0>$ directions are respectively equivalent to the $<011>$ and $<01\bar{1}>$ directions. It is confusing to list all the equivalent faces, and in this specification, the (100) face represents a plurality of faces which are equivalent to the (100) face, and the stripe directions which correspond to the $<011>$ and $<01\bar{1}>$ stripe directions are respectively represented by the $<100>$ and $<1\bar{1}0>$ directions. In addition, the faces which are equivalent to the $(11\bar{1})$ face which appears at the sloping surface of the conventional mesa when the conventional mesa stripe is formed on the (100) face in the $<011>$ direction will be represented by the (111)B face. The faces which are equivalent to the (111) face which appears at the sloping surface of the conventional mesa when the conventional mesa stripe is formed on the (100) face in the $<01\bar{1}>$ direction will be represented by the (111)A face.

FIG. 1 shows a cross section of an essential part of a conventional semiconductor laser having the ridge type structure. The semiconductor laser shown in FIG. 1 includes an n-type GaAs substrate 1, an n-type AlGaInP cladding layer 2, an InGaP active layer 3, a p-type AlGaInP cladding layer 4, a p-type InGaP buffer layer 5, an n-type GaAs current confinement layer 6, a p-type GaAs cap layer 7, a p side electrode 8 and an n side electrode 9.

This ridge type structure is popularly used in the AlGaInP system semiconductor lasers for the following reasons. That is, because the n-type cladding layer 2 to the p-type cladding layer 5 can be successively formed on the substrate 1 in one growth process, there is only a small possibility of a defect being formed in the active layer 3. Accordingly, it is possible to form a satisfactory double heterostructure. In addition, although it is difficult to obtain a satisfactory surface morphology in the case of a layer including Al, there is no need to form an AlGaInP layer on the layer which includes Al. The current confinement structure and an optical waveguide structure due to loss guide can be realized by simply growing the n-type GaAs which forms the current confinement layer 6 and the p-type GaAs which forms the cap layer 7. Therefore, a satisfactory morphology can be obtained after the second and third growth processes because of the generally unrestricted range of conditions.

FIG. 2 shows a cross section of an essential part of a conventional semiconductor laser using the buried type structure. The semiconductor laser shown in FIG. 2 includes an n-type GaAs substrate 21, an n-type AlGaInP cladding layer 22, an InGaP active layer 23, a p-type AlGaInP cladding layer 24, a p-type InGaP buffer layer 25, a semiinsulative AlInP buried layer 26, a p-type GaAs cap layer 27, a p side electrode 28 and an n side electrode 29. In FIG. 2, W denotes a stripe width. This buried type structure is popularly used in the InP-/InGaAsP system semiconductor lasers.

FIG. 3 shows a cross section of an essential part of a conventional semiconductor laser using the shaped substrate type structure. The semiconductor laser shown in FIG. 3 includes a p-type GaAs substrate 31, an n-type GaAs current confinement layer 32, a p-type InGaP buffer layer 33, a p-type AlGaInP cladding layer 34, an InGaP active layer 35, an n-type AlGaInP cladding layer 36 and an n-type GaAs cap layer 37. Presently, this shaped substrate type structure has the most advantageous structure from the point of view of producing a large output.

Next, a description will be given of the problems encountered in the conventional semiconductor lasers using the ridge type, buried type and shaped substrate type structures.

The problem of the ridge type structure shown in FIG. 1 is that this structure employs the loss guide system. Special circumstances occurring in the case of the AlGaInP system semiconductor laser will now be described in detail.

AlGaInP is a 4-element mixed crystal having a thermal resistance which is three times that of the AlGaAs system and over seventeen times that of the InP system. Hence, care should be taken when using AlGaInP so that a saturation does not occur due to heat. In order to suppress the generation of heat so as to prevent the saturation due to the heat, the length of the cavity is normally made long to reduce the density of the current flowing to the active layer. In addition, the small gain is increased by use of the long cavity so that it is possible to obtain a total gain required for the laser oscillation.

However, the loss per unit length is large because this ridge type structure uses the loss guide system. For this reason, the differential quantum efficiency $\eta_d$ greatly deteriorates as the cavity length becomes longer as may be seen from the following formula, where $\eta_i$ denotes the internal quantum efficiency, $\alpha$ denotes the waveguide loss, L denotes the cavity length, R denotes the reflectivity of the laser edge facet and $l_n$ denotes the function describing natural logarithm.

$$\eta_d = \eta_i \times [(1/L)l_n(1/R)]/[\alpha + (1/L)l_n(1/R)]$$

In other words, when the waveguide loss $\alpha$ is large and the cavity length L is large, it can be readily seen from the above formula that the differential quantum efficiency $\eta_d$ rapidly approaches zero.

Accordingly, the quantum efficiency of the loss guide system is poor, and it is extremely difficult to produce an output of 50 mW or greater while making the mode control by the loss guide. In addition, the light absorption at the n-type GaAs current confinement layer 6 is fed back as heat as the output becomes larger, thereby heating the semiconductor laser itself and making it difficult to produce a large output.

In order to overcome the above described problems of the ridge type structure, it is conceivable to carry out both the mode control and the current confinement by forming the current confinement layer 6 from an n-type AlInP which includes a quantity of Al greater than that included in the p-type AlGaInP cladding layer 4. In this case, however, it becomes necessary to form a layer which includes Al on a layer which includes Al. Normally, the morphology and characteristic of an AlInP layer is greatly affected by the surface on which the AlInP layer is formed, but generally, Al oxides tend to remain on the surface of the layer which includes Al. Hence, it is difficult to form the AlInP layer on the layer which includes Al.

Therefore, it is extremely difficult to produce a large output from the semiconductor laser using the ridge type structure.

On the other hand, various problems occur when the buried type structure shown in FIG. 2 is applied to the AlGaInP system semiconductor laser which emits a laser beam having a wavelength in the order of 0.6 $\mu m$. First, the stripe width W which guarantees the zeroth transverse mode is narrow. Normally, in the semiconductor laser which emits a laser beam having a wavelength in the order of 1.5 $\mu m$, the stripe width W with which the transverse mode becomes single is 2 $\mu m$ or less, but the stripe width W becomes approximately ½ or 1 $\mu m$ or less in the case of the semiconductor laser which emits a laser beam having a wavelength in the order of 0.6 $\mu m$. Accordingly, it becomes necessary to carry out a mesa etching by setting the stripe width W to 1 $\mu m$ or less. Such a mesa etching may be realized using a reactive ion etching (RIE). But when the RIE is used, the crystal surface is damaged and it becomes impossible to satisfactory grow a layer on the damaged crystal surface. For this reason, the mesa etching must be made by a wet etching, but it is virtually impossible to accurately carry out the mesa etching to form the stripe width W of 1 $\mu m$ or less with a satisfactory reproducibility.

In addition, the semiinsulative AlInP buried layer 26 must be formed on the layer which includes Al, similarly as in the case of the ridge type structure, and it is impossible to satisfactorily form the semiinsulative AlInP buried layer 26.

Furthermore, in the AlGaInP system semiconductor laser, the energy band gap of the active layer is large and the voltage applied above and below the active layer is high during the operation. For example, the energy band gap of the InGaP active layer 23 is 1.85 eV or greater. Generally, the buried type structure suffers from a problem in that a leak current flows via the interface state at the interface between the mesa etched surface and the buried layer, and the rise of the operation voltage directly leads to the increase of the leak current. Moreover, since the buried layer 26 is formed on the layer which includes Al, the interface state exists at the interface between the mesa etched surface and the buried layer 26, making it difficult to reduce the leak current, and causes the decrease of the differential quantum efficiency $\eta_d$. In addition, because the stripe width W is made narrow for the transverse mode control, the light energy density increases when producing the high output, and there is a problem in that a catastrophical optical damage (COD) breakdown easily occurs.

For the above described reasons, the buried type structure also has a large number of problems to be solved in order to produce a large output, similarly as in the case of the ridge type structure.

Next, the shaped substrate type structure shown in FIG. 3 will be studied. The shaped substrate type structure does not use the loss guide system, but uses the waveguide structure of the index guide by bending the active layer so that a small loss is realized. In addition, there is no need to form a layer which includes Al on a layer which includes Al. Hence, when the peculiarity of the AlGaInP system material is considered, the shaped substrate type structure may be best suited for producing a large output.

A description will be given of a method of producing the conventional semiconductor laser using the shaped substrate type structure. Normally, the shape of the substrate surface is formed by one of two methods or a combination thereof. In other words, an etching, a selective growth, or a combination of etching and selective growth may be used to form the shape of the substrate surface.

FIG. 4 shows a cross section of an essential part of the semiconductor laser using the shaped substrate type structure produced by the etching. The semiconductor laser shown in FIG. 4 includes an n-type GaAs substrate 41, a p-type GaAs current confinement layer 42, an n-type AlGaInP cladding layer 43, an InGaP active layer 44, a p-type AlGaInP cladding layer 45, a p-type InGaP buffer layer 46, a p-type GaAs contact layer 47, a guided light pattern 48 and an absorbing part 49. W denotes the stripe width, $\theta$ denotes the inclination angle of the current confinement layer 42, and d denotes the thickness of the cladding layer 43.

When producing the semiconductor laser shown in FIG. 4, the p-type GaAs current confinement layer 42 is formed on the n-type GaAs substrate 41, and an etching is made in a $<1\bar{1}1>$ direction in which a conventional mesa can be formed using a $H_2SO_4 + H_2O_2 + H_2O$ system etchant. Thereafter, the n-type AlGaInP cladding layer 43, the InGaP active layer 44, the p-type AlGaInP cladding layer 45, the p-type InGaP buffer layer 46 and the p-type GaAs contact layer 47 are successively formed on the conventional mesa structure.

However, the following problems occur.

First, when etching the current confinement layer 42, the inclination angle $\theta$ becomes approximately 50° and large when the normal etchant is used. Hence, the active layer 44 which is formed on above the current confinement layer 42 having the large inclination angle $\theta$ makes a large curve. As a result, the difference in the transverse refractive indexes which affects the laser beam becomes considerably large, and the stripe width W which can maintain the single transverse mode becomes 1 μm or less. Consequently, problems similar to those encountered in the buried type structure are generated.

Second, when the thickness d of the n-type AlGaInP cladding layer 43 is made large in order to prevent the guided light from being absorbed within the p-type GaAs current confinement layer 42, the thermal resistance increases considerably and it becomes impossible to obtain a continuous wave (CW) oscillation due to the peculiarity of the AlGaInP system material that the thermal resistance thereof is considerably large.

Therefore, it was confirmed that it is extremely difficult to produce the semiconductor laser having the shaped substrate type structure by the etching.

FIGS. 5 and 6 respectively show cross sections of an essential part of the semiconductor laser using the shaped substrate type structure at essential stages of the selective growth production process.

As methods of realizing the selective growth, it is possible to use the LPE, MOVPE, molecular beam epitaxy (MBE) and the like. However, it is better to form the AlGaInP system material by the MOVPE because additional equipment is required for the mass production when a method other than the MOVPE is used to form the shape of the shaped substrate and also because the MOVPE is best suited for growing a uniform layer on a large area. Hence, the MOVPE was used to form a layer of the AlGaInP system material.

It is desirable to use GaAs or AlGaAs as the material for forming the desired shape because these materials are lattice matched to GaAs and the thermal resistance of these materials is small compared to that of the AlGaInP system material.

Generally, when selectively growing a GaAs or AlGaAs layer by the MOVPE or growing the GaAs or AlGaAs layer on the shaped substrate, the following facts have been confirmed. For the sake of convenience, it is assumed that the material used is $Al_xGa_{1-x}As$, where $x \leq 0.3$, and is substantially GaAs.

GaAs has a characteristic such that the growth on the surface having (111)B as the index of crystal face is extremely slow. Accordingly, when a GaAs layer is grown in a state where the GaAs substrate is masked in the $<1\bar{1}0>$ direction, the GaAs layer grows on the (111)A face of the conventional mesa but does not grow on the (111)B face of the re-entrant mesa.

FIG. 5 shows the above selective growth of the GaAs layer. The semiconductor laser includes a GaAs substrate 51, a $SiO_2$ layer 52 and a GaAs layer 53. As shown, the cross section of the GaAs layer 53 becomes hexagonal by the selective growth.

But when the GaAs layer 53 is grown on the GaAs substrate 51 which is masked in the $<110>$ direction, the (111)B face forms the conventional mesa. Hence, the cross section of the GaAs layer 53 becomes trapezoidal, and the growth stops when a vertex part of a triangular cross section is formed.

FIG. 6 shows the formation of the GaAs layer 53 having the triangular cross section. In FIG. 6, those parts which are the same as those corresponding parts in FIG. 5 are designated by the same reference numerals, and a description thereof will be omitted.

The growth characteristics explained in conjunction with FIGS. 5 and 6 also holds true when a semiconductor layer is formed on the shaped substrate having the mesa structure. For example, when growing the semiconductor layer on the conventional mesa stripe which extends in the $<1\bar{1}0>$ direction, the (111)A face appears at the sloping surface of the mesa and the semiconductor layer is grown on the conventional mesa stripe including the (111)A face. When growing the semiconductor layer on the conventional mesa stripe which extends in the $<110>$ direction, the mesa stripe has a triangular cross section at the central part and the semiconductor layer having a gradual sloping surface which is the (311)B face grows from the flat surface and crawls on the mesa side surface.

FIG. 7 shows a cross section of a structure for explaining the growth of the semiconductor layer on the conventional mesa which is formed by the etching and extends in the $<1\bar{1}0>$ direction. The structure shown in FIG. 7 includes a substrate 61, a mesa stripe 61A which extends in the $<1\bar{1}0>$ direction, a first semiconductor layer 62 and a second semiconductor layer 63.

FIG. 8 shows a cross section of a structure for explaining the growth of the semiconductor layer on the conventional mesa which is formed by the etching and extends in the $<110>$ direction. In FIG. 8, those parts which are the same as those corresponding parts in FIG. 7 are designated by the same reference numerals, and a description thereof will be omitted. In this case, the surface of the semiconductor layer 63 which is formed on the mesa stripe 61A has a index of crystal face (100).

For example, a sloping surface having an extremely small angle with respect to the substrate surface as shown in FIG. 8 is extremely difficult to form by the etching. However, if a mesa stripe having such a gradual sloping surface can be formed and applied to the semiconductor laser having the shaped substrate type structure, it would be possible to set the stripe width W for maintaining the single transverse mode to a large value and thereby enable a large output to be produced.

FIG. 9 shows a cross section of an essential part of a known GaAs/AlGaAs system semiconductor laser which is produced using the shaped substrate having the gradual sloping surface. The semiconductor laser includes a p-type GaAs substrate 61, a p-type GaAs buffer layer 62, a p-type AlGaAs buffer layer 63, an n-type GaAs current confinement layer 64, a p-type AlGaAs cladding layer 65, an AlGaAs active layer 66, an n-type AlGaAs cladding layer 67, an n-type GaAs contact layer 68, an n side metal electrode 69 and a p side metal electrode 70. W denotes the stripe width required to maintain the single transverse mode, $\theta$ denotes the angle formed by the (100) face and a line which connects an intersection point of the (100) face and the (111)B face and a line which defines the stripe width W.

According to this semiconductor laser, the layers up to the contact layer 68 are continuously grown on the substrate 61 indicated by a broken line, and the transverse mode control is made by use of the bend where the (100) face and the (311)B face of the active layer 66 meet.

But when the method used to produce the semiconductor laser shown in FIG. 9 is used as it is to produce the AlGaInP system semiconductor laser, the following problems occur.

That is, as may be seen from FIG. 9, the flat part of the active layer 66 spreads with reference to the vertex where the (111)B faces of the substrate 61 meet. For this reason, in order to prevent the COD breakdown even when the large output is produced, it is necessary to make the cladding layer 65 under the active layer 66 thick. But in the AlGaInP system semiconductor laser, the cladding layer 65 is of course made of AlGaInP which is a 4-element material having a large thermal resistance as described above. Therefore, the thermal resistance would become even larger if the thickness of the cladding layer 65 is increased, and the CW oscillation would become impossible.

On the other hand, other types of semiconductor lasers have been proposed in Japanese Laid-Open Patent Applications No.55-158689, No.64-30287 and the like.

FIG. 10 shows a semiconductor laser proposed in the Japanese Laid-Open Patent Application No.55-158689. This semiconductor layer includes an n-type GaAs substrate 920, a p-type $Ga_{1-1}Al_xAs$ current blocking layer 921, an n-type $Ga_{1-x}Al_xAs$ cladding layer 922, an n or p-type GaAs active layer 923, a p-type $Ga_{1-x}Al_xAs$ cladding layer 924, a p-type GaAs ohmic contact layer 925, a p mode electrode 926, an n side electrode 927, a triangular prism shaped mesa part 928, a damaged part 929 and a light emitting region 930.

However, according to this structure, since the angle $\theta$ of the mesa part 928 is large and the mesa part 928 is formed by the LPE, the active layer 923 formed thereon greatly curves. For this reason, the stripe width which in effect determines the waveguide is restricted by the bent part of the active layer 923, and it is extremely difficult to form the active layer 923 to a width of 2 $\mu$m or greater in this structure. Consequently, the degree of freedom with which the stripe width can be controlled is extremely small.

On the other hand, FIG. 11 shows shows a semiconductor laser proposed in the Japanese Laid-Open Patent Application No.64-30287. This semiconductor layer includes a p-type GaAs substrate 901, a stripe convex part 902, a p-type GaAs buffer layer 903, p-type AlGaAs cladding layers 904 and 906, a current blocking layer 905, an AlGaAs active layer 907, an n-type AlGaAs cladding layer 908, an n-type GaAs contact layer 909, an n side ohmic electrode 910 and a p side ohmic electrode 911.

This structure basically employs the same principle as the structure shown in FIG. 9, and the stripe width and the thickness of the cladding layer cannot be selected independently. This structure differs from that shown in FIG. 9, however, in that the stripe convex part 902 formed on the substrate 901 has a re-entrant mesa shape. The cladding layer 904 which is formed on the substreate 901 grows on the side surface of the re-entrant mesa of the stripe convex part 902 and on the (111)B face at the side surface of the conventional mesa at the upper part of the stripe convex part 902. However, when the side surface of the re-entrant mesa and the side surface of the conventional mesa in the stripe convex part 902 have completely different indexes of crystal face, it was found from the experiments conducted by the present inventors that the morphology of the cladding layer 904 at such side surfaces becomes extremely poor. The present inventors have also found from other experiments that the morphology of a layer is satisfactory when the layer is grown on a side surface which is made up of only the (111)B face on which the layer growth is slow. For the above described reasons, it is difficult to produce a smooth stripe structure in the semiconductor laser proposed in the Japanese Laid-Open Patent Application No.64-30287. Furthermore, since the scattering loss is large, it is impossible to produce a large output from this semiconductor laser. It was also found from the experiments conducted by the present inventors that the side surface of the mesa is desirably made up solely of the (111)B face.

For the foregoing reasons, there is a problem in that the semiconductor lasers shown in FIGS. 10 and 11 are also unsuited for producing a large output.

Another semiconductor laser having the mesa structure is also proposed in a Japanese Laid-Open Patent Application No.64-32692. However, illustration and description thereof will be omitted in this specification because the proposed structure is basically similar to the structure shown in FIG. 11.

SUMMARY OF THE INVENTION

Accordingly, it is a general object of the present invention to provide novel and useful semiconductor laser and method of producing the same, in which the problems described above are eliminated.

Another and more specific object of the present invention is to provide a semiconductor laser comprising a substrate having a (100) face as its main surface, where the substrate has a stripe of a first mesa extending in a <110> direction of the substrate and including a (111)B face as its sloping surface, a buried layer formed on the substrate excluding a top surface of the stripe of the first mesa so that the (111)B face of the stripe of the first mesa is covered a sloping surface part of the buried layer, where the top surface of the stripe of the first mesa is the (100) face of the substrate and forms a stripe of a second mesa together with the sloping surface of the buried layer and the stripe of the second mesa has a smaller inclination than the stripe of the first mesa, and a double heterostructure made up of a plurality of semiconductor layers and formed on the stripe of the second mesa, where the double heterostructure has a substantially trapezoidal cross section which is determined by the stripe of the second mesa. According to the semiconductor laser of the present invention, it is possible to make the stripe width sufficiently wide even when the cladding layer under the active layer is made thin so as to improve the heat release because the stripe width is determined by the stripe of the second mesa. Hence, the single transverse mode control can be made satisfactorily, and the present invention is particularly suited for the production of an AlGaInP system semiconductor laser using the MOVPE.

Still another object of the present invention is to provide a method of producing a semiconductor laser comprising the steps of patterning a dielectric layer which is formed on a (100) face of a substrate into a stripe, forming a stripe of a first mesa by making a mesa etching of the substrate using the stripe of the dielectric layer as a mask, where the stripe of the first mesa includes a (111)B face as its sloping surface, removing eaves of the dielectric layer which is used as the mask in the previous step by an etching, forming a buried layer by a metal organic vapor phase epitaxy (MOVPE) using the remaining dielectric layer as a mask so that the buried layer is formed on the substrate excluding a top surface of the stripe of the first mesa and the (111)B face of the stripe of the first mesa is covered a sloping surface part of the buried layer, where the top surface of the stripe of the first mesa is the (100) face of the substrate and forms a stripe of a second mesa together with the sloping surface of the buried layer and the stripe of the second mesa has a smaller inclination than the stripe of the first mesa, removing the dielectric layer by an etching, and forming a double heterostructure made up of a plurality of semiconductor layers on the stripe of the second mesa by a metal organic vapor phase epitaxy (MOVPE). According to the method of the present invention, it is possible to make the stripe width sufficiently wide even when the cladding layer under the active layer is made thin so as to improve the heat release because the stripe width is determined by the stripe of the second mesa. Hence, the single transverse mode control can be made satisfactorily, and the present invention is particularly suited for the production of an AlGaInP system semiconductor laser using the MOVPE.

A further object of the present invention is to provide a method of producing a semiconductor laser comprising the steps of patterning a dielectric layer which is formed on a main surface of a substrate into a stripe, forming a stripe of a first mesa by making a mesa etching of the substrate using the stripe of the dielectric layer as a mask, where the stripe of the first mesa has a top surface and a sloping surface, removing eaves of the dielectric layer which is used as the mask in the previous step by an etching, forming a buried layer by a metal organic vapor phase epitaxy (MOVPE) using the remaining dielectric layer as a mask so that the buried layer is formed on the substrate excluding the top surface of the stripe of the first mesa and the sloping surface of the stripe of the first mesa is covered a sloping surface part of the buried layer, where this step is carried out under conditions such that the growth rate of the buried layer on the sloping surface of the stripe of the first mesa is slower than that at other parts of the substrate, the top surface of the stripe of the first mesa forms a stripe of a second mesa together with the sloping surface of the buried layer and the stripe of the second mesa has a smaller inclination than the stripe of the first mesa, removing the dielectric layer by an etching, and forming a double heterostructure made up of a plurality of semiconductor layers on the stripe of the second mesa by a metal organic vapor phase epitaxy (MOVPE).

Another object of the present invention is to provide a method of producing a semiconductor laser comprising the steps of forming on a substrate a mask having a stripe opening which extends in a <110> direction of the substrate, where the substrate is made of a compound semiconductor of a first conductor type, forming a stripe projection part on the substrate which is exposed within the stripe opening by a metal organic vapor phase epitaxy (MOVPE), where the stripe projection part has one of a triangular and a trapezoidal cross section with a (111)B face as its sloping surface and being made of a compound semiconductor, forming a blocking layer on the substrate by a metal organic vapor phase epitaxy (MOVPE) so as to cover the (111)B face under a predetermined condition such that a growth rate of the blocking layer on the sloping surface of the stripe projection part is slower than that at other parts of the substrate, and forming a stripe part which acts as a wave guide and a bent part provided on both sides of the stripe part for trapping light by successively growing a first cladding layer, an active layer and a second cladding layer, the stripe part being formed above the stripe projection part, where the bent part has a (311)B face as its sloping surface and the first and second cladding layers are respectively made of mutually opposite first and second conductor types. According to the method of the present invention, the stripe projection part which becomes the base for forming the stripe part which acts as the waveguide and the bent parts which trap the light is not formed by an etching. Instead, the stripe projection part is grown on a substrate having a satisfactory crystal orientation. Hence, the semiconductor layers formed on such a substrate will not include crystal defects, and it becomes possible to realize a semiconductor laser having a high performance free of abberation loss or the like.

Other objects and further features of the present invention will be apparent from the following detailed description when read in conjunction with the accompanying drawings.

BRIEF DESCRIPTION OF THE DRAWINGS

FIG. 13 is a cross sectional view of an essential part of a sample for explaining a mesa stripe which is formed in the <110> direction using various etchants;

FIG. 14 is a cross sectional view of an essential part of a sample for explaining a groove which is formed in the <110> direction under the same conditions and by use of the same etchants as in FIG. 13;

DESCRIPTION OF THE PREFERRED EMBODIMENTS

According to one aspect of the present invention, a sloping surface part required to bend an active layer and a part which operates as a laser are formed independently so that the stripe width and the thickness of a cladding layer can be controlled independently. This approach is effective particularly in the case of the AlGaInP system semiconductor laser in which the thermal resistance of the cladding layer is large.

In the semiconductor laser according to the present invention, the sloping surface of a mesa stripe which extends in the <110> direction must be the (111)B face in order to ensure growth of a smooth buried layer as described above. Hence, the present inventors have experimented using various etchants to form such a mesa stripe, but it was difficult to find an etchant which exposes the (111)B face. Extensive trial and error were necessary to find a suitable etchant.

A description will be given of main examples of the experiments related to the etching conducted by the present inventors.

Figure 1:
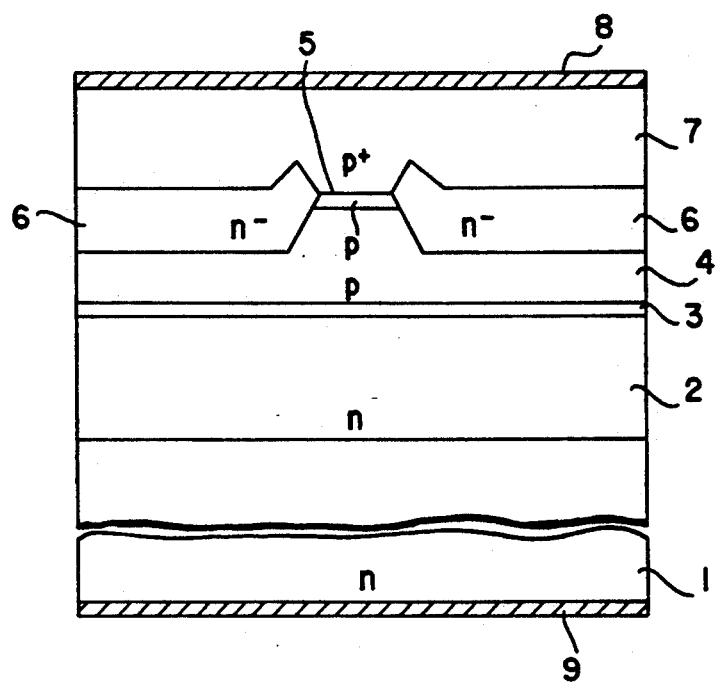
FIG. 1 is a cross sectional view showing an essential part of a conventional semiconductor laser having the ridge type structure.
Figure 2:
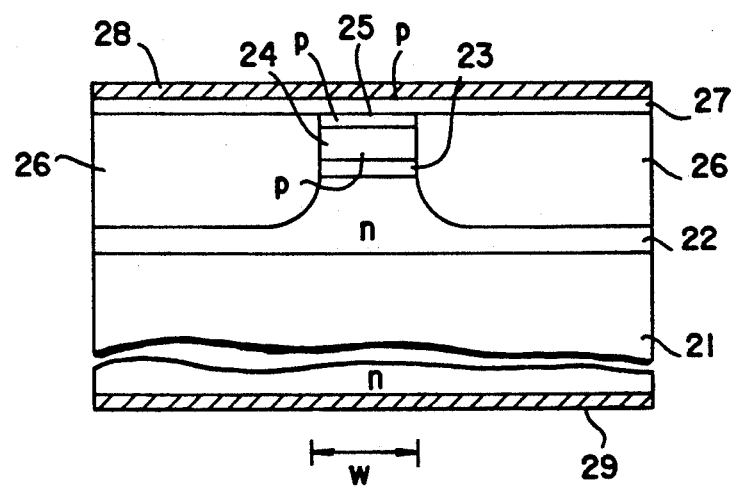
FIG. 2 is a cross sectional view showing an essential part of a conventional semiconductor laser having the buried type structure.
Figure 3:
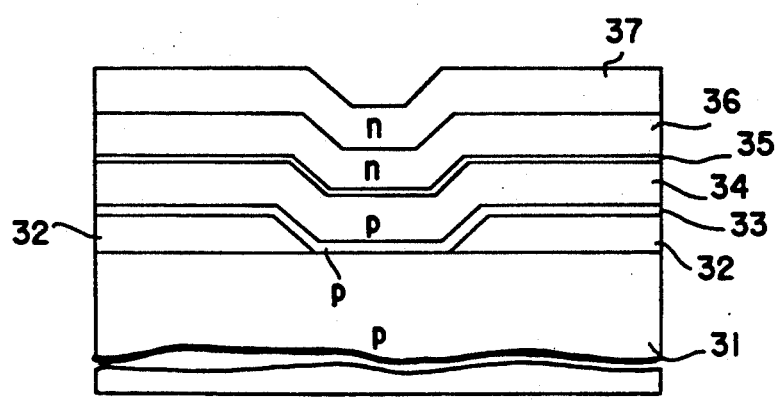
FIG. 3 is a cross sectional view showing an essential part of a conventional semiconductor laser having the shaped substrate structure.
Figure 4:
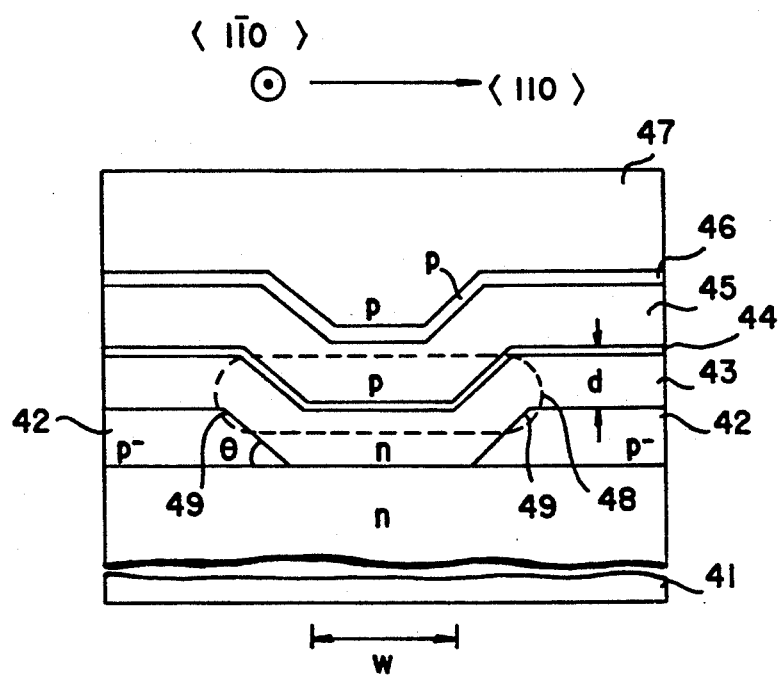
FIG. 4 is a cross sectional view showing an essential part of the conventional semiconductor laser having the shaped substrate structure for explaining a production method using etching.
Figure 5:
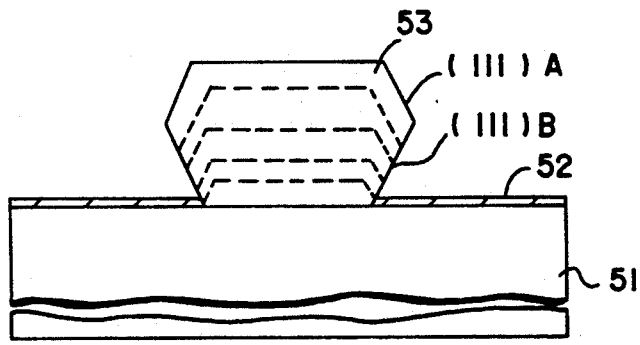
FIG. 5 is a cross sectional view showing an essential part of the conventional semiconductor laser having the shaped substrate structure for explaining a production method using selective growth.
Figure 6:
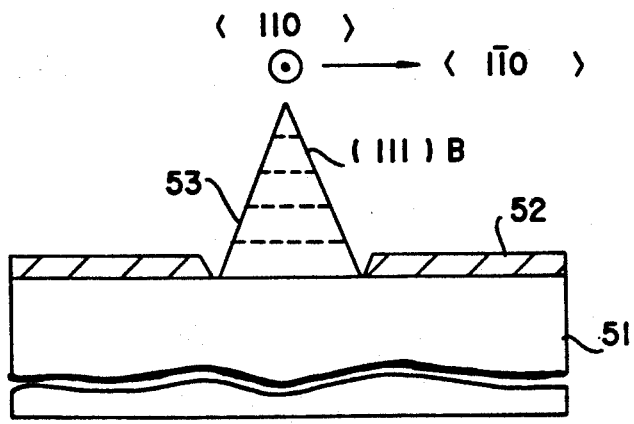
FIG. 6 is a cross sectional view showing an essential part of the conventional semiconductor laser having the shaped substrate structure for explaining a production method using selective growth.
Figure 7:
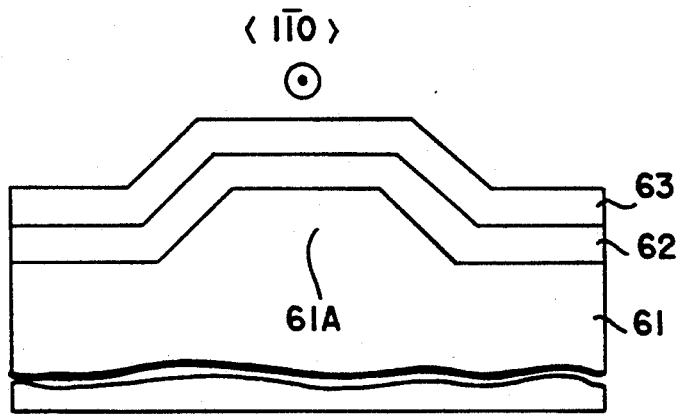
FIG. 7 is a cross sectional view showing an essential part of the conventional semiconductor laser when a semiconductor layer is grown on a shaped substrate which has a conventional mesa extending in the <1$\bar{1}$0> direction formed by the etching.
Figure 8:
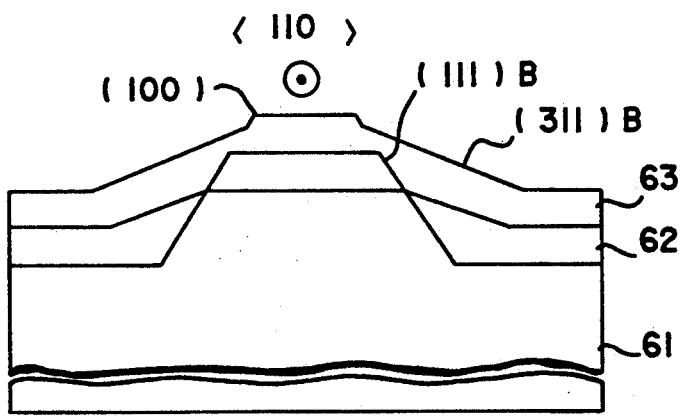
FIG. 8 is a cross sectional view showing an essential part of the conventional semiconductor laser when a semiconductor layer is grown on a shaped substrate which has a conventional mesa extending in the <110> direction formed by the etching.
Figure 9:
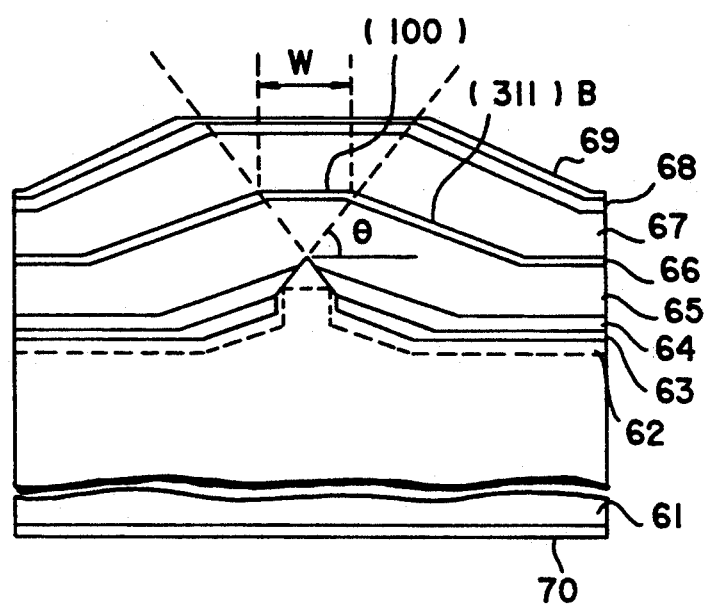
FIG. 9 is a cross sectional view showing an essential part of a known GaAs/AlGaAs system semiconductor laser which has a shaped substrate with a gradual sloping surface.
Figure 12:
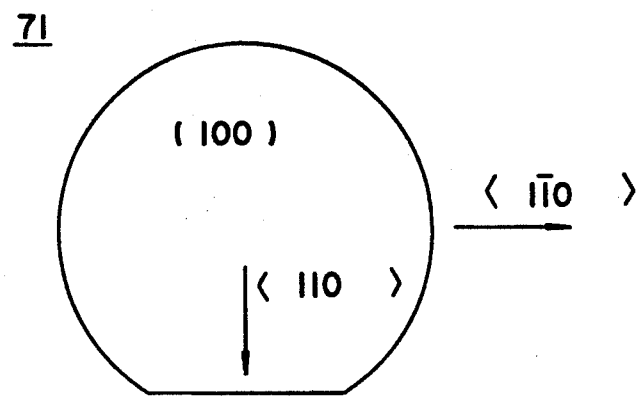
FIG. 12 is a plan view showing an essential part of a GaAs substrate which is used to form a shaped substrate.
Figure 10:
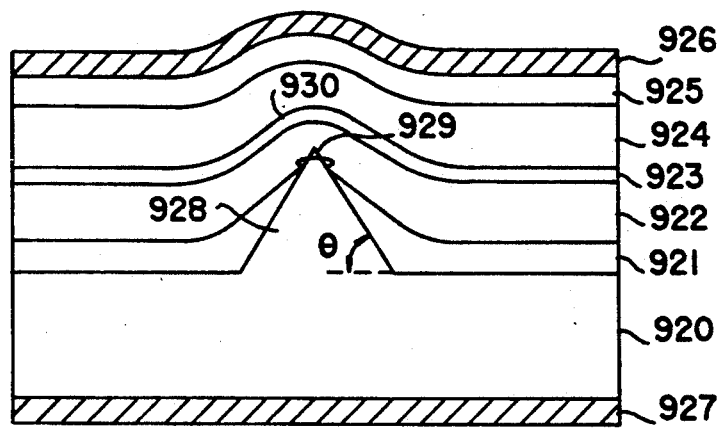
FIG. 10 is a cross sectional view showing an essential part of a semiconductor laser proposed in a Japanese Laid-Open Patent Application No.55-158689.
Figure 11:
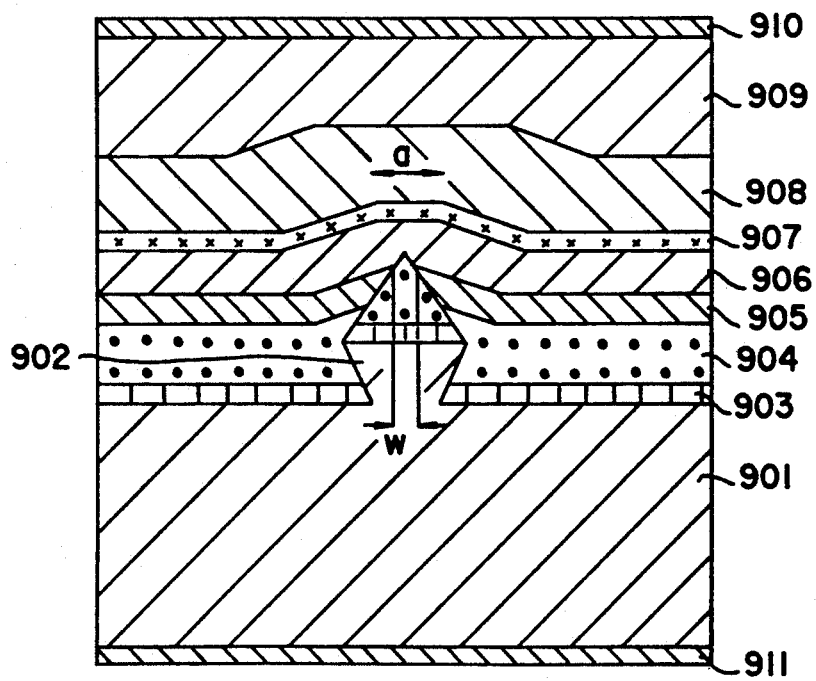
FIG. 11 is a cross sectional view showing an essential part of a semiconductor laser proposed in a Japanese Laid-Open Patent Application No.64-30287.

FIG. 12 is a plan view showing an essential part of a GaAs substrate which is used for the experiment to form a shaped substrate. A GaAs substrate 71 has a main surface which is the index of crystal surface (100) The <110> direction is perpendicular to the facet edge, and the <1$\bar{1}$0> is parallel to the facet edge. When a NH$_3$ system etching solution is used on this GaAs substrate 71, a re-entrant mesa is formed in the <110> direction and a conventional mesa is formed in the <1$\bar{1}$0> direction.

The etching solutions used are follows.
(a) NH$_4$OH:H$_2$O$_2$:H$_2$O
(b) H$_3$PO$_4$:H$_2$O$_2$:H$_2$O
(c) Br/CH$_3$COOH:H$_3$PO$_4$ FIG. 13 (A), (B) and (C) respectively show an essential part of a sample for explaining the formation of a mesa stripe in the <110> using the etching solutions (a), (b) and (c). In FIG. 13, the same designations are used as in FIG. 12. A stripe SiO$_2$ layer 72 extends in the <110> direction. FIG. 13 (A) shows a state where the etching is made using the etching solution (a) at an etching speed of 2.5 μm/min, and the sloping surface of the re-entrant mesa is estimated to be the (221)A face. FIG. 13 (B) shows a state where the etching is made using the etching solution (b) at an etching speed of 2.5 μmin. In this case, a small conventional mesa is formed at the bottom part, and the sloping surface of this small conventional mesa is estimated to be the (111)B face. FIG. 13 (C) shows a state where the etching is made using the etching solution (c) at an etching speed of 0.4 μm/min. In this case, the sloping surface of the conventional mesa is rounded and is estimated to be the (011) face.

FIG. 14 (A), (B) and (C) respectively show an essential part of a sample for explaining the formation of a groove in the <110> using the etching solutions (a), (b) and (c). In FIG. 14, the same designations are used as in FIG. 13. The SiO$_2$ layer 72 itself in this case does not have the stripe shape but has a stripe opening which extends in the <110> direction.

As described above, various experiments were conducted to expose the (111)B face, and the present inventors were finally able to find a suitable etchant and an etching mask which can be used in common for the selective growth.

In other words, a SiO$_2$ layer which is formed by a thermal chemical vapor deposition (CVD) is used as the mask, and the mixed solution made up of H$_2$SO$_4$:H$_2$O$_2$:H$_2$O is heated to approximately 35° C. or higher and used as the etchant. By this combination, it was confirmed that a conventional mesa having the (111)B face exposed at a large part of the sloping surface can be formed although a slight re-entrant mesa appears. The slight re-entrant mesa is generated extremely close to the SiO$_2$ layer which is used as the mask. During the actual process, the etchant was heated to approximately 50° C. for the purpose of reducing the damage on the etching surface.

Figure 15:
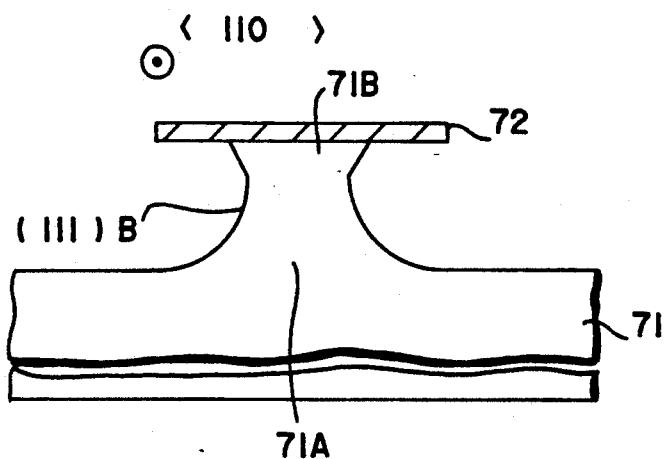
FIG. 15 is a cross sectional view of an essential part of a sample for explaining a conventional mesa having a sloping surface which is substantially the (111)B face.

FIG. 15 shows an essential part of a sample for explaining a conventional mesa having the sloping surface which is substantially the (111)B face. In FIG. 15, the same designations are used as in FIGS. 12 through 14. In FIG. 15, the substrate 71 has a conventional mesa 71A and a re-entrant mesa which is formed extremely close to the SiO$_2$ layer 72. As shown, a large part of the mesa structure is the conventional mesa 71A having the sloping surface which is substantially the (111)B face.

When experiments were conducted to grow a semiconductor layer on the shape substrate described above, a problem was encountered in that the semiconductor layer had the tendency of not growing on the substrate 71 above a bent part which corresponds to the boundary of the conventional mesa 71A and the re-entrant mesa 71B.

Figure 16:
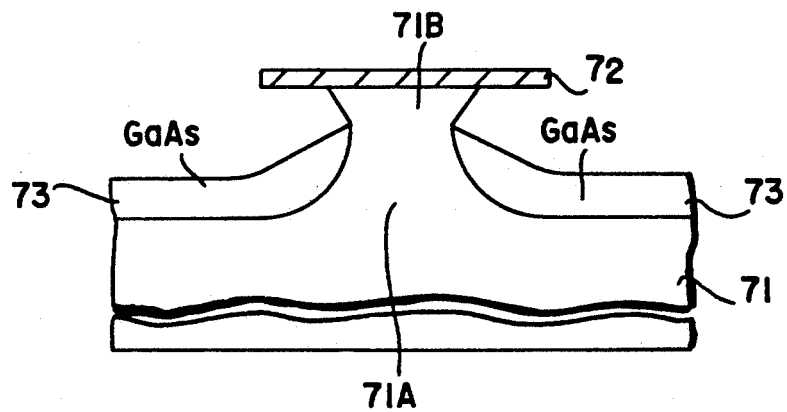
FIG. 16 is a cross sectional view of an essential part of a sample for explaining a case where a GaAs layer is grown on a GaAs substrate 71 having mesas A and 71B.

FIG. 16 shows an essential part of a sample for explaining the growth of a GaAs layer on the GaAs substrate 71 having the mesas 71A and 71B. In FIG. 16, the same designations as used as in FIGS. 12 through 15. As shown, a GaAs layer 73 does not grow above the boundary of the conventional mesa 71A and the re-entrant mesa 71B. However, when the SiO$_2$ layer 72 which is used in common as the mask for selective growth and the etching mask was formed by a sputtering, the re-entrant mesa 71B completely eliminated.

It was possible to eliminate the re-entrant mesa 71B for the following reasons. That is, compared to the SiO$_2$ layer which is formed by the thermal CVD, the SiO$_2$ layer which is formed by the sputtering has a poorer adherence to GaAs, and thus, the etching rate at the boundary increased in the transverse direction.

Figure 17:
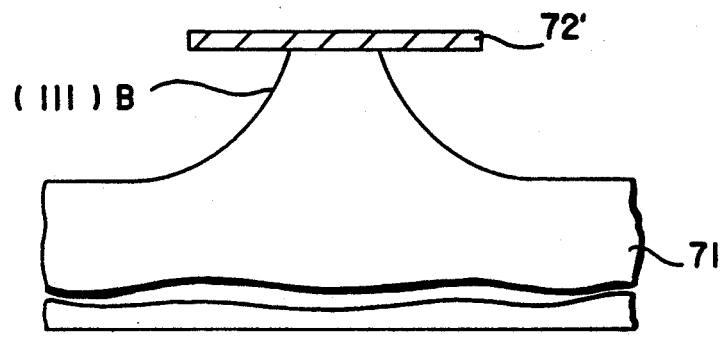
FIG. 17 is a cross sectional view of an essential part of a sample for explaining a case where a SiO$_2$ layer formed by a sputtering is used.

FIG. 17 shows an essential part of a sample for explaining a case where the SiO$_2$ layer used is formed by the sputtering. In FIG. 17, the same designations as used as in FIGS. 12 through 16. A SiO$_2$ layer 72' shown is formed by the sputtering. As may be seen from FIG. 17, the re-entrant mesa is completely eliminated, and the mesa structure is solely made up of the conventional mesa 71A.

When the semiconductor layer is grown on the shaped substrate shown in FIG. 17, the semiconductor layer positively grows to immediately under the SiO$_2$ layer 72'.

Figure 18:
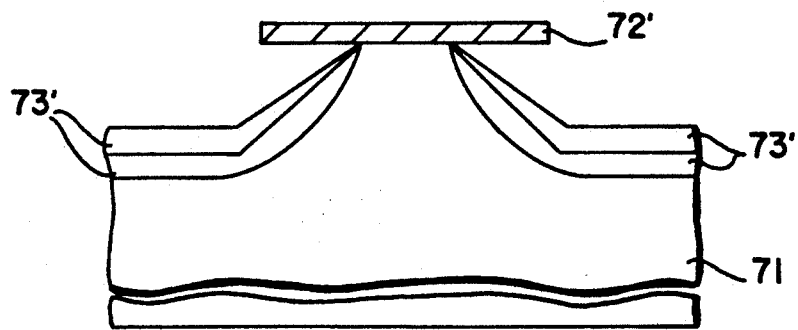
FIG. 18 is a cross sectional view of an essential part of a sample for explaining a case where a semiconductor layer is grown using a shaped substrate shown in FIG. 17.

FIG. 18 shows an essential part of a sample for explaining a case where a semiconductor layer is grown on the shaped substrate shown in FIG. 17. In FIG. 18, the same designations are used as in FIGS. 12 through 17. As shown, a GaAs layer 73' is grown in this case, and the growth of this GaAs layer 73' extends to immediately the SiO$_2$ layer 72'. However, when the growth of the GaAs layer 73' is continued until the GaAs layer 73' becomes thick, the growth rate under the eaves of the SiO$_2$ layer 72' slows down and a problem occurred in that a depression is formed as shown in FIG. 19.

Figure 19:
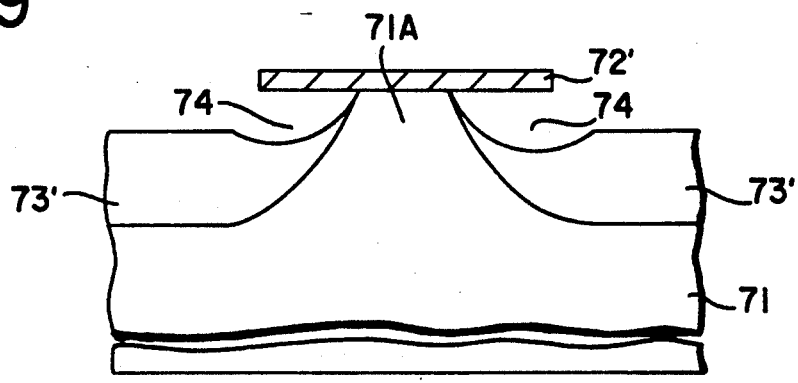
FIG. 19 is a cross sectional view of an essential part of a sample for explaining a case where a thick GaAs layer is formed.

FIG. 19 shows an essential part of a sample for explaining a case where a thick GaAs layer 73' is grown. In FIG. 19, the same designations are used as in FIGS. 12 through 18. As described above, a depression 74 is formed under the eaves of the SiO$_2$ layer 72' when the thick GaAs layer 73' is grown.

In order to solve this problem of the formation of the undesirable depression 74, it was found effective to remove the eaves of the SiO$_2$ layer 72' by a length which will not deteriorate with the shape of the layer which is to be formed thereafter. When the mesa structure has a height which is generally required, that is, a height of 2 μm, for example, the eaves of the SiO$_2$ layer 72' project by approximately 1.6 μm.

Normally, a hydrofluoric acid buffer solution (a mixed solution of HF:NH$_4$F and hereinafter simply referred to as BHF) may be used as the etchant when removing the eaves of the SiO$_2$ layer 72'. When the etching is made for a time required to etch approximately half the thickness of the SiO$_2$ layer 72', the eaves is removed in its entirety because the eaves is etched from the top and bottom surfaces thereof. As a result, the SiO$_2$ layer 72' having approximately half the original thickness remains at the part where the SiO$_2$ layer 72' makes contact with the shaped substrate.

But when the structure is observed after the eaves of the SiO$_2$ layer 72' is removed by the above described manner, it was found that the GaAs surface is exposed at the top surface of the mesa structure at the part corresponding to the edge of the SiO₂ layer 72' which is used as the mask.

Figure 20:
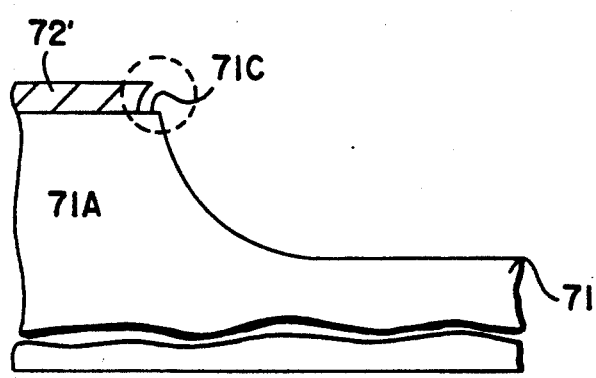
FIG. 20 is a cross sectional view of an essential part of a sample for explaining a state where eaves of the SiO$_2$ mask is removed.

FIG. 20 shows an essential part of a sample for explaining a state where the eaves of the SiO₂ layer is removed. In FIG. 20, the same designations are used as in FIGS. 12 through 19. As shown in FIG. 20, a top surface part 71C of the conventional mesa 71A is exposed at the edge of the SiO₂ layer 72' after the eaves of the SiO₂ layer 72' is removed. When a semiconductor layer is grown on the shaped substrate shown in FIG. 20, the semiconductor layer also grows on the top surface part 71C in a horn shape.

Figure 21:
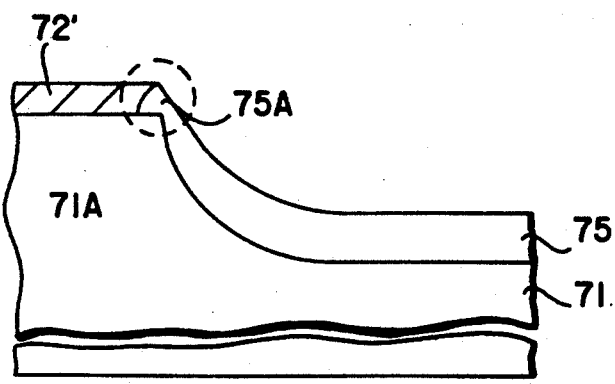
FIG. 21 is a cross sectional view of an essential part of a sample for explaining a state where a GaAs layer is grown on a shaped substrate shown in FIG. 20.

FIG. 21 shows an essential part of a sample for explaining a state where a GaAs layer is grown on the shaped substrate shown in FIG. 20. In FIG. 21, the same designations are used as in FIGS. 12 through 20. When a GaAs layer 75 is grown, a horn shaped part 75A which connects to the GaAs layer 75 is formed on the top surface part 71C of the conventional mesa 71A.

When the AlGaInP system double heterostructure is formed above the mesa structure having the horn shaped part 75A, the active layer of the double heterostructure will include fine irregularities reflecting the horn shaped part 75A. As a result, the transverse mode of the laser beam which oscillates with the active layer having such irregularities becomes a high-order mode even when the stripe width is such that the single mode osillation would occur if the active layer is flat.

Accordingly, it is necessary to match the edge of the SiO₂ layer 72' and the edge at the top surface of the conventional mesa 71A or eaves must be 0.3 μm or less so as not to interfere with the growth of the buried layer. If it is sufficient to simply match the edge of the SiO₂ layer 72' and the edge at the top surface of the conventional mesa 71A, the GaAs substrate 71 including the conventional mesa 71A may be etched by the RIE. However, the sloping surface of the conventional mesa 71A would become almost vertical when the RIE is used.

Figure 22:
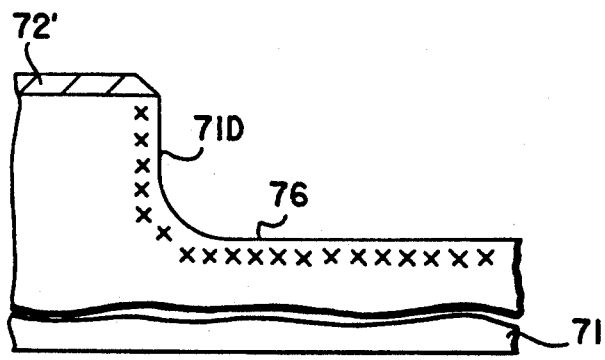
FIG. 22 is a cross sectional view of an essential part of a sample for explaining a state where a GaAs substrate is etched by an RIE.

FIG. 22 shows an essential part of a sample for explaining a state where the GaAs substrate 71 is etched using the RIE. In FIG. 22, the same designations are use as in FIGS. 12 through 21. As shown in FIG. 22, a sloping surface 71D of the mesa structure which is formed by the RIE is almost vertical. In addition, damages 76 are generated at the surface part of the substrate 71 due to the RIE.

The sloping surface 71D is not the (111)B face which is required, and the (1$\bar{1}$0) face appears as a singular face. Hence, it is impossible to satisfactorily form a semiconductor layer on the shaped substrate shown in FIG. 22. Furthermore, the crystal properties of the semiconductor layer which is grown on such a shaped substrate is poor because of the damages 76.

In order to solve this problem, the present invention uses an etchant which etches both the mask and the semiconductor when etching the eaves of the mask so that the edge at the top surface of the conventional mesa 71A matches the edge of the eaves of the mask. In this case, a satisfactory etching shape is obtainable when the etchant used has approximately the same etching rate for the mask and the semiconductor.

Figure 23:
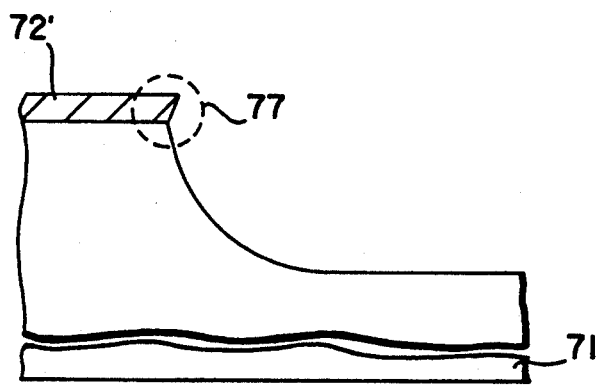
FIG. 23 is a cross sectional view of an essential part of a sample for explaining a state where an etching is made by use of an etchant having approximately the same etching rates for the mask and the semiconductor.

FIG. 23 shows an essential part of a sample for explaining a state where an etching is made using an etchant which has approximately the same etching rate for the mask and the semiconductor. In FIG. 23, the same designations are used as in FIGS. 12 through 22. A reference numeral 77 in FIG. 23 indicates a vicinity of an edge of the SiO₂ layer 72' and an edge at the top surface of the conventional mesa 71A. The eaves of the SiO₂ layer 72' is removed by use of an etching solution having BHF+H₂O as the main composition.

Figure 24:
FIG. 24 is a photo which is taken by an electron microscope and corresponds to an essential part of a semiconductor laser in a vicinity of a mesa for explaining the removal of the eaves of the mask.
Figure 25:
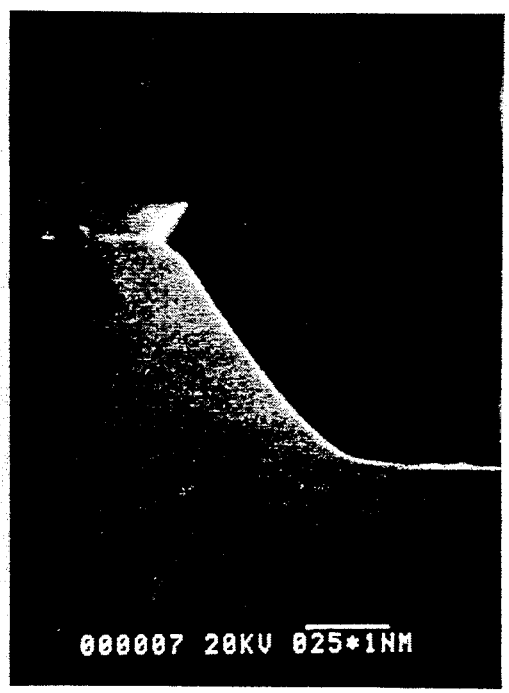
FIG. 25 is a photo which is taken by an electron microscope and corresponds to an essential part of a semiconductor laser in a vicinity of a mesa for explaining the removal of the eaves of the mask.

FIGS. 24 and 25 are photos taken by an electron microscope for explaining a state where the eaves of the mask is removed. The mesa structure was formed by first forming a conventional mesa corresponding to the conventional mesa 71A using a H₂O₄:H₂O₂:H₂O system etchant, and thereafter removing the eaves of the mask corresponding to the SiO₂ layer 72' using a mixed solution of BHF:H₂O₂:H₂SO₄ as the etchant.

FIG. 24 shows a case where the etching rate of the mask (SiO₂ layer) is greater than that of the GaAs substrate. As shown, the resulting shape is similar to the case where only BHF is used as the etchant.

FIG. 25 shows a case where the etching rates of the mask (SiO₂ layer) and the GaAs substrate are approximately the same. As shown, the resulting shape does not show any disorder at the sloping surface of the conventional mesa. It was thus confirmed that a satisfactory growth of the semiconductor layer is possible without generating the horn shaped part at the top edge part of the conventional mesa.

The mixed solution of H₂SO₄, H₂O₂ and HF/NH₄F (BHF) is suited for use as the etchant when removing the eaves of the mask (SiO₂ layer).

When the shaped substrate is formed in the above described manner, it is possible to grow various semiconductor layers made of the AlGaInP system material which make lattice matching with GaAs. Hence, it becomes possible to realize a semiconductor laser having satisfactory characteristics.

As shown in FIG. 25, for example, the edge of the mask (SiO₂ layer) is tapered in an opposite direction to the conventional mesa. However, the part of the mask which projects from the vertical surface is only in the order of 500 Å and will not cause the problems encountered in the case of the eaves of the mask.

Therefore, according to the present invention, it is possible to make the stripe width for making the single transverse mode control wide even when the lower cladding layer for obtaining a bent active layer is made thin, using a simple process.

Hence, even when the cladding layer on the lower side of the active layer is made thin to improve the heat release, the stripe width can be made sufficiently wide because the sloping surface of the shaped substrate is gradual, where the shaped substrate is made up of the conventional mesa formed on the substrate and the buried layer which cover the sloping surface of the conventional mesa. In addition, the bend in the active layer becomes gradual, and a satisfactory single transverse mode control can be made because the difference in the indexes of diffraction sensed by the guided light is small. The present invention is suited for the production of the AlGaInP system semiconductor using the MOVPE.

Figure 26:
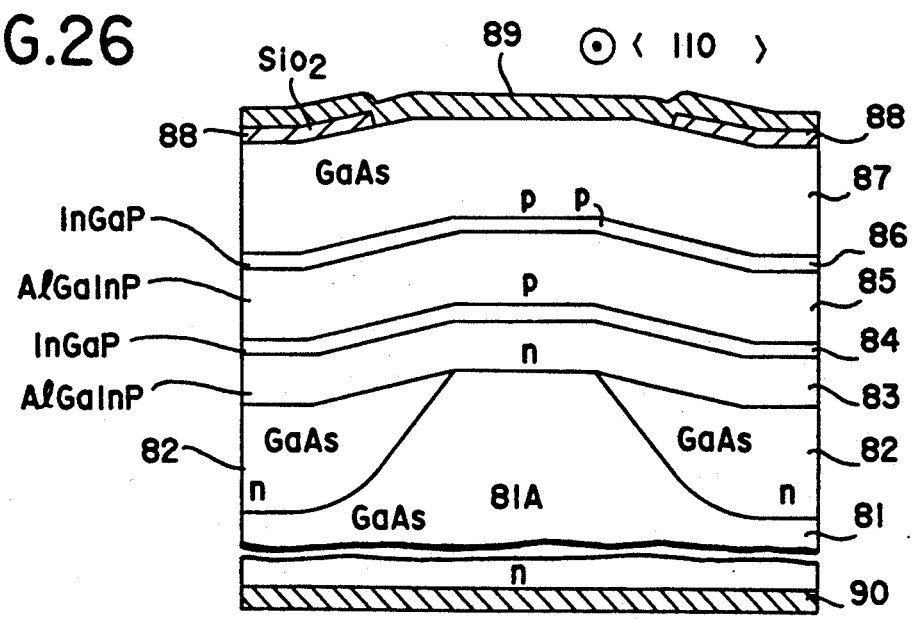
FIG. 26 is a cross sectional view showing an essential part of a first embodiment of a semiconductor laser according to the present invention.

Next, a description will be given of a first embodiment of the semiconductor laser according to the present invention, by referring to FIG. 26. The semiconductor laser shown in FIG. 26 includes an n-type GaAs substrate 81, a mesa 81A, an n-type GaAs buried layer 82, an n-type AlGaInP cladding layer 83, an InGaP active layer 84, a p-type AlGaInP cladding layer 85, a p-type InGaP buffer layer 86, a p-type GaAs contact layer 87, a SiO₂ insulator layer 88, a p side electrode 89 and an n side electrode 90.

Next, a description will be given of a first embodiment of a method of producing the semiconductor laser according to the present invention, by referring to FIGS. 27 through 33. In FIGS. 27 through 33, those parts which are the same as those corresponding parts in FIG. 26 are designated by the same reference numerals. This first embodiment of the method produces the first embodiment of the semiconductor laser shown in FIG. 26.

Figure 27:
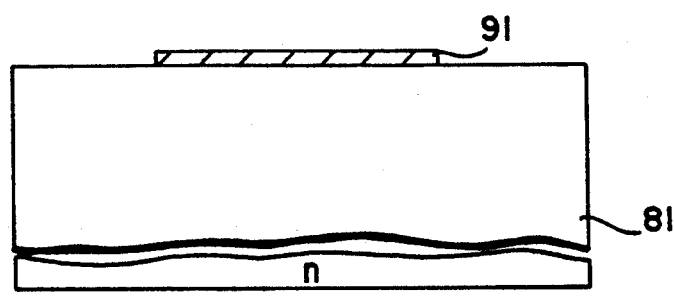
FIGS. 27 through 33 are cross sectional views showing the first embodiment of the semiconductor laser at various production stages for explaining a first embodiment of a method of producing the semiconductor laser according to the present invention.

As shown in FIG. 27, a $SiO_2$ layer 91 is formed on the n-type GaAs substrate 81 to a thickness of 200 nm, for example, by a sputtering. The main surface of the n-type GaAs substrate 81 used is the (100) face, and the n-type GaAs substrate 81 has an impurity concentration of $1 \times 10^{19}$ cm$^{-3}$. A resist process of a photolithography technique and a wet etching using HF/NH$_4$F as the etchant are used to pattern the $SiO_2$ layer 91 so as to form a stripe of the $SiO_2$ layer 91 having a width of 6 μm and extending in the <110> direction.

Figure 28:
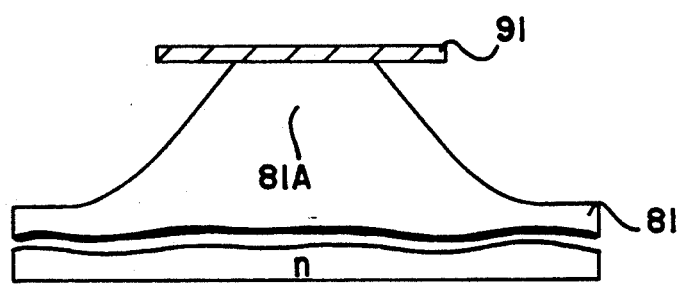

Then, as shown in FIG. 28, a mesa etching of the n-type GaAs substrate 81 is made using the stripe of the $SiO_2$ layer 91 as a mask and an etchant $H_2SO_4 + H_2O_2 + H_2O$ for a wet etching. As a result, a mesa 81A having a height of approximately 2 μm is formed.

Figure 29:
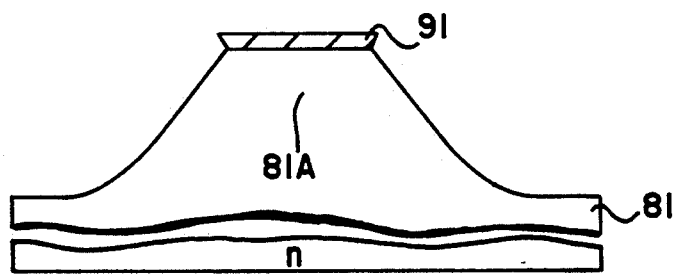

In FIG. 29, a wet etching using an etchant $H_2SO_4 + H_2O_2 + BHF$ is made to remove eaves of the $SiO_2$ layer 91.

Figure 30:
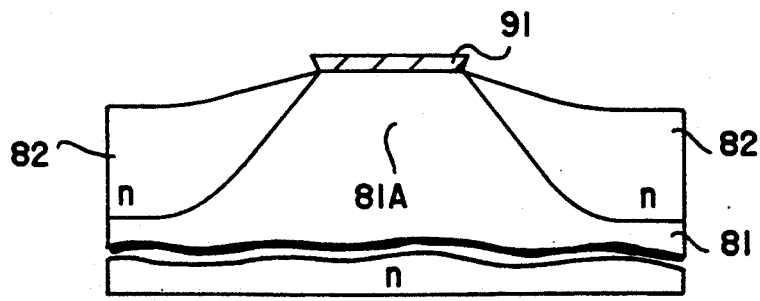

In FIG. 30, the n-type GaAs buried layer 82 is grown using a MOVPE. The n-type GaAs buried layer 82 has a thickness of 1 μm, for example, and an impurity concentration of $3 \times 10^{18}$ cm$^{-3}$, for example. In this case, since the eaves of the $SiO_2$ layer 91 is already removed, the shape of the grown n-type GaAs buried layer 82 is satisfactory. A similar shape can be formed using $Al_{0.1}Ga_{0.9}As$ in place of GaAs for the buried layer 82.

Figure 31:
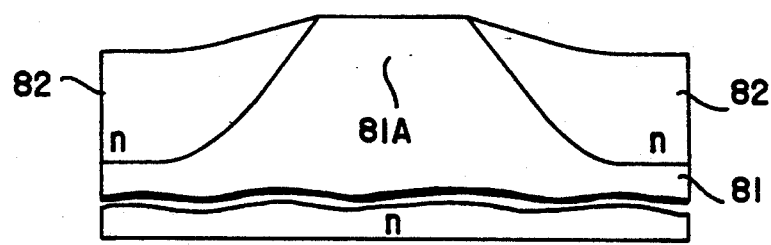
Figure 32:
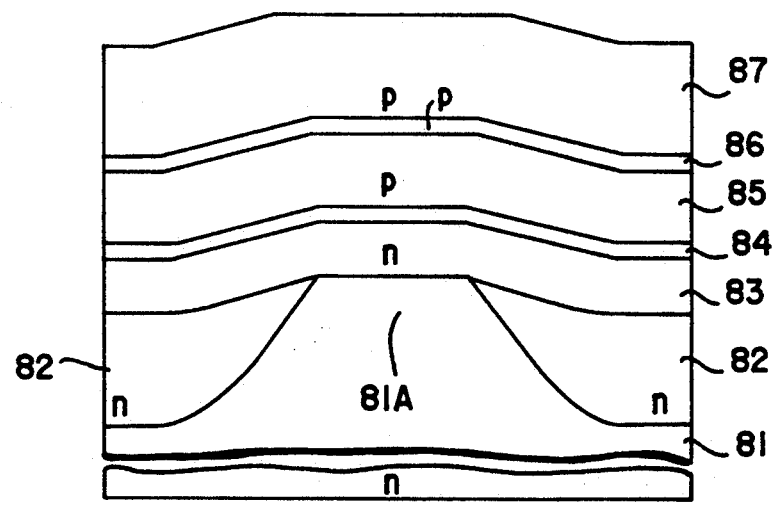

Thereafter, the $SiO_2$ layer 91 is removed by submersion into a HF etchant as shown in FIG. 31.

As shown in FIG. 31, the n-type AlGaInP cladding layer 83, the InGaP active layer 84, the p-type AlGaInP cladding layer 85, the p-type InGaP buffer layer 86 and the p-type GaAs contact layer 87 are successively formed by an MOVPE. In this embodiment, the thickness and the like of each layer are as follows.

Figure 33:
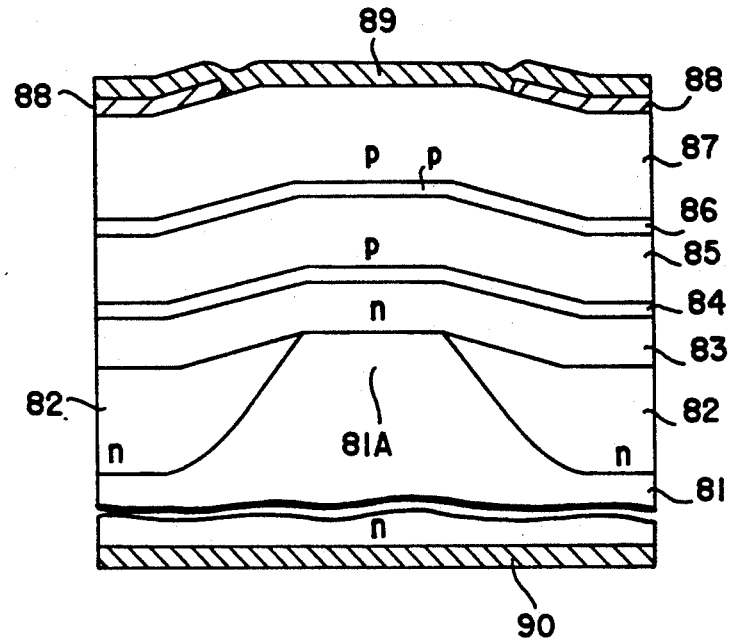

Cladding layer 83
  Thickness: 0.8 μm
  Impurity: Si
  Impurity concentration: $4 \times 10^{17}$ cm$^{-3}$
Active layer 84
  Thickness: 70 nm
Cladding layer 85
  Thickness: 1.0 μm
  Impurity: Zn
  Impurity concentration: $3 \times 10^{17}$ cm$^{-3}$
Buffer layer 86
  Thickness: 100 nm
  Impurity: Zn
  Impurity concentration: $1 \times 10^{18}$ cm$^{-3}$
Contact layer 87
  Thickness: 2 μm
  Impurity: Zn
  Impurity concentration: $3 \times 10^{~}$ cm$^{-3}$ As shown in FIG. 33, the insulator layer 88 made of $SiO_2$ and having a thickness of 200 nm, for example, is formed on the contact layer 87 by a CVD. Then, the insulator layer 88 is etched to form a stripe opening using a resist process of a photolithography technique and a wet etching which uses a hydrofluoric acid buffer solution as the etchant.

A vacuum deposition is used to form on the contact layer 87 the p side electrode 89 which has a thickness of 4000 Å in total and is made up of stacked layers of Ti, Pt and Au. The Ti, Pt and Au layers respectively have thicknesses of 1000 Å, 1000 Å and 2000 Å.

Similarly, a vacuum deposition is used to form on the substrate 81 the n side electrode 90 which has a thickness of 3000 Å in total and is made up of stacked layers of AuGe and Au. The AuGe and Au layers respectively have thicknesses of 500 Å and 2500 Å. The n-type GaAs substrate 81 may be polished to reduce the thickness of the n-type GaAs substrate 81 prior to forming the n side electrode 90.

In the semiconductor laser which is completed in the above described manner, the stripe width for making the single transverse mode control can be set sufficiently wide. Moreover, the thermal resistance is low because the cladding layer 83 is thin.

Figure 34:
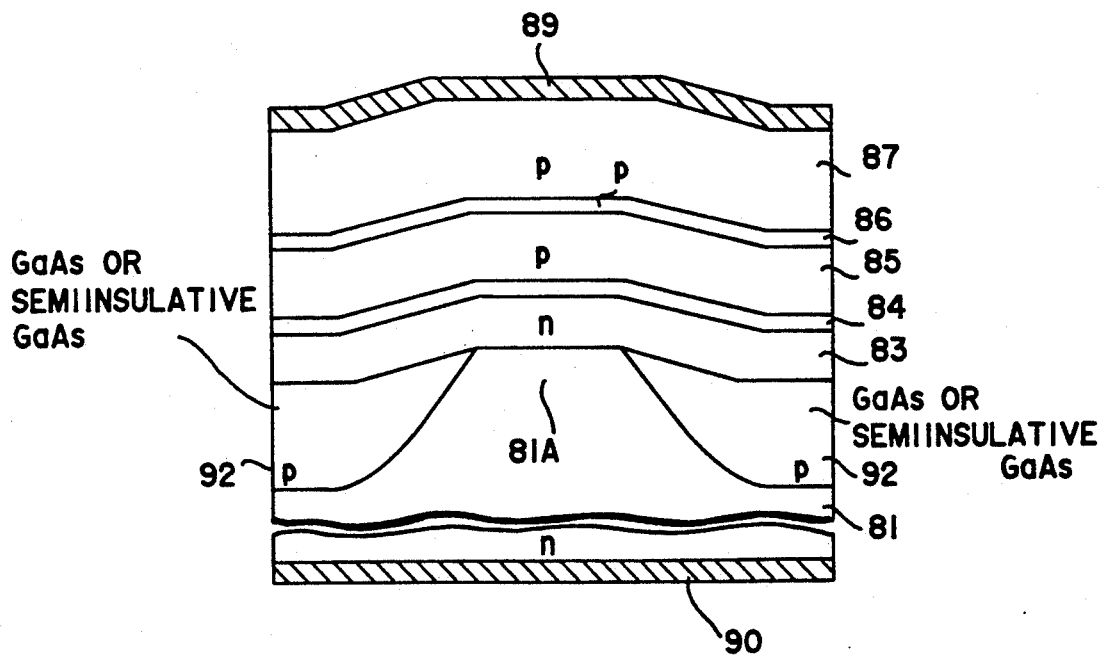
FIG. 34 is a cross sectional view showing an essential part of a second embodiment of the semiconductor laser according to the present invention.

Next, a description will be given of a second embodiment of the semiconductor laser according to the present invention, by referring to FIG. 34. In FIG. 34, those parts which are the same as those corresponding parts in FIGS. 26 through 33 are designated by the same reference numerals, and a description thereof will be omitted. In FIG. 34, a p-type GaAs buried layer 92 is provided.

According to the structure of this embodiment, the p-type GaAs buried layer 92 acts as a current confinement layer and it becomes possible to omit the insulator layer 88 shown in FIG. 33. When no insulator layer 88 is required, the heat release can be made satisfactorily because of the reduced thermal resistance, even when the p side of the structure is mounted on a heat sink. The p-type GaAs used for the buried layer 92 may be replaced by a Cr doped semiinsulative GaAs.

In the AlGaInP system materials, the resistivities of the Zn doped p-type AlGaInP and the Mg doped p-type AlGaInP respectively are 1 and 0.2 Ωcm and large. On the other hand, the resistivity of the Si doped p-type AlGaInP can be reduced down to 0.05 Ωcm. From the point of view of reducing the ohmic loss of the semiconductor laser as a whole, it is desirable that the resistance is a small as possible. But from the point of view of deciding whether the current confinement layer is to be provided on the front or back side of the substrate, it is possible to reduce the current spread within the cladding layer after the current confinement and accordingly reduce the invalid current when the resistance is large. Accordingly, it is desirable in the case of the AlGaInP system semiconductor laser to use a p-type GaAs substrate and make the current confinement on the p side.

Figure 35:
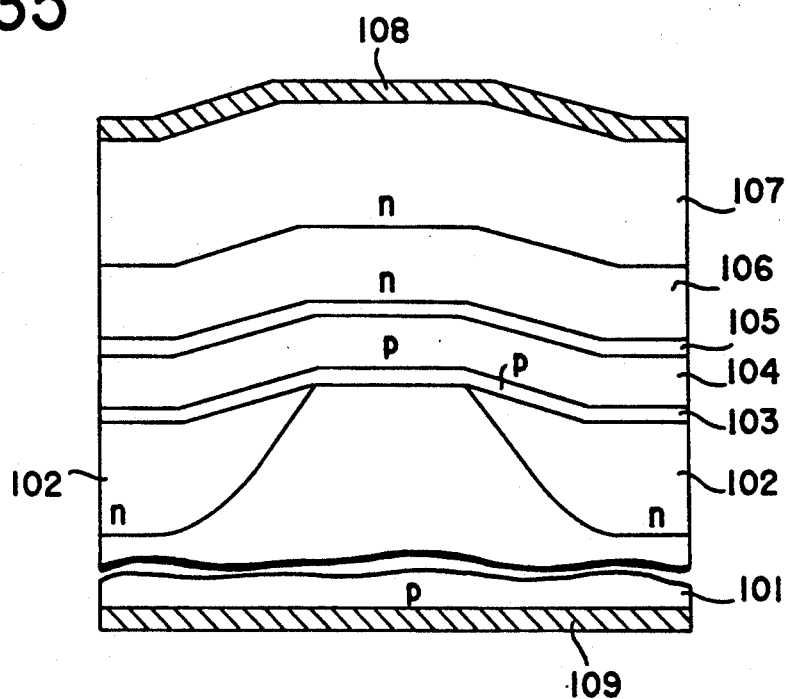
FIG. 35 is a cross sectional view showing an essential part of a third embodiment of the semiconductor laser according to the present invention.

Next, a description will be given of a third embodiment of the semiconductor laser according to the present invention in which a p-type GaAs substrate is used and the current confinement is made on the p side. As shown in FIG. 35, this third embodiment of the semiconductor laser includes a p-type GaAs substrate 101, an n-type GaAs buried layer 102, a p-type InGaP buffer layer 103, a p-type AlGaInP cladding layer 104, an InGaP active layer 105, an n-type AlGaInP cladding layer 106, an n-type GaAs contact layer 107, an n side electrode 108 and a p side electrode 109. In this embodiment, the thickness and the like of each layer are as follows.

Substrate 101
  Impurity: Zn
  Impurity concentration: $1 \times 10^{~}$ cm$^{-3}$ Buried layer 102
 Thickness: 1 μm
 Impurity: Si
 Impurity concentration $3 \times 10^{18}$ cm$^{-3}$
Buffer layer 103
 Thickness: 0.1 μm
 Impurity: Zn
 Impurity concentration: $1 \times 10^{\sim}$cm$^{-3}$
Cladding layer 104
 Thickness: 0.8 nm
 Impurity: Zn
 Impurity concentration: $1 \times 10^{f}$cm$^{-3}$
Active layer 105
 Thickness: 70 nm
Cladding layer 106
 Thickness: 1 μm
 Impurity: Si
 Impurity concentration: $4 \times 10^{17}$ cm$^{-3}$
Contact layer 107
 Thickness: 1 nm
 Impurity: Si
 Impurity concentration: $1 \times 10^{18}$ cm$^{-3}$
n side electrode 108
 Material: Au/AuGe (GaAs side)
 Thickness: 2500 Å/500 Å
p side electrode 109
 Material: Au/Zn/Au (GaAs side)
 Thickness: 2340 Å/360 Å/300 Å

Figure 36:
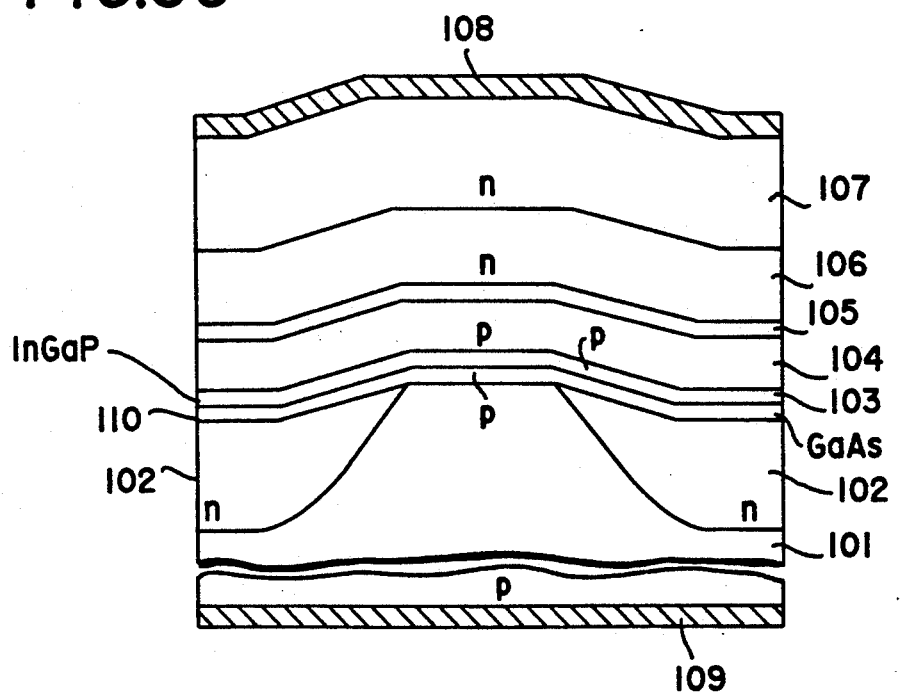
FIG. 36 is a cross sectional view showing an essential part of a fourth embodiment of the semiconductor laser according to the present invention.

Next, a description will be given of a fourth embodiment of the semiconductor laser according to the present invention, by referring to FIG. 36. In FIG. 36, those parts which are the same as those corresponding parts in FIG. 35 are designated by the same reference numerals, and a description thereof will be omitted.

This embodiment differs from the third embodiment shown in FIG. 35 in that after the n-type GaAs buried layer 102 is formed, a p-type GaAs buffer layer is formed prior to forming the p-type InGaP buffer layer 103. For example, the p-type GaAs buffer layer 110 has a thickness of approximately 300 Å and an impurity concentration of $3 \times 10^{18}$ cm$^{-3}$. According to this embodiment, it is possible to improve the morphology of the layers which are formed above the p-type GaAs buffer layer 110.

Generally, when the structure is designed to reduce a light field confinement factor Γ by making the light distribution with respect to the active layer asymmetrical and to improve the COD level, the asymmetrical light distribution is generated in most cases by reducing the Al content of the cladding layer which is adjacent to the active layer. However, in the case of the AlGaInP system semiconductor laser, the band discontinuity between the InGaP active layer and the AlGaInP cladding layer in the conduction band is only in the order of 190 meV. For this reason, it is undesirable to reduce the band discontinuity in the conduction band by reducing the Al content of the p side cladding layer which acts as a barrier for the electrons in the double heterostructure. Accordingly, the reduction of the Al content to increase the evanescent distribution of light is limited to the n side.

Next, a description will be given of a fifth embodiment of the semiconductor laser according to the present invention, by referring to FIG. 37. In this embodiment, the evanescent distribution of light in the n side cladding layer is made large. The semiconductor laser shown in FIG. 37 includes a p-type GaAs substrate 111, an n-type GaAs buried layer 112, a p-type GaAs buffer layer 113, a p-type InGaP buffer layer 114, a p-type AlInP cladding layer 115, an InGaP active layer 116, an n-type $(Al_{0.5}Ga_{0.5})_{0.5}In_{0.5}P$ cladding (guide) layer 117, an n-type AlInP cladding layer 118, an n-type GaAs contact layer 119, an n side electrode and a p side electrode 121. In this embodiment, the thickness and the like of each layer are as follows.

Substrate 111
 Impurity: Zn
 Impurity concentration: $1 \times 10$ cm$^{-3}$
Buried layer 112
 Thickness: 1 μm
 Impurity: Si
 Impurity concentration $3 \times 10^{18}$ cm$^{-3}$
Buffer layer 113
 Thickness: 300 Å
 Impurity: Zn
 Impurity concentration: $1 \times 10^{18}$ cm$^{-3}$
Buffer layer 114
 Thickness: 0.1 μm
 Impurity: Zn
 Impurity concentration: $1 \times 10^{\sim}$cm$^{-3}$
Cladding layer 115
 Thickness: 0.4 μm
 Impurity: Zn
 Impurity concentration: $2 \times 10^{17}$ cm$^{-3}$
Active layer 116
 Thickness: 0.07 μm
Cladding layer 117
 Thickness: 0.5 μm
 Impurity: Si
 Impurity concentration: $4 \times 10^{17}$ cm$^{-3}$
Cladding layer 118
 Thickness: 0.4 μm
 Impurity: Si
 Impurity concentration: $4 \times 10^{17}$ cm$^{-3}$
Contact layer 119
 Thickness: 1 μm
 Impurity: Si
 Impurity concentration: $1 \times 10^{18}$ cm$^{-3}$
n side electrode 120
 Material: Au/AuGe (GaAs side)
 Thickness: 2500 Å/500 Å
p side electrode 121
 Material: Au/Zn/Au (GaAs side)
 Thickness: 2340 Å/360 Å/300 Å

In this embodiment, the evanescent distribution of light is increased by providing the n-type $Al_{0.5}Ga_{0.5})_{0.5}In_{0.5}P$ cladding layer 117 as the guide layer on the n side. At the same time, the D.C. resistance as a whole is reduced and it is possible to effectively suppress the temperature rise because the p-type AlInP cladding layer 115 having the large resistance can be made thin. According to the experiments conducted by the present inventors, it was found that the light absorption by the p-type GaAs substrate 111 or the p-type InGaP buffer layer 114 is light and the loss can be suppressed to a small value even when the thickness of the p-type AlInP cladding layer 115 is reduced to 0.4 μm. Moreover, it was also confirmed that the thermal resistance is effectively reduced because the p-type AlInP cladding layer 115 is thin and the InGaP active layer 117 is close to the n-type GaAs substrate 111.

Figure 38A:
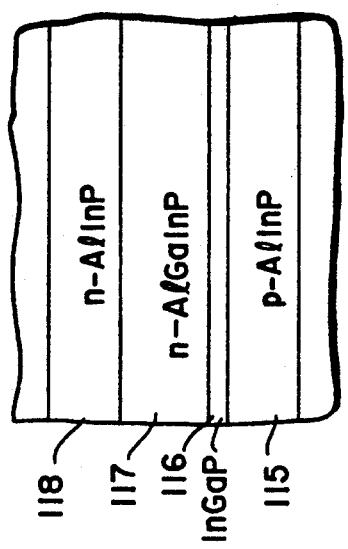
FIG. 38 is a diagram for explaining a stacked structure at an essential part of the semiconductor laser shown in FIG. 37 in correspondence with the laser field intensity distribution.
Figure 38B:
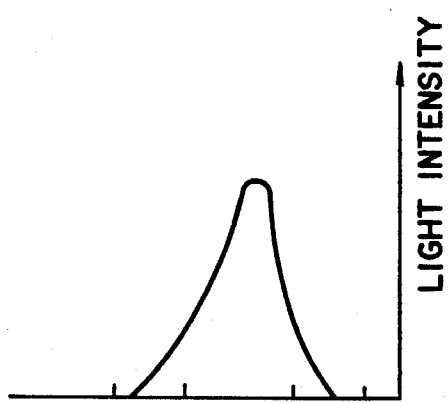
Figure 37:
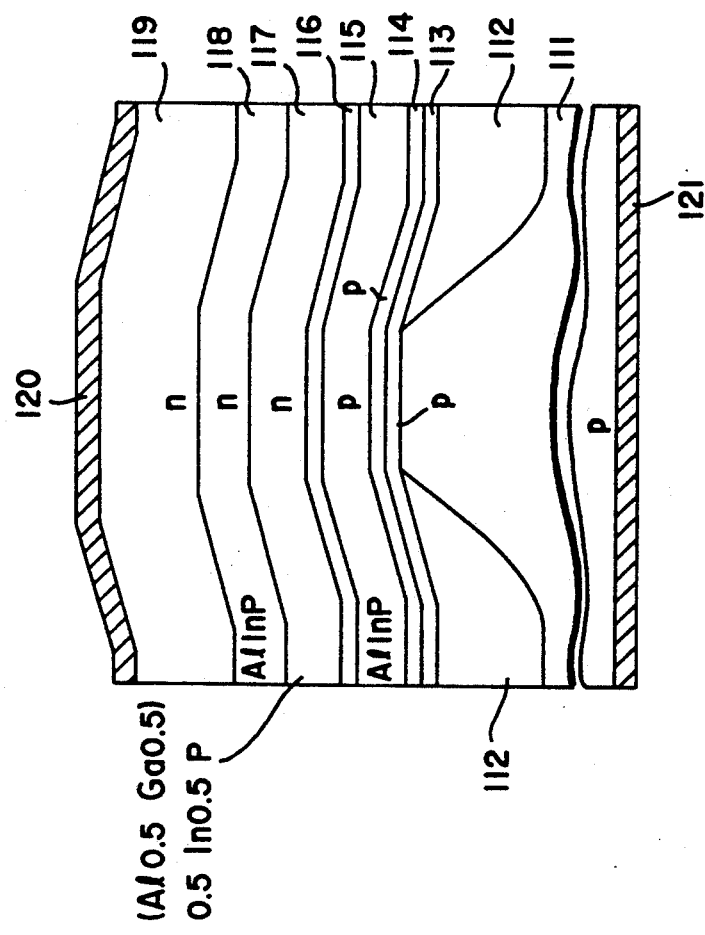
FIG. 37 is a cross sectional view showing an essential part of a fifth embodiment of the semiconductor laser according to the present invention.

FIG. 38 is a diagram for explaining an essential part of the stacked structure of the semiconductor laser shown in FIG. 37 in correspondence with a laser beam distribution. In FIG. 38, the same designations are used as in FIG. 37.

FIG. 38 (A) shows an essential part of the embodiment shown in FIG. 37, and FIG. 38 (B) shows a corresponding laser field distribution, where the abscissa indicates the light intensity.

As may be seen from FIG. 38, the evanescent distribution of light in the side of the p-type AlInP cladding layer 115 is small, while the evanescent distribution of light in the side of the n-type AlGaInP cladding layer 117 is large.

In the embodiments described in conjunction with FIGS. 36 and 37, the p-type InGaP buffer layer 104 (or p-type InGaP buffer layer 114) is interposed between the p-type GaAs buffer layer 110 (or 113) and the p-type AlGaInP cladding layer 104 (or p-type AlInP cladding layer 115). This structure is taken because of the special circumstances introduced by the use of the AlGaInP system material.

In other words, in the heterostructure made up of GaAs and AlGaInP, the energy band discontinuity at the peak of the valence band reaches 0.6 eV at the maximum. Thus, when the p-type GaAs layer and the p-type AlGaInP layer are stacked adjacent to each other, a current will not flow unless a large voltage is applied.

Figure 39:
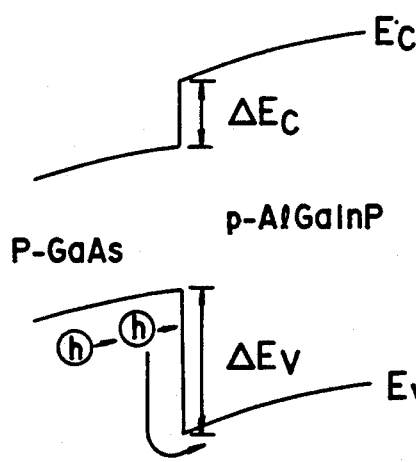
FIG. 39 shows an energy band diagram for explaining the problem of a heterostructure made up of GaAs and AlGaInP.

FIG. 39 shows an energy band diagram for explaining the heterostructure made up of GaAs and $(Al_x Ga_{1-x})_{0.5}In_{0.5}P$ (x=0.7). In FIG. 39, $E_v$ denotes the peak of the valence band, $E_c$ denotes a bottom of the conduction band, $\Delta E_v$ denotes a discontinuity value at the peak of the valence band, $\Delta E_c$ denotes a discontinuity value at the bottom of the conduction band, and h denotes holes. As described above, $\Delta E_v$ is 0.52 V and $\Delta E_c$ is 0.38 V.

Accordingly, the holes h will not flow from the p-type GaAs layer to the p-type AlGaInP layer by exceeding the discontinuity value $\Delta E_v$ unless the operating voltage is set large. Of course, there is no electric current when there is no flow of the holes h.

When the above described heterostructure is employed in the semiconductor laser, a large voltage must be applied to the semiconductor laser and the power consumption as a whole becomes large. The AlGaInP system semiconductor laser already suffers from the large thermal resistance described above, and it is of course undesirable to increase the power consumption.

The above described problem of the large power consumption may be reduced by providing a layer which is made of a material having an intermediate energy band gap between those of the GaAs and AlGaInP. Particularly, it is known to provide a buffer layer made of p-type InGaP or AlGaInP, for example, so as to confine the current using the characteristic of the buffer layer. For example, a semiconductor laser applied with such a current confinement structure is proposed in Japanese Laid-Open Patent Applications No.62-200784 and No.63-81884.

Figure 40:
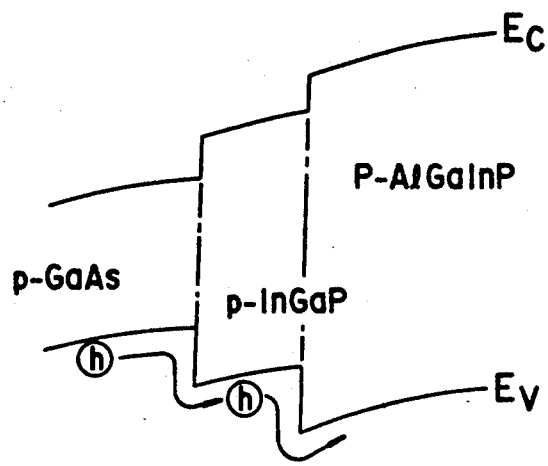
FIG. 40 shows an energy band diagram for explaining a means for reducing the problem of the heterostructure made up of GaAs and AlGaInP.

FIG. 40 shows an energy band diagram for explaining a means for reducing the above described problem of the heterostructure which is made up of the GaAs and AlGaInP. In FIG. 40, the same designations are used as in FIG. 39.

As may be seen from FIG. 40, the discontinuity value $\Delta E_v$ at the top $E_v$ of the valence band becomes stepped and substantially reduced due to the provision of the p-type InGaP buffer layer, and the holes h more easily exceed the discontinuity value $\Delta E_v$. The present invention also utilizes a p-type InGaP buffer layer based on this principle.

When the optical output of the above described kind of semiconductor laser increases, the light leaking out from the waveguide is also absorbed within the n-type GaAs buried layer 112, for example, to generate the electron-hole pairs. Particularly since this kind of semiconductor laser reduces the thermal resistance, increases the stripe width or makes the light distribution asymmetrical so as to produce an output which is larger compared to that produced by the conventional semiconductor laser, extremely large number of electron-hole pairs are generated when the semiconductor laser produces the large output even though the loss rate due to the light absorpsion is slight. Hence, effects of the extremely large number of electron-hole pairs must be taken fully into consideration in order to effectively utilize the large output characteristic of the semiconductor laser.

Figure 41:
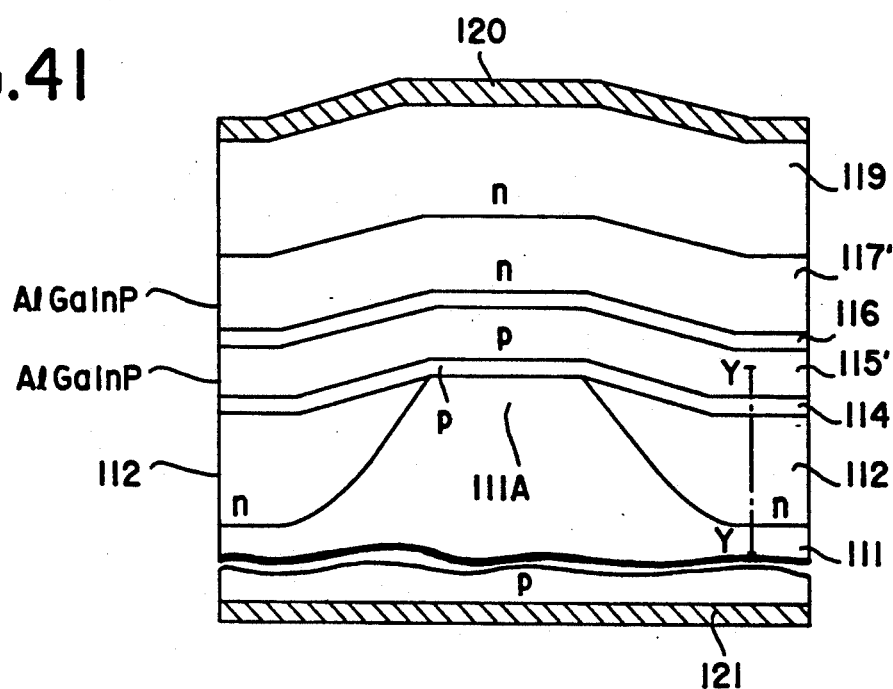
FIG. 41 is a cross sectional view showing an essential part of a semiconductor laser for explaining the generation of electron-hole pairs within an n-type GaAs buried layer.

FIG. 41 shows an essential part of a semiconductor laser for explaining the generation of the electron-hole pairs within the n-type GaAs buried layer 112. FIG. 41 corresponds to a part of the semiconductor laser shown in FIG. 37, and in FIG. 41, the same designations are used as in FIGS. 38 through 40.

Figure 42:
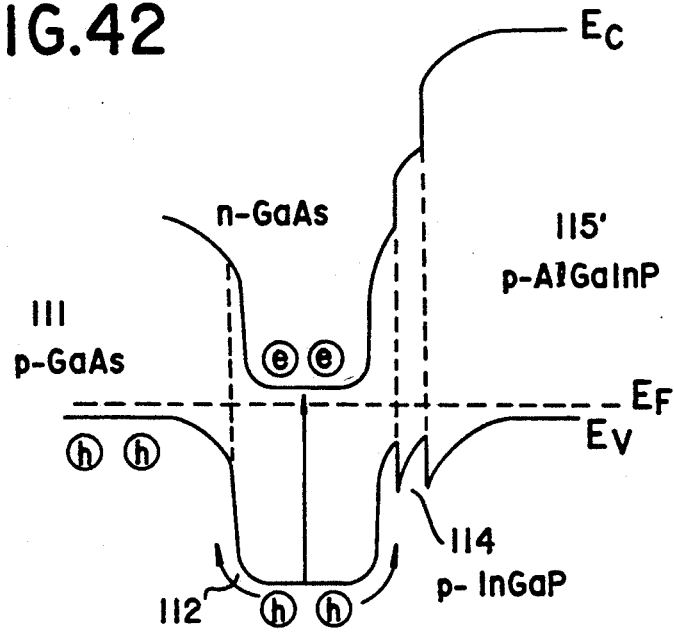
FIG. 42 shows an energy band diagram taken along a line Y—Y in FIG. 41.

FIG. 42 shows an energy band diagram taken along a line Y—Y in FIG. 41. In FIG. 42, $E_F$ denotes a Fermi level and e denotes electrons.

In the state shown in FIG. 42, the n-type GaAs buried layer 112 absorbs the light and generates the electron-hole pairs, and the electrons e are trapped and accumulated within the potential well of the n-type GaAs buried layer 112. These electrons e reduce the potential wall with respect to the holes h at the n-type GaAs buried layer 112.

Figure 43:
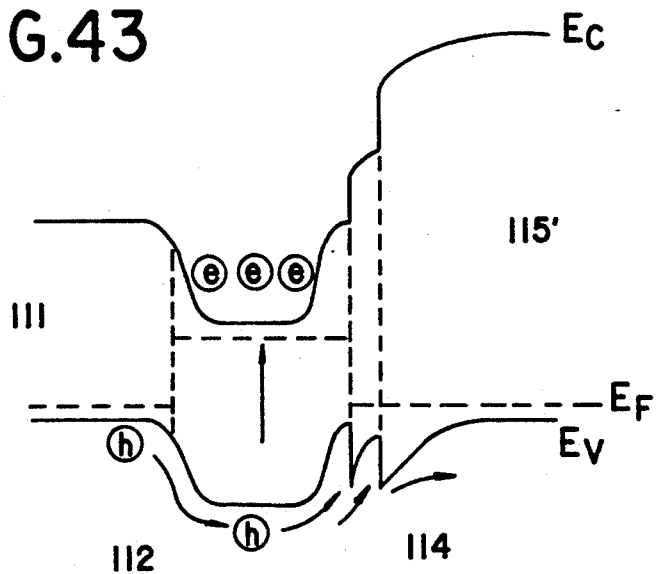
FIG. 43 shows an energy band diagram for explaining the reduction of a potential barrier with respect to the holes in the n-type GaAs buried layer.

FIG. 43 shows an energy band diagram for explaining the reduction of the potential wall with respect to the holes h at the n-type GaAs buried layer 112. In FIG. 43, the same designations are used as in FIG. 42.

As shown in FIG. 43, the barrier height at the bottom $E_v$ of the valence band decreases because the electrons e are trapped by the potential well of the n-type GaAs buried layer 112. Hence, by the so-called photo transistor operation, the holes h are injected from the p-type GaAs substrate 111 over the n-type GaAs buried layer 112 and cause a leak current in the semiconductor laser. In this case, the p-type InGaP buffer layer 114 which is provided to reduce the operation voltage also acts similarly with respect to the leak current, that is, acts to increase the leak current even responsive to a small potential change.

In order to overcome the problem caused by the p-type InGaP buffer layer 114, the current spread should be limited and the n-type GaAs buried layer should make direct contact with a p-type AlGaInP cladding layer 115' at only the current confinement part.

Figure 44:
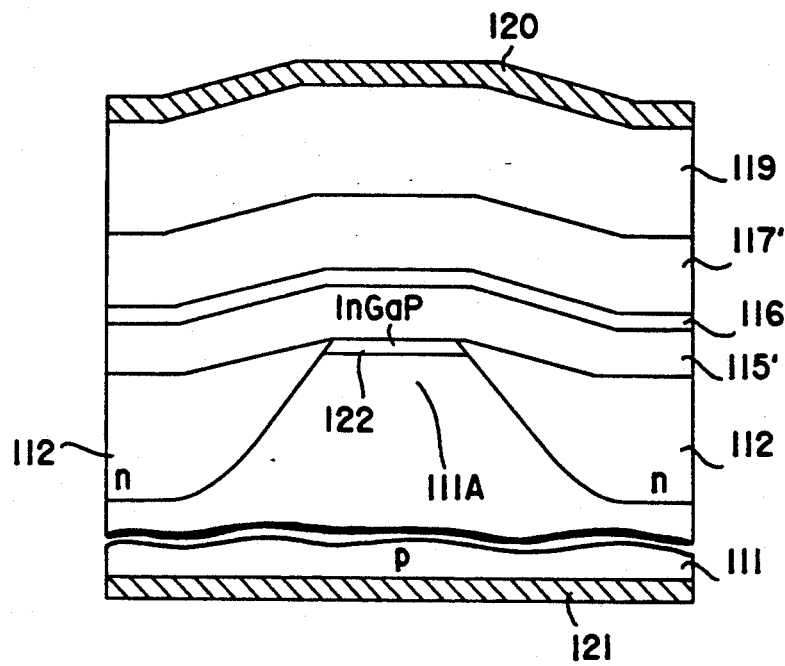
FIG. 44 is a cross sectional view showing an essential part of a sixth embodiment of the semiconductor laser according to the present invention.

Next, a description will be given of a sixth embodiment of the semiconductor laser according to the present invention in which the structure of the p-type InaP buffer layer 114 is modified, by referring to FIG. 44. In FIG. 44, those parts which are the same as those corresponding parts in FIGS. 37 and 41 are designated by the same reference numerals, and a description thereof will be omitted. In this embodiment, a p-type InGaP buffer layer 122 is provided.

The semiconductor laser shown in FIG. 44 can be produced with ease based on the processes described in conjunction with FIGS. 27 through 33. When forming the p-type GaAs substrate 111 into the shaped substrate, the mesa etching of the p-type GaAs substrate 111 is made after forming the p-type InGaP buffer layer 122 on the p-type GaAs substrate 111. When the thickness of the p-type InGaP buffer layer 122 is 40 nm or less, it is possible to obtain a satisfactory mesa structure for the buried layer even without employing the method of the present invention.

Figure 45:
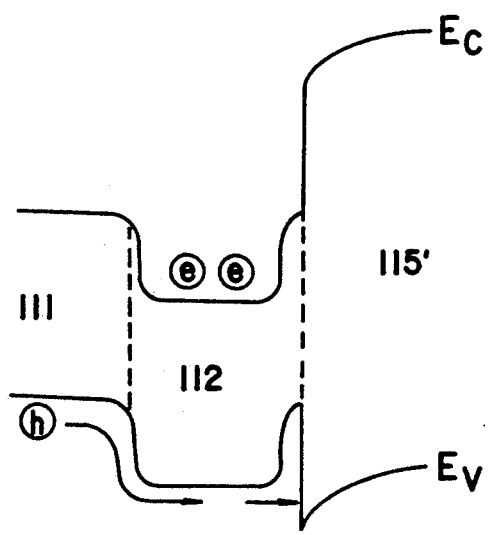
FIG. 45 shows an energy band diagram of the semiconductor laser shown in FIG. 44.

FIG. 45 shows an energy band diagram of the semiconductor laser shown in FIG. 44. In FIG. 45, the same designations are used as in FIGS. 42 and 43.

As may be seen from FIG. 45, no p-type InGaP buffer layer 122 exists between the n-type GaAs buried layer 112 and the p-type AlGaInP cladding layer 115′. Hence, the potential wall between the n-type GaAs buried layer 112 and the p-type AlGaInP cladding layer 115′ is sufficiently high, so that the leak current is reduced.

Figure 46:
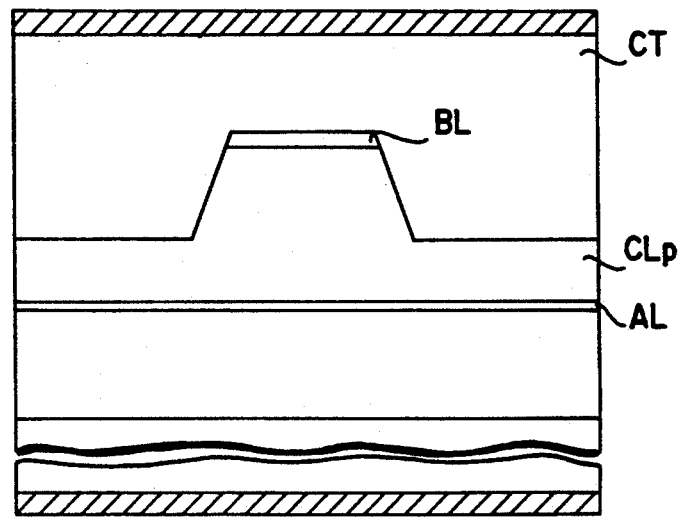
FIG. 46 is a cross sectional view showing an essential part of a semiconductor laser for explaining a known technique related to the sixth embodiment of the semiconductor laser.

FIG. 46 shows a semiconductor laser for explaining a known technology related to the embodiment shown in FIGS. 44 and 45.

As shown in FIG. 46, a p-type AlGaInP cladding layer $CL_p$ us formed on the top surface of an InGaP active layer AL, and a p-type InGaP buffer layer BL is formed only between the top surface of the mesa formed by the p-type AlGaInP cladding layer $CL_p$ and a p-type GaAs contact layer CT. The p-type AlGaInP cladding layer $CL_p$ and the p-type GaAs contact layer CT make direct contact at parts other than the top surface of the mesa. Hence, the current flows only at the top surface of the mesa due to the difference in the potential walls.

The embodiment described in conjunction with FIGS. 44 and 45 is applied with a part of the known technology described in conjunction with FIG. 46. However, unlike in FIG. 46, the current blocking part has a pnp structure which is made up of the p-type GaAs substrate 111, the n-type GaAs buried layer 112 and the p-type AlGaInP cladding layer 115. Hence, even when the operation temperature is high, it is possible to effectively block the current utilizing the structure shown in FIG. 46.

It may be regarded that the problem of the stray photo transistor operation may be eliminated by using, in place of the n-type GaAs, AlGaAs or AlGaInP which is transparent with respect to the wavelength of the emitting light for the buried layer which acts as the current confinement part.

Figure 47:
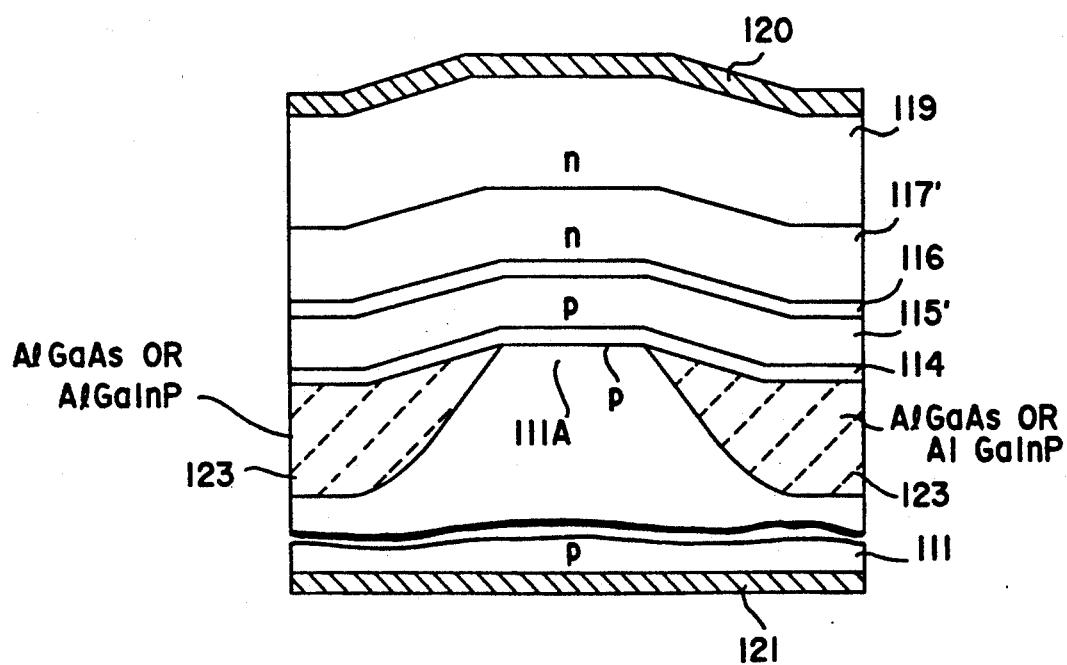
FIG. 47 is a cross sectional view showing an essential part of a semiconductor laser having an AlGaAs or AlGaInP buried layer.

FIG. 47 shows a semiconductor laser which includes a buried layer made of AlGaAs (or AlGaInP). In FIG. 47, those parts which are the same as those corresponding parts in FIGS. 37 through 41 are designated by the same reference numerals, and a description thereof will be omitted.

In FIG. 47, a buried layer 123 is made of n-type AlGaAs, but it is also possible to use n-type AlGaInP in place of the n-type AlGaAs. However, the semiconductor laser shown in FIG. 47 suffers from the following problems.

First, when the current confinement part is made of a 3-element or 4-element material, the thermal resistance of this part itself becomes large and the heat release characteristic becomes extremely poor. Second, because of the different buried layer material, it is difficult to form the buried layer with a satisfactory shape which was obtainable in the case of the n-type GaAs buried layer. In addition, when the semiconductor layer is thereafter formed on the buried layer, the semiconductor layer must be grown on a layer which includes Al.

Figure 48:
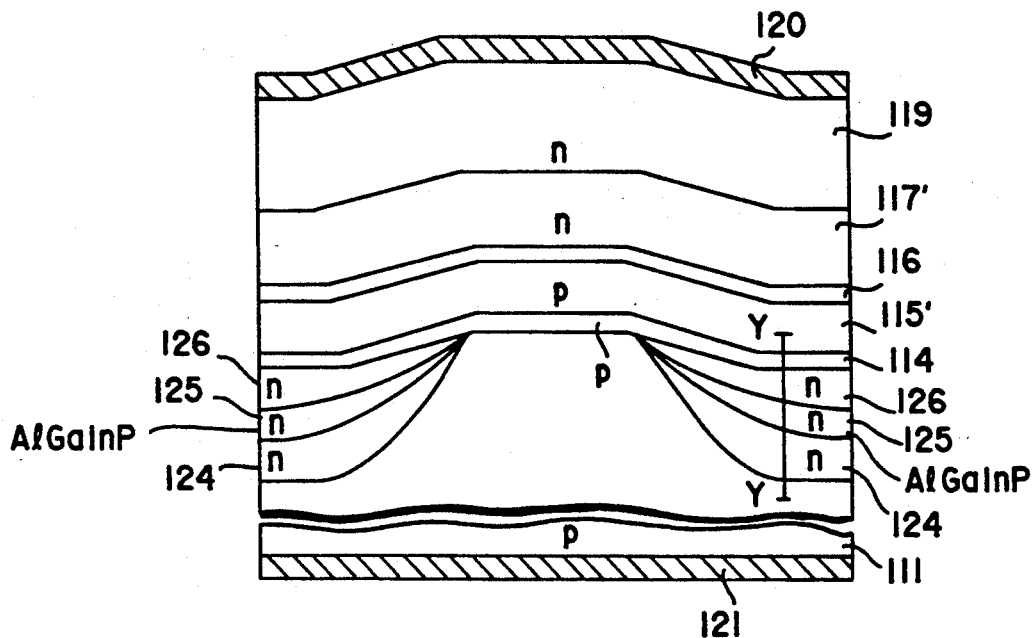
FIG. 48 is a cross sectional view showing an essential part of a seventh embodiment of the semiconductor laser according to the present invention.

Next, a description will be given of a seventh embodiment of the semiconductor laser according to the present invention, by referring to FIG. 48. In FIG. 48, those parts which are the same as those corresponding parts in FIGS. 37 through 41 are designated by the same reference numerals, and a description thereof will be omitted.

According to this embodiment, the above described problems are eliminated by using a material having a wide energy band gap in a part of the n-type GaAs buried layer. In FIG. 48, an n-type GaAs buried layer 124, an n-type AlGaInP buried layer 125 and an n-type GaAs buried layer 126 are successively formed on the p-type GaAs substrate 111. In this embodiment, the thickness and the like of each buried layer are as follows.

Figure 49:
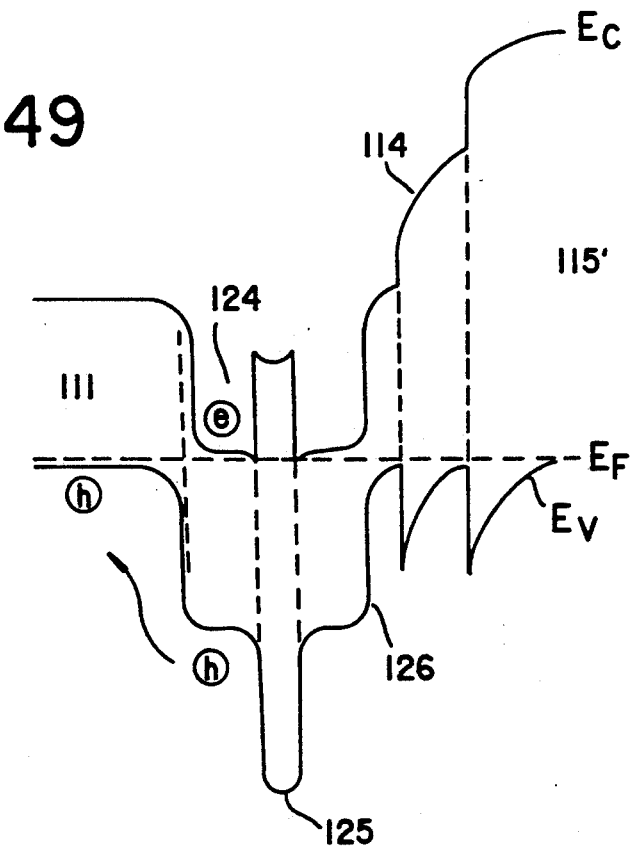
FIG. 49 shows an energy band diagram taken along a line Y—Y in FIG. 48.

Buried layer 124
  Thickness: 0.5 μm
  Impurity: Si
  Impurity concentration: $3 \times 10^{18}$ cm$^{-3}$
Buried layer 125
  Thickness: 500 to 1000 Å
  Impurity: Si
  Impurity concentration: $4 \times 10^{17}$ cm$^{-3}$
Buried layer 126
  Thickness: 0.5 μm
  Impurity: Si
  Impurity concentration: $3 \times 10^{18}$ cm$^{-3}$ FIG. 49 shows an energy band diagram taken along a line Y—Y in FIG. 48. In FIG. 49, the same designations are used as in FIGS. 43 through 45 and 48.

As shown in FIG. 49, the majority of the current confinement part is formed from GaAs so as to maintain the thermal resistance low, and the shape of the buried layer is maintained to a satisfactory shape. Furthermore, the injection of the holes is prevented by providing an AlGaInP layer which has a sufficient thickness and a wide energy band gap to act as a barrier for the carriers.

Figure 50:
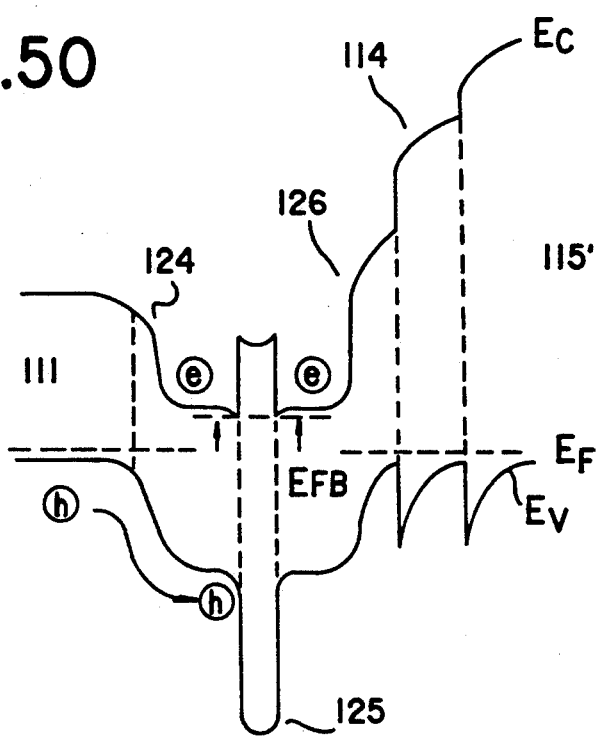
FIG. 50 shows an energy band diagram for explaining a case where the seventh embodiment of the semiconductor laser operates as a photo transistor.

FIG. 50 shows an energy band diagram for explaining the photo transistor operation of the semiconductor laser described in conjunction with FIGS. 48 and 49. In FIG. 50, the same designations are used as in FIGS. 48 and 49. In FIG. 50, $E_{FB}$ denotes a Fermi level within the buried layer which is changed by the photo transistor operation.

In this embodiment, the potential barrier described in conjunction with FIG. 39 is introduced at the current confinement part.

FIG. 50 shows a state where the electrons e are trapped in the n-type GaAs buried layers 124 and 126 and a potential change occurs due to the photo transistor operation. But even in this case, it can be seen that the barrier of the n-type AlGaInP buried layer 125 which has the wide energy band gap blocks the injection of the holes h. In addition, since the top of the buried layers is the n-type GaAs buried layer 126, it is possible to prevent the semiconductor layer from being formed on a layer which includes Al.

Figure 51:
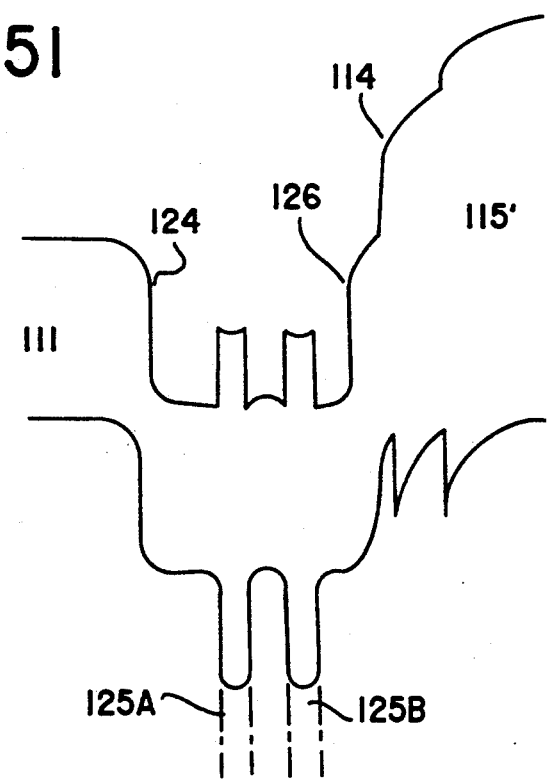
FIG. 51 shows an energy band diagram for explaining an eighth embodiment of the semiconductor laser according to the present invention.

Next, a description will be given of an eighth embodiment of the semiconductor laser according to the present invention, by referring to FIG. 51. In FIG. 51, the same designations are used as in FIGS. 48 through 50. In this embodiment, a plurality of n-type AlGaInP buried layers having the wide energy band gap as described in conjunction with FIGS. 48 through 50 are provided. In FIG. 51, 125A and 125B respectively denote n-type AlGaInP buried layers.

In this case, the n-type AlGaInP buried layers 125A and 125B respectively have a thickness of 500 Å and are separated from each other by 500 Å, for example. According to this structure, the carriers injected from the p-type GaAs substrate 111 must overcome a plurality of potential walls, and the recombination rate of the carriers increases due to the deep interface state formed at the interface of the buried layers 125A and 125B. As a result, it is possible to in effect reduce the change of the Fermi level $E_{FB}$ and more positively suppress the photo transistor operation, thereby making this structure suited for producing a large output.

Figure 52:
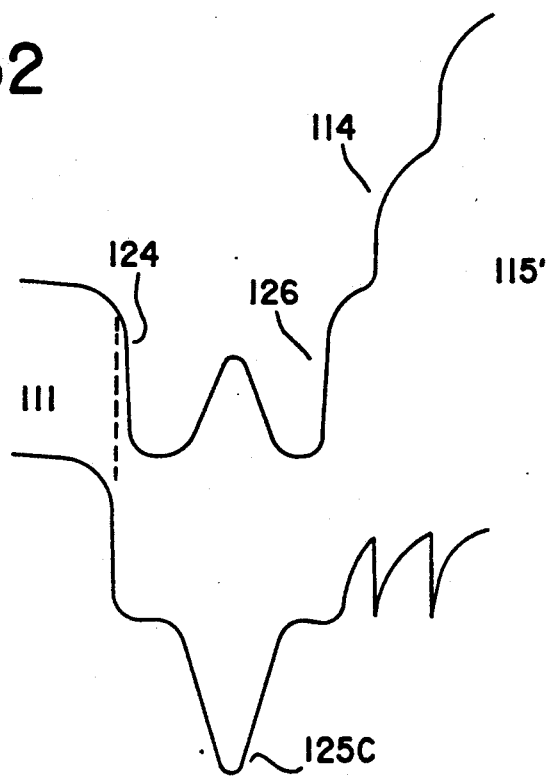
FIG. 52 shows an energy band diagram for explaining a ninth embodiment of the semiconductor laser according to the present invention.

FIG. 52 shows an energy band diagram for explaining a ninth embodiment of the semiconductor laser according to the present invention. In this embodiment, AlGaInP is used as the n-type buried layer material which has a wide energy band gap as in the case of the embodiments described in conjunction with FIGS. 48 through 51, but the composition of the buried layer successively changes in this embodiment. In FIG. 52, the same designations are used as in FIGS. 48 through 51. The composition successively changes in an n-type AlGaInPAs buried layer 125C shown in FIG. 52.

For example, the buried layer 125C has a thickness of 500 Å so that a satisfactory surface morphology is obtained when actually growing the buried layer 125C by a MOVPE. The satisfactory surface morphology can be obtained under a wide range of growth conditions because the group V element composition successively changes in the material used so that no interface is generated where the group V element having the relatively limited growth conditions changes from As to P or P to As.

When the stripe width is set large as in the above described embodiments so as to produce a large output, the cross section of the emitted laser beam becomes an oval shape which is elongated in the vertical direction. However, when carrying out the high density storage on the disk using the semiconductor laser as the light source, it is desirable that the cross section of the emitted laser beam is approximately circular. Hence, it is possible to consider reducing the stripe width, but in this case, the light density at the laser edge facet increases and the COD breakdown easily occurs. In addition, since the current density to the stripe part becomes extremely large, a considerable temperature rise occurs at the stripe part and the output of the semiconductor laser becomes restricted by the thermal saturation. This problem caused by the thermal saturation becomes conspicuous particularly when the cladding layer is made of a 4-element compound semiconductor having a large thermal resistance, such as AlGaInP.

Figure 53:
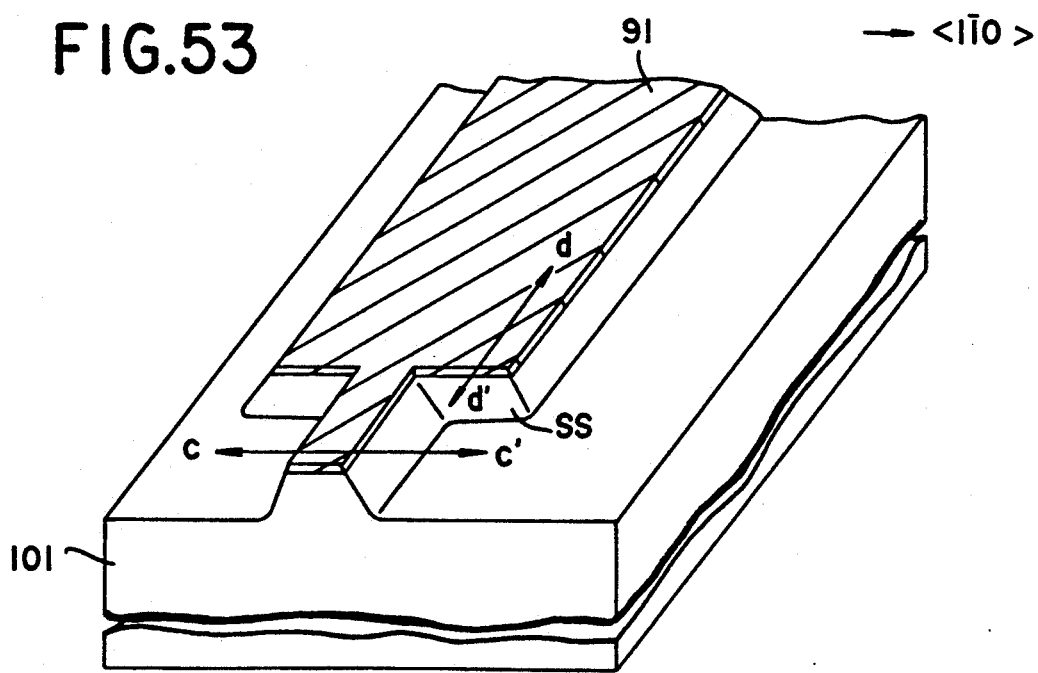
FIG. 53 is a perspective view showing an essential part of a semiconductor laser having a stripe width which is small only in a vicinity of a laser edge facet.

Accordingly, the present inventors tested a conventional mesa structure of a GaAs substrate shown in FIG. 53 in order to simultaneously eliminate the problem of the cross sectional shape of the laser beam and the problem of the heat release. In other words, the stripe width is made small only in a vicinity of the laser edge facet. In FIG. 53, those parts which are the same as those corresponding parts in FIG. 35 are designated by the same reference numerals, and a description thereof will be omitted.

Figure 54A:
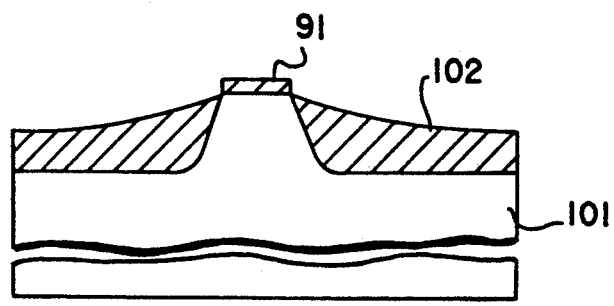
FIG. 54 is a cross sectional view showing essential parts of the semiconductor laser taken along lines c—c' and d—d', in FIG. 53.
Figure 54B:
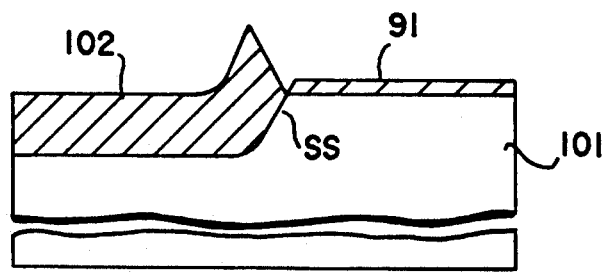

FIG. 54 (A) shows a cross section taken along a line c—c' in FIG. 53, and FIG. 54 (B) shows a cross section taken along a line d—d' in FIG. 53. Since the (111)A face of the p-type GaAs substrate 101 is exposed at the part where the stripe width becomes large as shown in FIG. 54 (B), the n-type GaAs buried layer 102 grows and forms a shape which projects upwardly. For this reason, it becomes extremely difficult to control the shape of the double heterostructure which is formed above the structure shown in FIG. 54 (B).

Next, descriptions will be given of embodiments which can simultaneously eliminate the problem of the cross sectional shape of the laser beam and the problem of the heat release.

Figure 56:
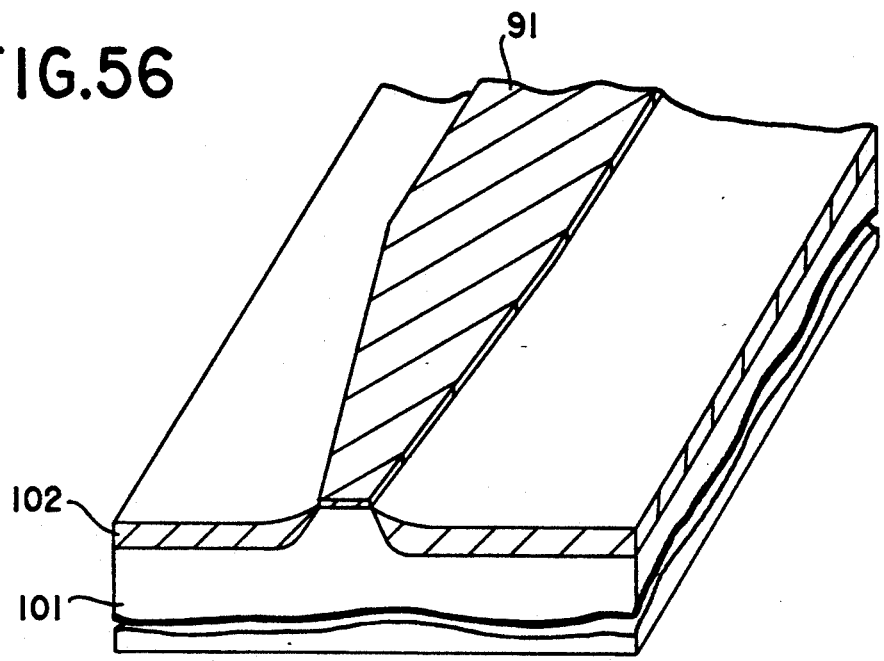
Figure 57:
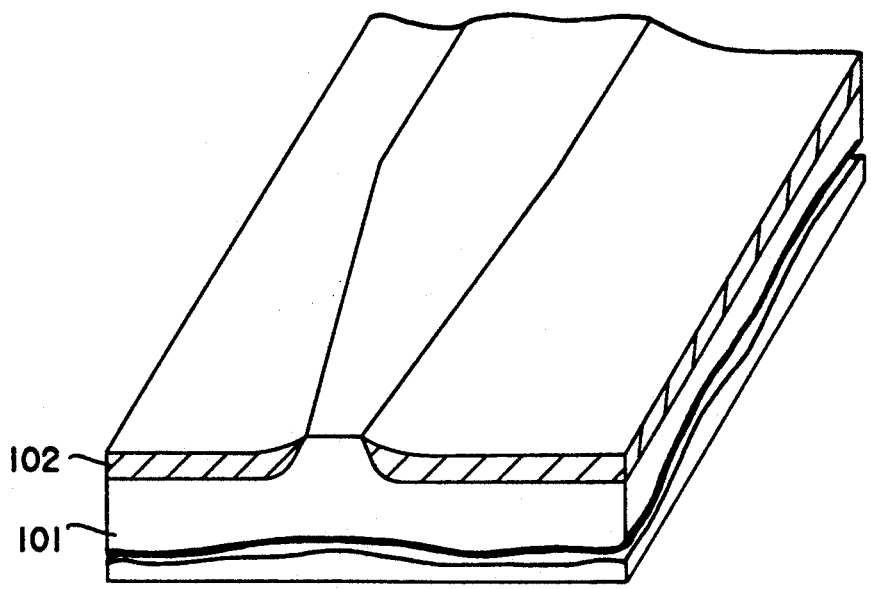
Figure 58:
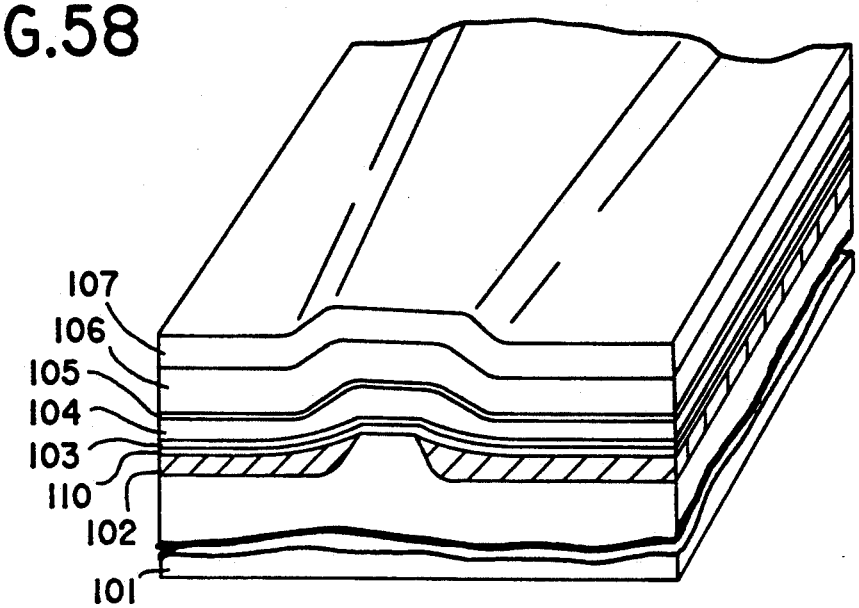

FIG. 58 shows a tenth embodiment of the semiconductor laser according to the present invention. A description will be given of a second embodiment of the method of producing the semiconductor laser according to the present invention for producing the tenth embodiment of semiconductor laser, by referring to FIGS. 55 through 58. In FIGS. 55 through 58, those parts which are the same as those corresponding parts in FIG. 36 are designated by the same reference numerals, and a description thereof will be omitted.

Figure 55:
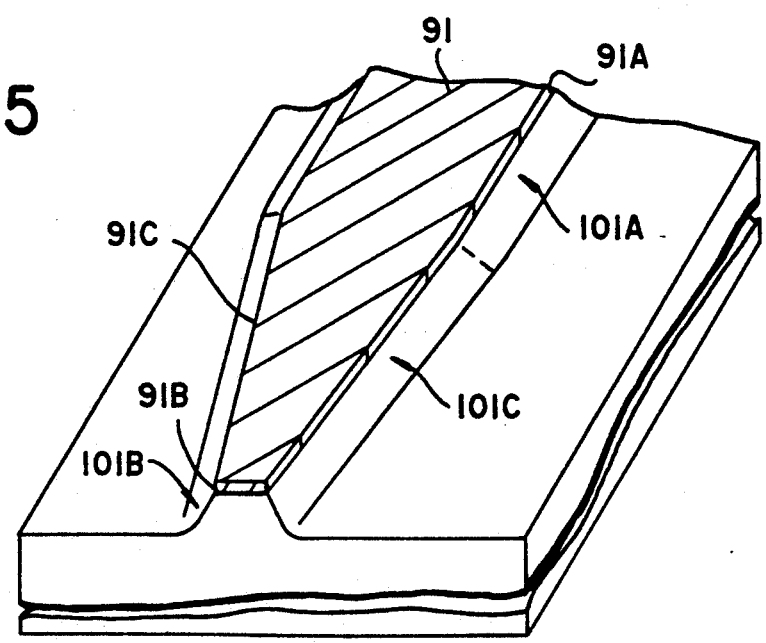
FIGS. 55 through 58 are perspective views showing a tenth embodiment of the semiconductor laser according to the present invention at various production stages for explaining a second embodiment of the method of producing the semiconductor laser according to the present invention.

First, the structure shown in FIG. 55 is formed by carrying out processes similar to those described in conjunction with FIGS. 27 through 29. In other words, the $SiO_2$ layer 91 is formed on the (100) face of the p-type GaAs substrate 101 by a sputtering. The normal photolithography technique is used to form a stripe pattern by a patterning. This stripe pattern has a wide part 91A which has a width of 9 μm, for example, and a narrow part 91B which has a width of 6 μm, for example, where the widths are taken along the <1$\bar{1}$0> direction. The wide part 91A and the narrow part 91B are connected by a tapered part 91C which has a length of approximately 50 μm. The resist pattern which is used for this patterning is used as a mask when etching the $SiO_2$ layer 91 by a hydrofluoric acid buffer solution, and the resist is thereafter removed. Next, the $SiO_2$ layer 92 is used as a mask to etch the p-type GaAs substrate 101 by a mixed etchant of $H_2SO_4+H_2O_2+H_2O$ which is heated to approximately 50°0 C., so as to remove approximately 2 μm of the $SiO_2$ layer 91. As a result, approximately the (111)B face appears at the mesa side surface, and the top surface of the mesa structure has a wide part 101A having a width of approximately 4.8 μm and a narrow part 101B having a width of approximately 1.8 μm, where the widths are taken along the <1$\bar{1}$0> direction.

Next, the eaves of the $SiO_2$ layer 91 is removed so that a buried layer having a satisfactory shape can be formed in the subsequent process. The removal of the eaves of approximately 2 μm is carried out by an etching using an etchant which has approximately the same etching rate for $SiO_2$ and GaAs. For example, the etchant is a mixed solution of $H_2SO_4+H_2O_2+NH_4F+HF+H_2O$, and the etching time is set so that approximately half the thickness of the $SiO_2$ layer 91 is removed by the etching.

Thereafter, the remaining $SiO_2$ layer 91 is used as a mask to selectively grow the n-type GaAs buried layer 102 to a thickness of 1 μm using an MOVPE. Hence, a trapezoidal mesa having the (311)B face as its sloping surface is formed as shown in FIG. 56.

Then, the $SiO_2$ layer 91 is removed as shown in FIG. 57 using hydrofluoric acid (HF). Furthermore, the p-type GaAs buffer layer 110, the p-type InGaP buffer layer 103, the p-type AlGaInP cladding layer 104, the InGaP active layer 105, the n-type AlGaInP cladding layer 106 and the n-type GaAs contact layer 107 are successively formed on the structure shown in FIG. 57.

Therefore, the semiconductor laser shown in FIG. 58 is formed. The width of the InGaP active layer 105 in the <1$\bar{1}$0> direction is approximately 6.4 μm at the wide part 101A and approximately 2.4 μm at the narrow part 101B.

According to this embodiment, the n-type GaAs buried layer 102 for the current confinement is formed on the sloping surface of the mesa structure which is approximately the (111)B face, even at the tapered part 101C of the p-type GaAs substrate 101. Hence, the shape of the buried layer 102 is satisfactory throughout the entire region of the stripe. For this reason, the thermal saturation of the laser operation is suppressed at the wide part of the stripe, while the laser oscillation is such that the cross sectional shape of the laser beam is satisfactory at the laser edge facet, that is, at the narrow part of the stripe.

Figure 59:
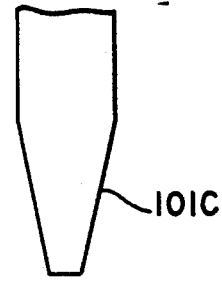
FIG. 59 is a plan view showing an essential part of the tenth embodiment of the semiconductor laser.
Figure 60:
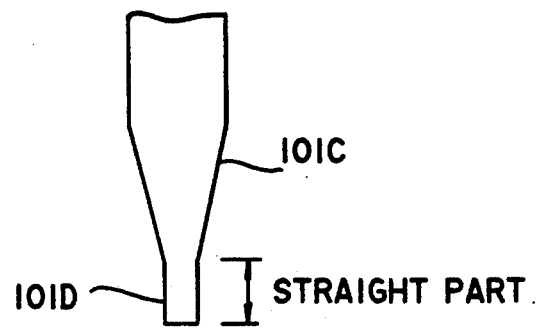
FIG. 60 is a plan view showing an essential part of a modification of the tenth embodiment of the semiconductor laser according to the present invention.
Figure 61:
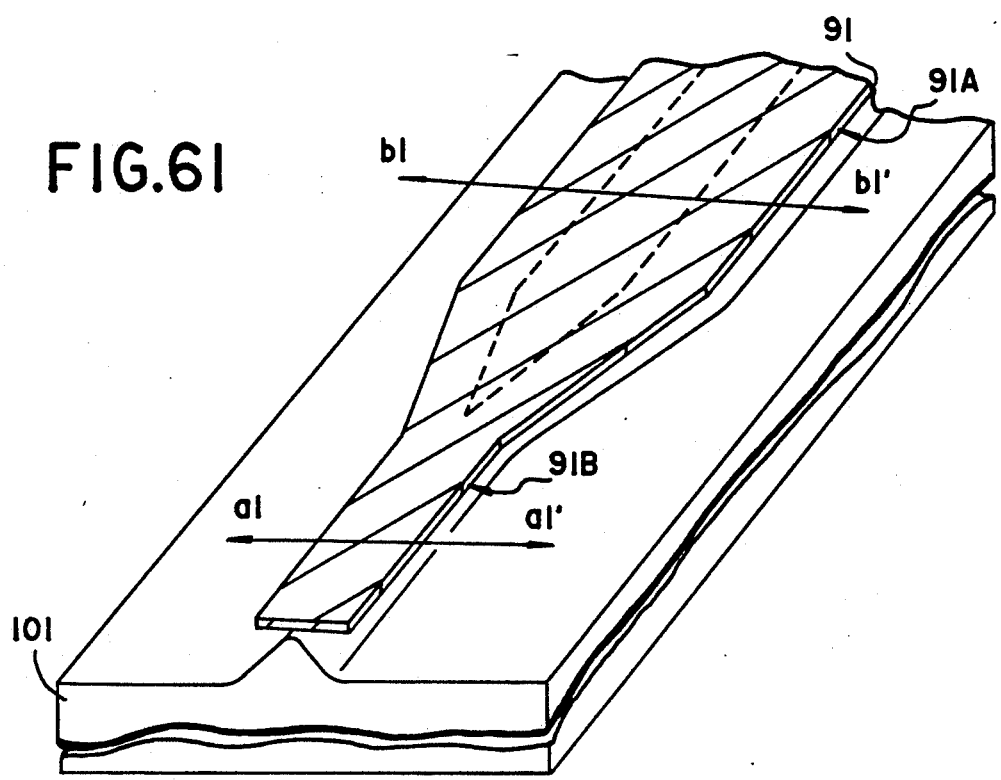
FIGS. 61 through 65 are perspective views showing an eleventh embodiment of the semiconductor laser according to the present invention at various production stages for explaining a third embodiment of the method of producing the semiconductor laser according to the present invention.

In this embodiment, the laser edge facet is provided at the tapered part 101C as shown in FIG. 59. However, as a modification of this tenth embodiment, a straight part 101D may be connected to the tapered part 101C, and the laser edge facet may be provided at the straight part 101D as shown in FIG. 60.

Figure 64:
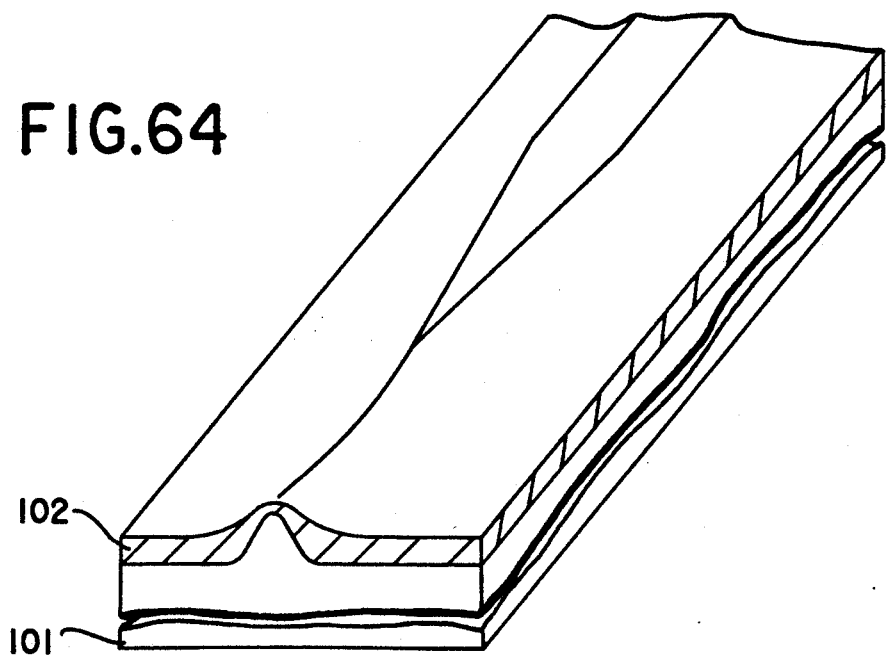
Figure 65:
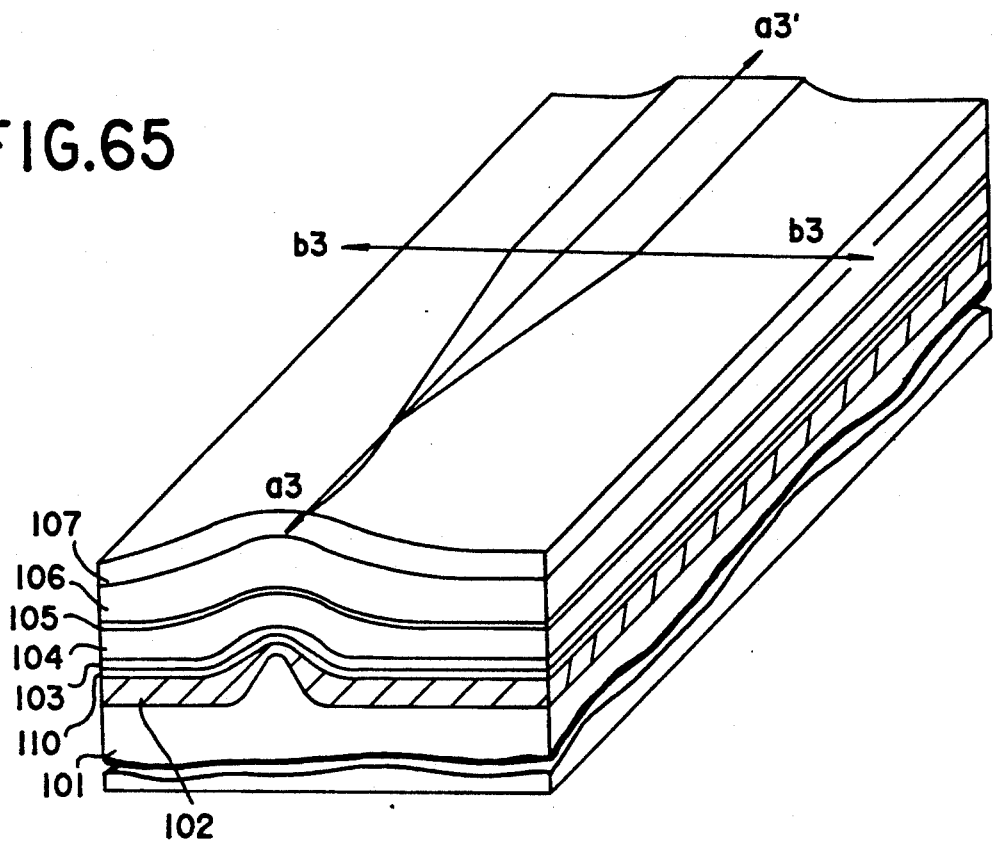

FIG. 65 shows an eleventh embodiment of the semiconductor laser according to the present invention. A description will be given of a third embodiment of the method of producing the semiconductor laser according to the present invention for producing the eleventh embodiment of semiconductor laser, by referring to FIGS. 61 through 65. In FIGS. 61 through 65, those parts which are the same as those corresponding parts in FIG. 36 are designated by the same reference numerals, and a description thereof will be omitted.

Figure 66A:
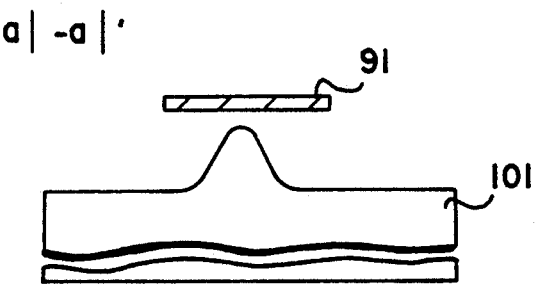
FIG. 66 is a cross sectional view showing essential parts of the semiconductor laser taken along lines a1—a1' and b1—b1' in FIG. 61.
Figure 66B:
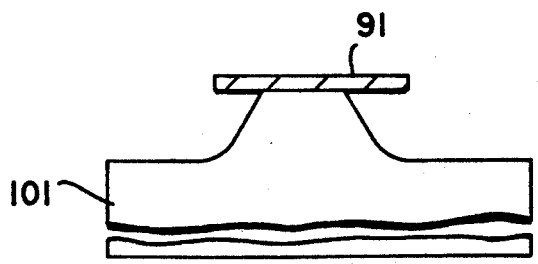

First, the SiO$_2$ layer 91 is used as a mask to etch approximately 2 $\mu$m of the p-type GaAs substrate 101. The SiO$_2$ layer 91 has a wide part 91A having a width of approximately 9 $\mu$m and a narrow part 91B having a width of approximately 4.5 $\mu$m, where the widths are taken along the <1$\bar{1}$0> direction. FIG. 66 (a) shows a cross section along a line a1—a1' in FIG. 61, and FIG. 66 (b) shows a cross section along a line b1—b1' in FIG. 61.

Figure 62:
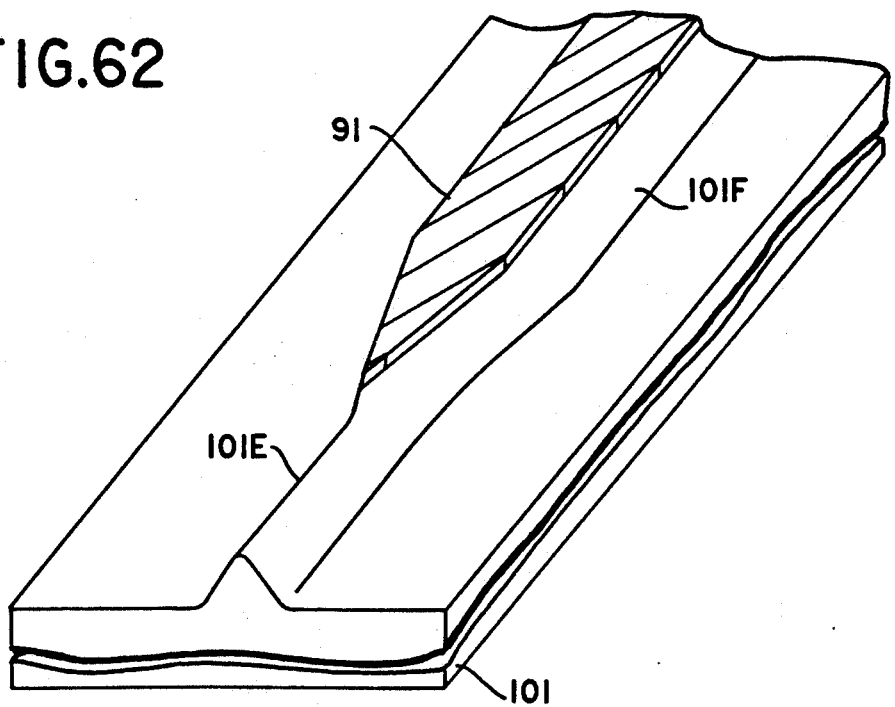

Thereafter, the eaves of the SiO$_2$ layer 91 is removed as shown in FIG. 62 using a process similar to that used in the second embodiment of the method. Hence, a prism shaped part 101E of the p-type GaAs substrate 101 is exposed, but the SiO$_2$ layer 91 remains on a mesa part 101F of the p-type GaAs substrate 101.

Figure 63:
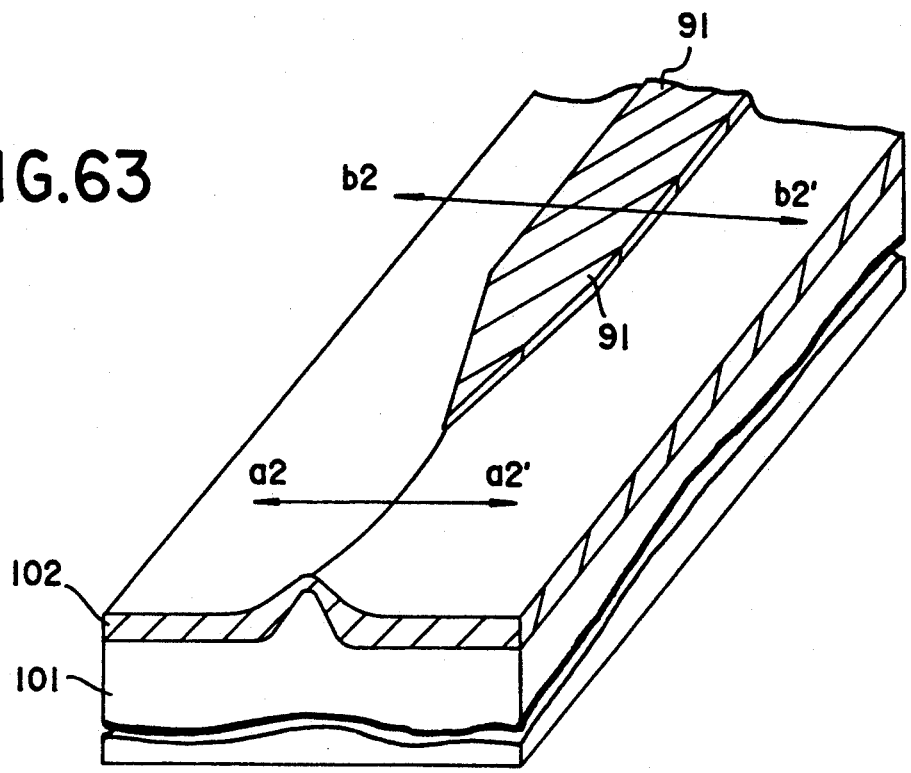
Figure 67A:
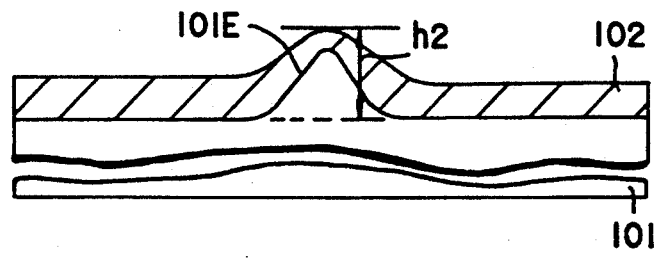
FIG. 67 is a cross sectional view showing essential parts of the semiconductor laser taken along lines a2—a2' and b2—b2' in FIG. 63.
Figure 67B:
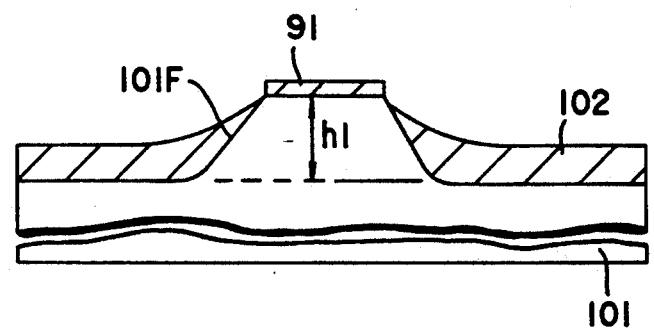

Then, the n-type GaAs buried layer 102 is grown to a thickness of 1 $\mu$m to obtain a structure shown in FIG. 63. FIG. 67 (A) shows a cross section along a line a2—a2' in FIG. 63, and FIG. 67 (B) shows a cross section along a line b2—b2' in FIG. 63.

As may be seen from FIG. 67, the n-type GaAs buried layer 102 is formed on the entire surface of the prism shaped part 101E of the p-type GaAs substrate 101 and acts as a current confinement part. A non-excited part is formed on this current confinement part. The n-type GaAs buried layer 102 formed on the prism shaped part 101E has a thickness of approximately 0.3 $\mu$m, and a height h$_1$ at the mesa part 101F is approximately the same as a height h$_2$ at the prism shaped part 101E.

Figure 68:
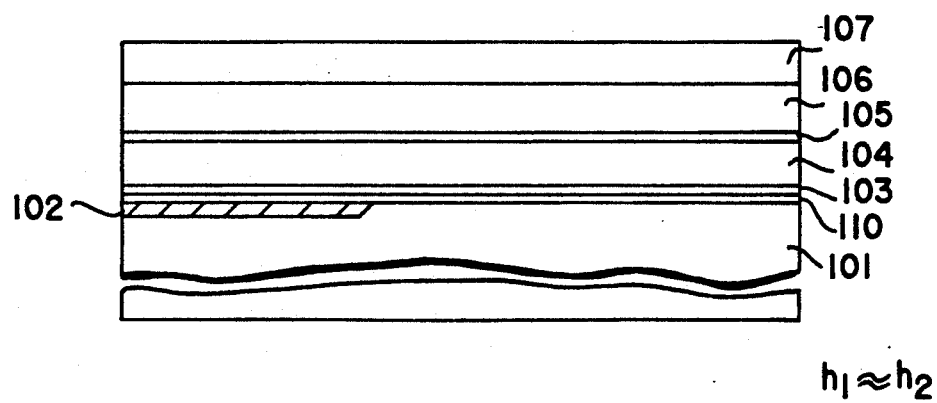
FIG. 68 is a cross sectional view showing an essential part of the semiconductor laser taken along a line a3—a3' in FIG. 65.
Figure 69:
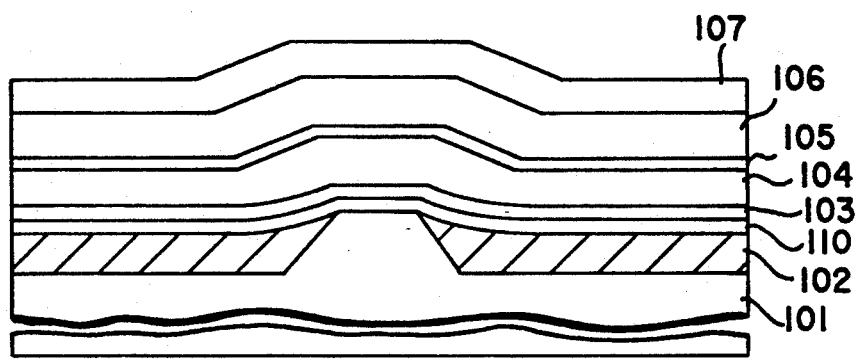
FIG. 69 is a cross sectional view showing an essential part of the semiconductor laser taken along a line b3—b3' in FIG. 65.

Next, the SiO$_2$ layer 91 is removed as shown in FIG. 64, and a double heterostructure similar to that shown in FIG. 58 is formed on the n-type GaAs buried layer 102 as shown in FIG. 65. FIG. 68 shows a cross section along a line a3—a3' in FIG. 65, and FIG. 69 shows a cross section along a line b3—b3' in FIG. 65. As may be seen from FIGS. 65 and 68, the InGaP active layer 105 is substantially flat, and a window structure is obtained because the part above the n-type GaAs buried layer 102 becomes the non-excited part. In addition, the InGaP active layer 105 which bends along the prism shaped part 101E makes it possible to realize a satisfactory laser beam emission characteristic.

According to this embodiment, a current non-injecting part is provided in the vicinity of the laser edge facet, and the band gap becomes small at the current injecting part due to the temperature rise and the like. Hence, the current non-injecting part essentially becomes the window structure, and the semiconductor laser can produce a large output without introducing a breakdown at the laser edge facet.

Figure 70:
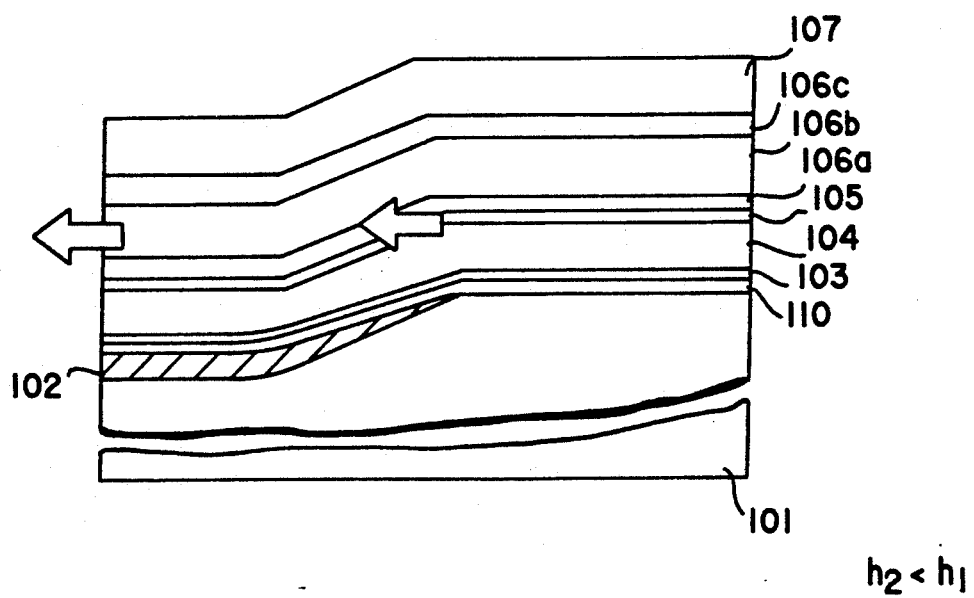
FIG. 70 is a cross sectional view showing an essential part of a modification of the eleventh embodiment of the semiconductor laser taken along the line a3—a3' in FIG. 65.

As a modification of the eleventh embodiment of the semiconductor laser, it is possible to make the height h$_2$ of the prism shaped part 101E lower than the height h$_1$ of the mesa part 101F. A cross section of this modification corresponding to FIG. 68 becomes as shown in FIG. 70. In FIG. 70, those parts which are the same as those corresponding parts in FIG. 68 are designated by the same reference numerals, and a description thereof will be omitted. In this modification, the InGaP active layer 105 bends in the vicinity of the laser edge facet.

According to this modification, a window structure is formed by the InGaP active layer 105 which bends in the vicinity of the laser edge facet. Hence, the semiconductor laser can produce a large output without introducing a breakdown at the laser edge facet. In FIG. 70, 106a, 106b and 106c denote n-type AlGaInP cladding layers.

In the eleventh embodiment of the semiconductor laser and the modification thereof, the n-type AlGaInP cladding layer 106 is made of $(Al_x Ga_{1-x})_{0.5}In_{0.5}P$, for example. In this case, it is possible to facilitate the propagation of the laser beam within the n-type AlGaInP cladding layer 106 by guiding the light within the layer of x=0.4, by using a sandwich structure having the layer of x=0.4 sandwiched between layers of x=0.7.

In each of the embodiments of the method according to the present invention, the eaves of the SiO$_2$ layer 91 is removed using the etchant which can etch the GaAs and SiO$_2$ at approximately the same etching rates. Accordingly, the shoulder part of the substrate mesa structure automatically matches the end edge of the SiO$_2$ layer 91 which is used as the mask, and it is possible to minimize the shape of the buried layer from being distorted by the eaves.

However, the coverage provided by the buried layer may be insufficient or excessive if the height of the substrate mesa structure and the thickness of the buried layer are not controlled accurately. If the coverage provided by the buried layer is insufficient and the (111)B face of the substrate mesa structure is exposed, it was experimentally confirmed that crystal defects occur when the AlGaInP system laser is formed on top of such a substrate mesa structure.

Figure 71A:
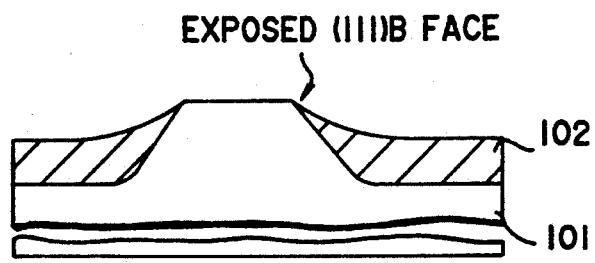
FIG. 71 is a cross sectional view showing essential parts of a semiconductor laser at various production stages of a fourth embodiment of the method of producing the semiconductor laser according to the present invention.
Figure 71B:
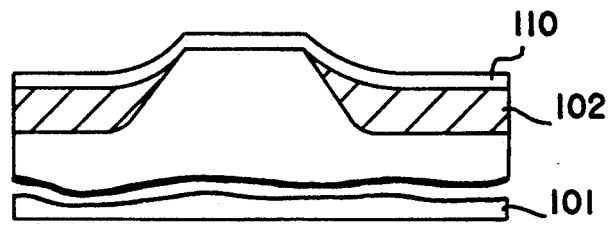

Accordingly, a description will now be given of a fourth embodiment of the method of producing the semiconductor laser according to the present invention, by referring to FIG. 71. This embodiment eliminates the problem caused by the insufficient coverage of the buried layer. In FIG. 71, those parts which are the same as those corresponding parts in FIG. 26 are designated by the same reference numerals for the sake of convenience, and a description thereof will be omitted.

FIG. 71 (A) corresponds to FIG. 31, and shows a state where the coverage of the substrate mesa structure by the n-type GaAs buried layer 102 is insufficient. In this embodiment, the p-type GaAs buffer layer 110 is formed on the structure shown in FIG. 71 (A), so that the exposed (111)B face of the substrate mesa structure is covered by the p-type GaAs buffer layer 110 as shown in FIG. 71 (B). Thereafter, the cladding layer and the like are formed as in the case of the previously described embodiments.

However, even in the case of the fourth embodiment of the method, it is still impossible to eliminate the problem caused by the excess coverage provided by the buried layer. Hence, a description will be given of a fifth embodiment of the method of producing the semiconductor laser according to the present invention, by referring to FIGS. 72 through 76. According to this embodiment, it is possible to eliminate the problems of both the insufficient coverage and the excessive coverage provided by the buried layer. In FIGS. 72 through 76, those parts which are the same as those corresponding parts in FIG. 36 are designated by the same reference numerals, and a description thereof will be omitted.

Figure 72:
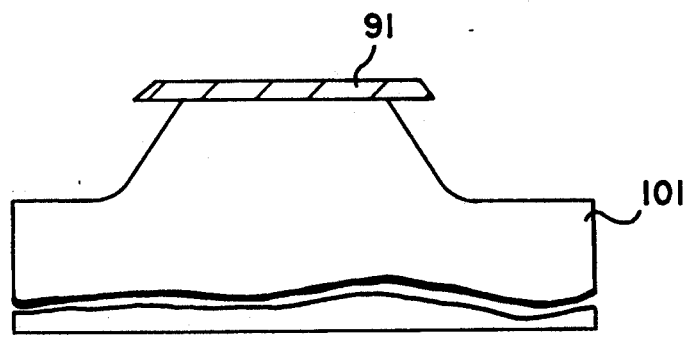
FIGS. 72 through 76 are cross sectional views showing an essential part of a semiconductor laser at various production stages for explaining a fifth embodiment of the method of producing the semiconductor laser according to the present invention.
Figure 73:
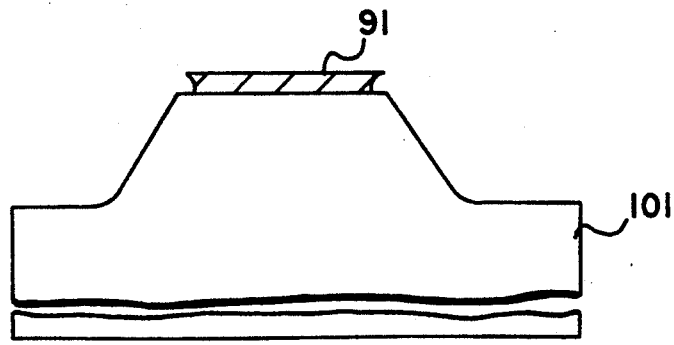

FIGS. 72 and 73 respectively correspond to FIGS. 27 and 28. FIG. 72 shows a state where the mesa etching of the p-type GaAs substrate 101 is made using the stripe $SiO_2$ layer 91 as the mask. FIG. 73 shows a state where the eaves of the $SiO_2$ layer 91 is removed by an etching using $HF+NH_4F$ as the etchant, for example.

Figure 74:
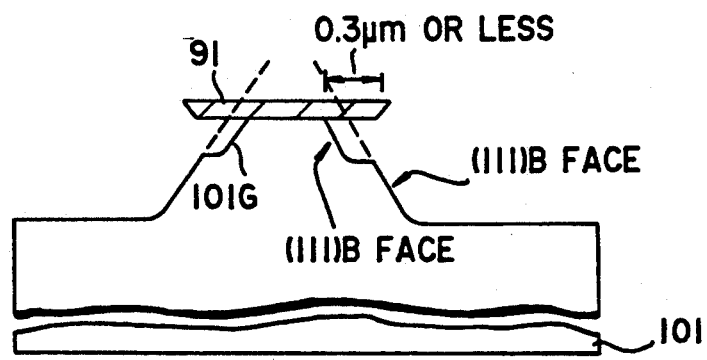

In this embodiment, the p-type GaAs substrate 101 shown in FIG. 73 is subjected to an additional etching so as to form a depression 101G. The additional etching is carried out using a mixed solution of $H_2SO_4 + H_2O_2 + H_2O$ which is heated to approximately 50° C. as the etchant, for example. As shown in FIG. 74, the depression 101G is made up of the (100) face which connects to the (111)B face on the outer side of the substrate mesa structure and the (111)B face on the inner side of the substrate mesa structure. Eaves of approximately 0.3 μm or less is formed by the $SiO_2$ layer 91 by this additional etching, and an imaginary line on the extension of the (111)B face on the outer side of the substrate mesa structure intersects the newly formed eaves.

Figure 75:
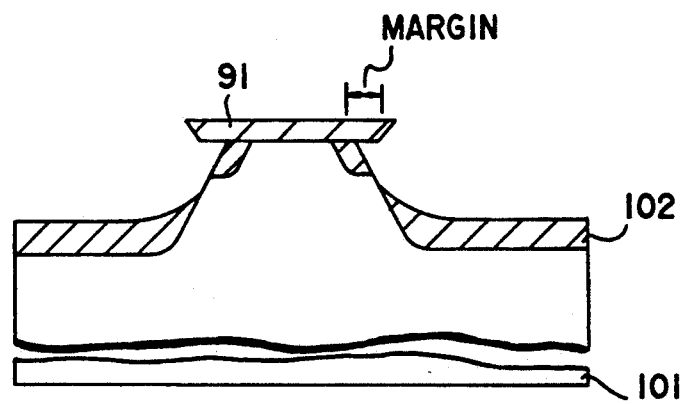
Figure 76:
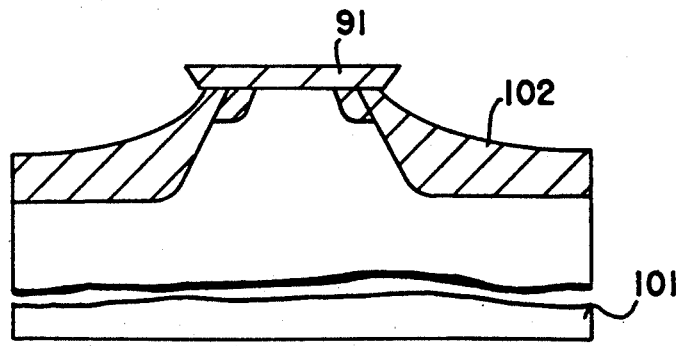

Next, the n-type GaAs buried layer 102 is formed on the substrate mesa structure, and FIG. 75 shows a state where the n-type GaAs buried layer 102 is formed halfway. As shown, the n-type GaAs does not grow on the (111)B face on the outer side of the substrate mesa structure nor on the (111)B face of the depression 101G on the inner side of the substrate mesa structure, but the n-type GaAs grows on the (100) face of the depression 101G. The n-type GaAs which grows on the (100) face of the depression 101G stops growing when the surface of the grown layer matches the (111)B face on the outer side of the substrate mesa structure, and for this reason, the shape of the substrate mesa structure is substantially unaffected by the provision of the depression 101G. As the growth of the n-type GaAs buried layer 102 progresses, the n-type GaAs crawls on the sloping surface of the substrate mesa structure and the structure shown in FIG. 76 is obtained. FIG. 76 corresponds to FIG. 30.

Therefore, according to the present invention, it is simply necessary to form the n-type GaAs buried layer 102 so as to prevent insufficient coverage thereby. The excess coverage by the n-type GaAs buried layer 102 is positively prevented by the newly formed eaves of the $SiO_2$ layer 91. As may be seen from FIG. 76, the growth of the n-type GaAs buried layer 102 stops at the bottom surface of the eaves of the $SiO_2$ layer 91, and thus, it is possible to obtain the desired conventional mesa while preventing the (111)B face from being exposed.

Figure 77:
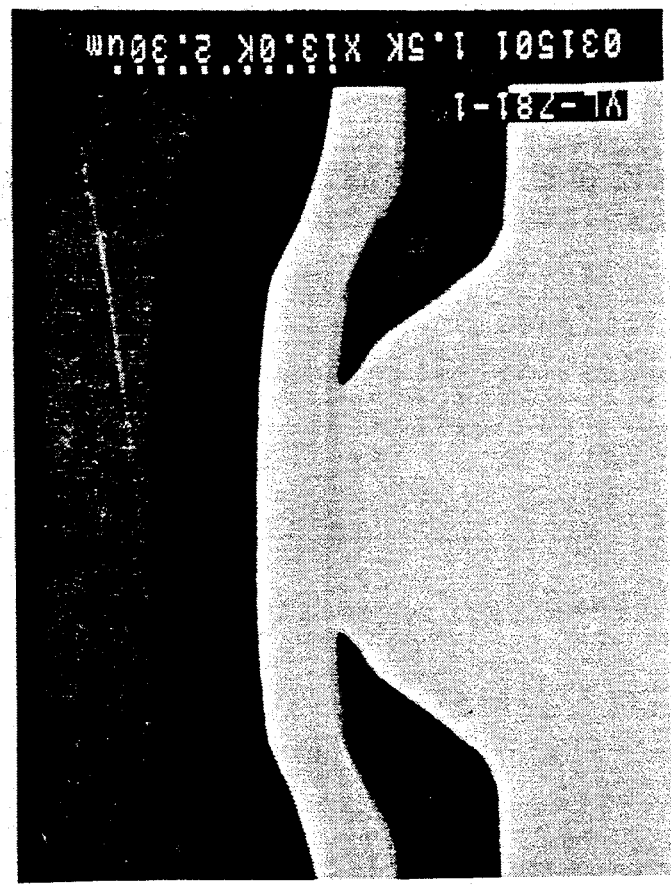
FIG. 77 is a photo which is taken by an electron microscope and corresponds to an essential part of the semiconductor laser which is produced by the fifth embodiment of the method.

Thereafter, the removal of the $SiO_2$ layer 91, the formation of the cladding layer and the like are made similarly as in the case of the previously described embodiments of the method. FIG. 77 shows a photograph of the semiconductor laser produced by this embodiment, taken by an electron microscope, and corresponding to the cross section of the semiconductor laser.

In this embodiment, the eaves of the $SiO_2$ layer 91 shown in FIG. 72 is once removed before newly forming the eaves as shown in FIG. 74 for the following reasons. That is, the eaves shown in FIG. 72 is approximately 1 to 2 μm and too large. If the eaves shown in FIG. 72 were to be reduced to approximately 0.3 μm or less when the mesa etching is carried out, the height and the like of the substrate mesa structure would become limited and the degree of freedom with which the semiconductor laser may be designed would become greatly restricted.

According to further experiments conducted by the present inventors, it was found that the shape of the double heterostructure changes depending on the growth conditions when the double heterostructure made of AlGaInP/GaInP system material is formed by the MOVPE on the trapezoidal mesa structure which is made up of the p-type GaAs substrate 101 and the n-type GaAs buried layer 102 as shown in FIG. 36. It was also found that among the growth conditions the growth temperature most affects the shape of the double heterostructure. Other growth conditions such as the III/V ratio (TMA, TMG, TMI etc./PH$_3$) and the growth rate did not affect the shape of the double heterostructure as much as the growth temperature, as long as these other conditions were within a certain range such that a satisfactory surface morphology is guaranteed.

Figure 78A:
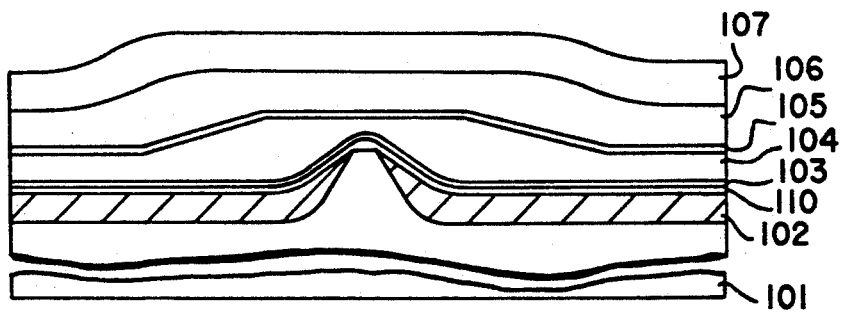
FIG. 78 is a cross sectional view for explaining double heterostructures which are formed at growth temperatures of 690° C. and 730° C.
Figure 78B:
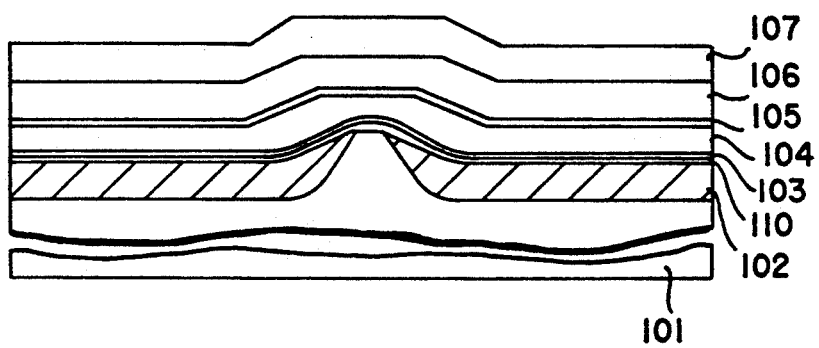

FIG. 78 (A) shows a double heterostructure which is produced at a growth temperature of 690° C., and FIG. 78 (B) shows a double heterostructure which is produced at a growth temperature of 730° C. In FIG. 78, those parts which are the same as those corresponding parts in FIG. 36 are designated by the same reference numerals, and a description thereof will be omitted. As may be seen by comparing FIG. 78 (A) and (B), the stripe width of the InGaP active layer 105 is considerably wide compared to the width of the trapezoidal mesa structure when the growth temperature is 690° C., but the stripe width is not as wide when the growth temperature is 730° C.

As shown in FIG. 78 (A), substantially all of the InGaP active layer 105 is formed on the trapezoidal mesa structure via the p-type AlGaInP cladding layer 104 which is thicker than the n-type AlGaInP cladding layer 106 when the growth temperature is 690° C. But the thermal conductivity of the AlGaInP system material is small because it is a 4-element mixed crystal. For this reason, when substantially all of the InGaP active layer 105 makes contact with the p-type AlGaInP cladding layer 104 which is thicker than the n-type AlGaInP cladding layer 106, it is impossible to efficiently release the heat generated from the InGaP active layer 105 to the GaAs trapezoidal mesa part, and the output saturation of the semiconductor laser occurs due to the heat when the semiconductor laser is operated to produce a large output.

Next, a description will be given of a sixth embodiment of the method of producing the semiconductor laser according to the present invention, by referring to FIGS. 79 through 85. According to this embodiment, the above described problem caused by the effects of heat is eliminated. In FIGS. 79 through 85, those parts which are the same as those corresponding parts in FIG. 36 are designated by the same reference numerals, and a description thereof will be omitted.

Figure 79:
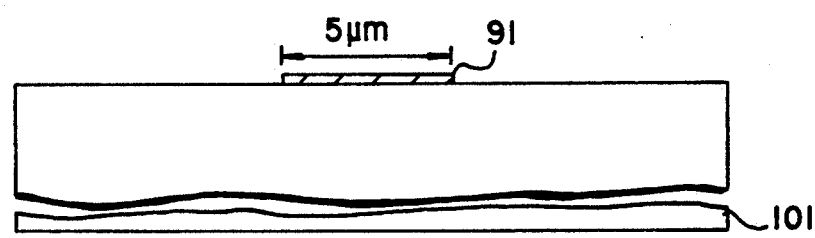
FIGS. 79 through 85 are cross sectional views showing an essential part of a semiconductor laser at various production stages for explaining a sixth embodiment of the method of producing the semiconductor laser according to the present invention.

In FIG. 79, the $SiO_2$ layer 91 having a thickness of 2000 Å, for example, is formed on the p-type GaAs substrate 101. The main surface of the p-type GaAs substrate 101 is the (100) face, and the impurity concentration of the p-type GaAs substrate 101 is $1 \times 10^{19}$ $cm^{-3}$.

Then, a resist process of a photolithography technique and a wet etching using $HF/NH_4F$ as the etchant are used to pattern the $SiO_2$ layer 91. As a result, a stripe of the $SiO_2$ layer 91 is formed. This stripe $SiO_2$ layer 91 extends in the <110> direction of the p-type GaAs substrate 101 and has a width of 5 μm.

Figure 80:
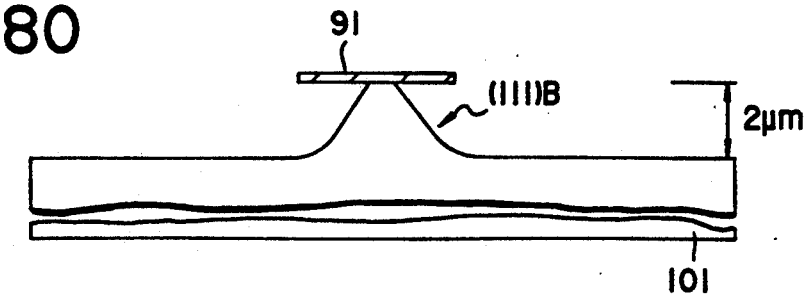

In FIG. 80, a wet etching is made using a $H_2SO_4 + H_2O_2 + H_2O$ etchant which is heated to approximately 50° C., so as to carry out a mesa etching of the p-type GaAs substrate 101 using the stripe $SiO_2$ layer 91 as a mask. Hence, a mesa having a height of approximately 2 μm and a width of approximately 1.8 μm at the top of the mesa is formed, where the width is taken along the <1$\bar{1}$0> direction. The (111)B face appears at the sloping surface of the mesa.

Figure 81:
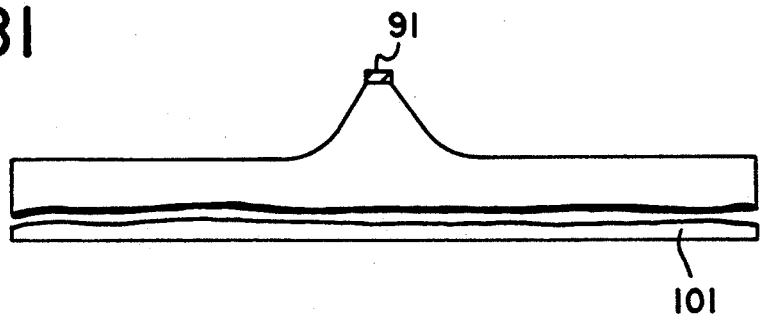

In FIG. 81, a wet etching is made using a $H_2SO_4 + H_2O_2 + NH_4OH + NH_4F + H_2O$ etchant so as to remove the eaves of approximately 2 μm of the $SiO_2$ layer 91. The etchant used in this case has approximately the same etching rates for the $SiO_2$ and GaAs, and the eaves is removed by etching approximately half the thickness of the $SiO_2$ layer 91.

Figure 82:
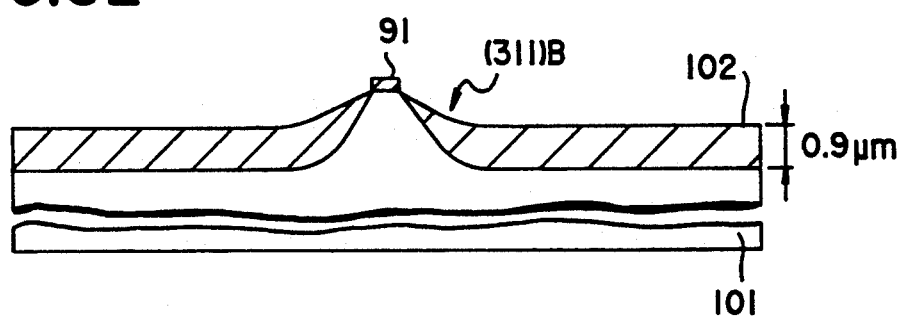

In FIG. 82, the remaining $SiO_2$ layer is used as a mask and an MOVPE is used to grow the n-type GaAs buried layer 102 to a thickness of 0.9, μm for example. The impurity of the n-type GaAs buried layer 102 is Si, and the impurity concentration is $3 \times 10^{18}$ $cm^{-3}$, for example. Hence, a trapezoidal mesa having the (311)B face as its sloping surface is formed.

Figure 83:
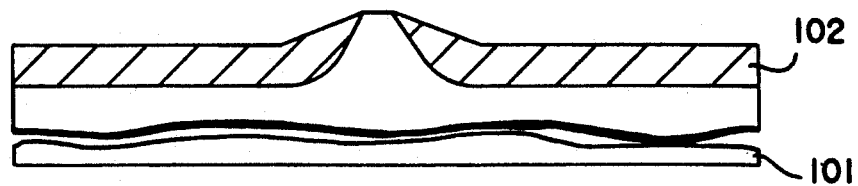

Then, the structure shown in FIG. 82 is submerged into a HF etchant to remove the $SiO_2$ layer as shown in FIG. 83.

Figure 84:
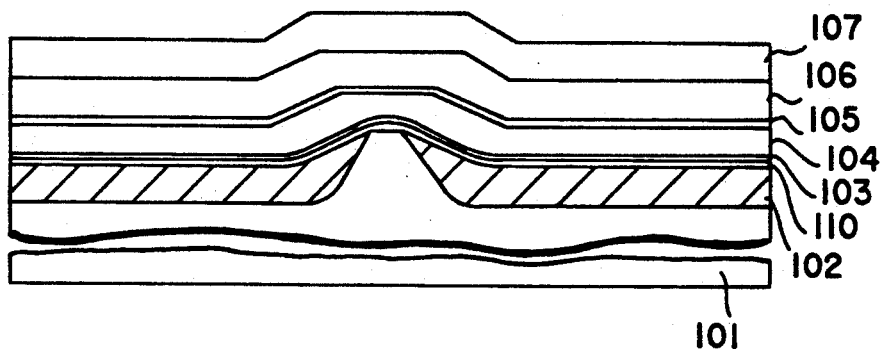
Figure 85:
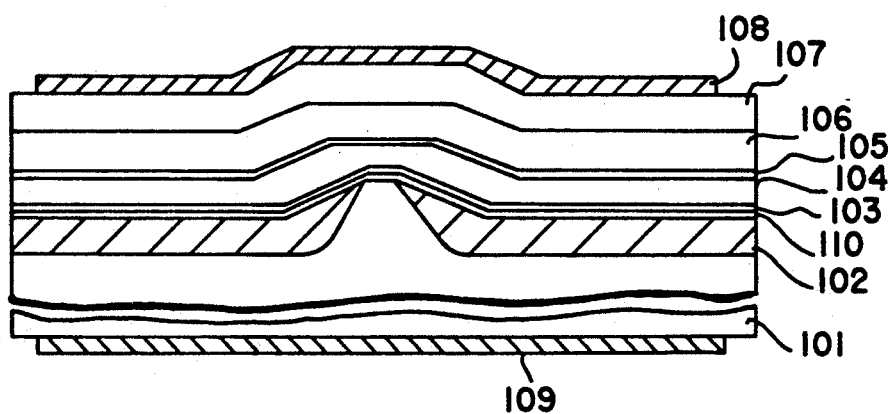

In FIG. 84, the p-type GaAs buffer layer 110, the p-type InGaP buffer layer 103, the p-type AlGaInP cladding layer 104, the InGaP active layer 105, the n-type AlGaInP cladding layer 106 and the n-type GaAs contact layer 107 are successively formed by an MOVPE at a growth temperature of 710° to 800° C. As a result, a semiconductor laser in which the InGaP active layer 105 has a width of approximately 2.4 μm in the <1$\bar{1}$0> direction is formed.

In this embodiment, the thickness and the like of each semiconductor layer are as follows.

Buffer layer 110
  Thickness: 300 Å
  Impurity: Zn
  Impurity concentration: $1 \times 10^{18}$ $cm^{-3}$
Buffer layer 103
  Thickness: 0.1 μm
  Impurity: Zn
  Impurity concentration: $1 \times 10^{18}$ $cm^{-3}$
Cladding layer 104
  Thickness: 1 μm
  Impurity: Zn
  Impurity concentration: $3 \times 10^{17}$ $cm^{-3}$
Active layer 105
  Thickness: 0.07 μm
Cladding layer 106
  Thickness: 1 μm
  Impurity: Si
  Impurity concentration: $3 \times 10^{17}$ $cm^{-3}$
Contact layer 107
  Thickness: 1 μm
  Impurity: Si
  Impurity concentration: $3 \times 10^{17}$ $cm^{-3}$ In FIG. 85, the p side electrode 109 is formed by successively stacking Au/Zn/Au by vacuum deposition. Similarly, the n side electrode 108 is formed by successively stacking Au/AuGe by vacuum deposition. Thereafter, the electrodes 109 and 108 are alloyed at 430° C., and the semiconductor laser is completed by forming a cavity length of 300 μm, for example. The semiconductor laser which is completed is basically the same as the semiconductor laser shown in FIG. 36.

When the growth temperature becomes high, it becomes difficult to reduce the resistance of the p-type layer in the case of the AlGaInP/GaInP system material. Hence, it is necessary to inject the p-type impurities with a high dosage, but in this case, the change in the junction position due to the diffusion of the p-type impurities during the growth process no longer becomes negligible. Accordingly, the growth temperature is desirably in the range of 710° to 750° C.

In the embodiments described heretofore, the substrate is made of GaAs and the AlGaInP system double heterostructure is formed thereon. However, it is of course possible to use a substrate made of InP, for example, when applying the present invention, and a semiconductor laser which has similar advantageous effects is obtainable in this case. For example, when a p-type InP substrate 101 is used in the embodiment shown in FIG. 35, it is possible to use a p-type InP cladding layer 104, an InGaAsP active layer 105, an n-type InP cladding layer 106, an n-type InGaAsP contact layer 107, a AuGe/Au n side electrode 108 and a Au/Zn/Au p side electrode 109. In addition, it is possible to use n-type InGaAs or AlInAs for the buried layer 102. In this case, the cladding layer 104 is made of a 2-element compound semiconductor, and it is unnecessary to provide a buffer layer 103 because of the wider range of growth conditions for obtaining the satisfactory growth morphology.

In addition, when the p-type InP substrate 101 is used in the embodiment shown in FIG. 35, it is possible to use a p-type InP buffer layer 103, a p-type InAlAs cladding layer 104, an InGaAs active layer 105, an n-type AlInAs cladding layer 106, an n-type InGaAs contact layer 107, a AuGe/Au n side electrode 108 and a Au/Zn/Au p side electrode 109. In this case, n-type InGaAs or AlInAs may be used for the buried layer 102.

Furthermore, when providing the guide layer 117 as in the case of the embodiment shown in FIG. 37, it is possible to form on a p-type InP substrate 111 an n-type InGaAs buried layer 112, a p-type InP cladding layer 115, a InGaAsP active layer 116, an n-type InGaAsP guide layer 117, an n-type InP cladding layer 118 and an n-type InGaAsP contact layer 119. AuGe/Au and Au/Zn/Au can respectively be used for the electrodes 120 and 121. In addition, buffer layers 113 and 114 are unnecessary in this case.

Next, a description will be given of the operating principle of a seventh embodiment of the method of producing the semiconductor laser according to the present invention, by referring to FIGS. 86 through 88.

Figure 86:
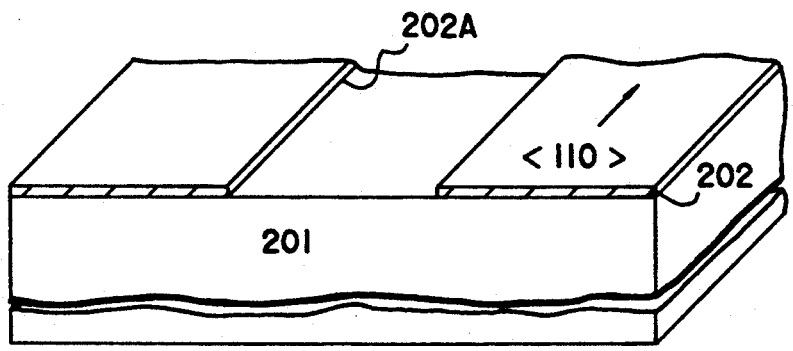
FIG. 86 is a perspective view showing an essential part of a semiconductor laser at a production stage for explaining the principle of a seventh embodiment of the method of producing the semiconductor laser according to the present invention.

In FIG. 86, an insulator layer 202 made of $SiO_2$, for example, is formed on a GaAs substrate 201. The insulator layer 202 is etched to form a stripe opening 202A in the <110> direction of the GaAs substrate 201.

Figure 87:
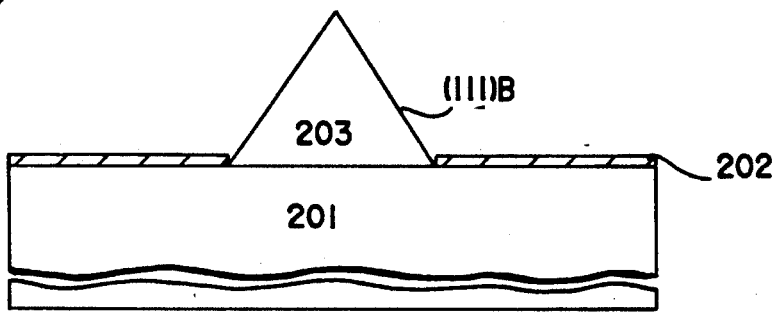
FIGS. 87 and 88 are cross sectional views showing an essential part of the semiconductor laser at various production stages for explaining principle of the seventh embodiment of the method of producing the semiconductor laser according to the present invention.

In FIG. 87, a GaAs layer 203 is formed on the GaAs substrate 201 which is exposed within the stripe opening 202A by using a low pressure MOVPE. This GaAs layer 203 has a trapezoidal cross section in an initial stage of the growth process, but eventually assumes a triangular cross section as shown as the growth process progresses, and the sloping surface of the triangular cross section is the (111)B face.

Figure 88:
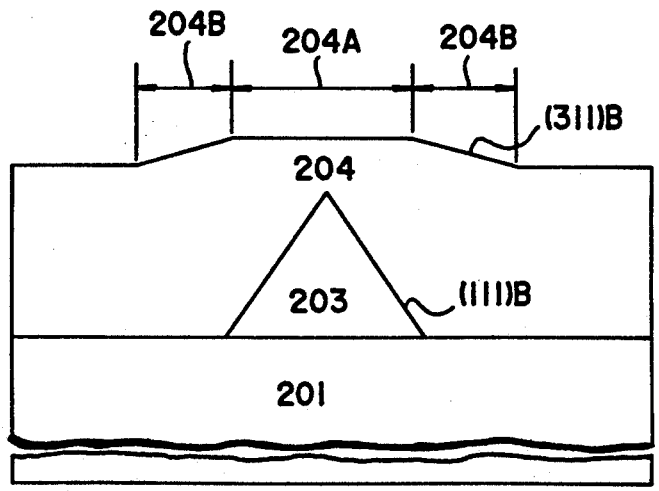

In FIG. 88, the insulator layer 202 which is used as the mask for the selective growth process is removed. Thereafter, a desired semiconductor layer such as a GaAs, AlGaAs, GaInP or AlGaInP layer is grown, and this semiconductor layer is denoted by a reference numeral 204 in FIG. 88. A bent part 204B is generated on both sides of a stripe part 204A which corresponds to a waveguide. Accordingly, when an active layer, a cladding layer and the like are grown on top of this semiconductor layer 204, the refractive index clearly changes when viewed in the lateral direction from the stripe part 204A. The sloping surface at the bent part 204B is the (311)B face.

Next, a description will be given of the seventh embodiment of the method of producing the semiconductor laser according to the present invention, by referring to FIGS. 89 through 92.

Figure 89:
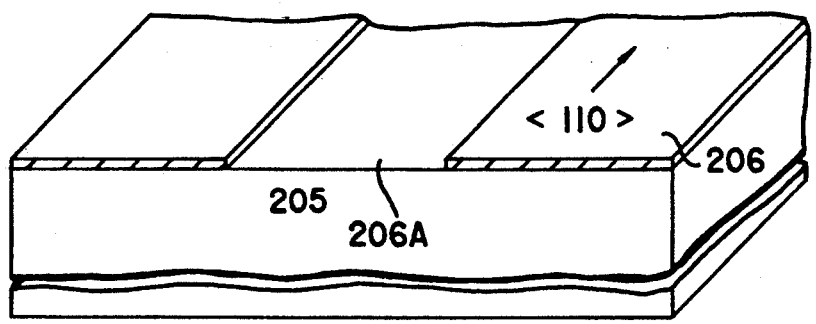
FIG. 89 is a perspective view showing an essential part of the semiconductor laser at a production stage for explaining the seventh embodiment of the method of producing the semiconductor laser according to the present invention.

In FIG. 89, a chemical vapor deposition (CVD) is used to form a SiO$_2$ insulator layer 206 having a thickness of approximately 2000 Å, for example, on an n-type GaAs substrate 205. The insulator layer 206 may of course be made of a material other than SiO$_2$, such as SiN.

A resist process of a photolithography technique and a reactive ion etching (RIE) using CF$_4$ 214) or CHF$_3$ etching gas are used to etch the insulator layer 206 and form a stripe opening 206A which extends in the <110> direction of the n-type GaAs substrate 205 and has a width of 2 μm, for example.

Figure 90:
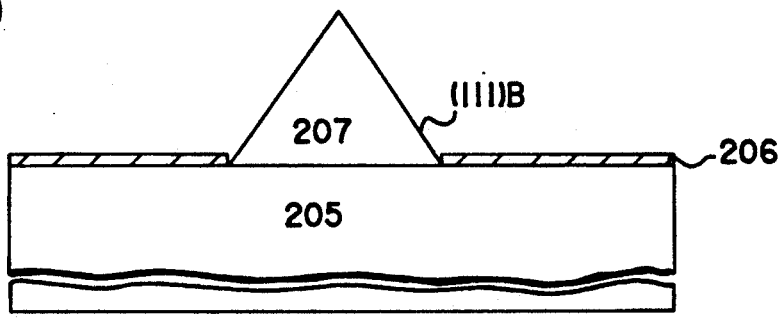
FIGS. 90 through 92 are cross sectional views showing an essential part of the semiconductor laser at various production stages for explaining the seventh embodiment of the method of producing the semiconductor laser according to the present invention.

In FIG. 90, a low pressure MOVPE is used to grow an n-type GaAs layer 207 on the n-type GaAs substrate 205 which is exposed within the stripe opening 206A. When the stripe opening 206A has the width of 2 μm, the cross section of the grown n-type GaAs layer 207 becomes triangular as shown when the growth temperature is 690° C. and the growth time is 15 minutes. The sloping surface of the n-type GaAs layer 207 is the (111)B face, and the maximum thickness (height) of the n-type GaAs layer 207 is 1.38 μm.

Figure 91:
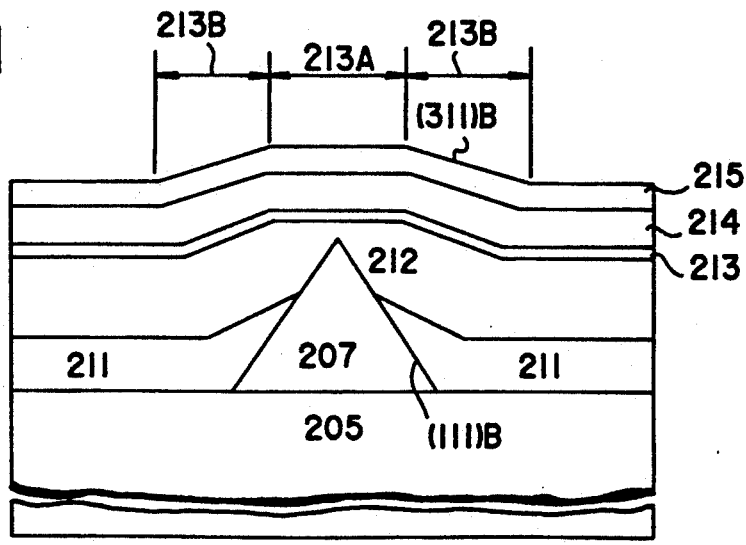
Figure 92:
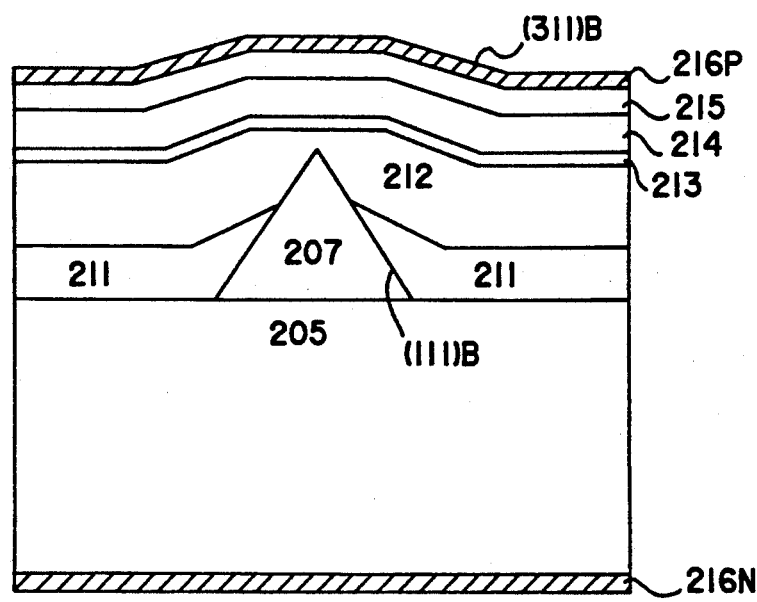

The structure shown in FIG. 90 is submerged into a hydrofluoric acid system etchant so as to remove the insulator layer 206 which is used as the mask during the selective growth process. Then, a low pressure MOVPE is used to successively form a blocking layer 211, a cladding layer 212, an active layer 213, a cladding layer 214 and an electrode contact layer 215 as shown in FIG. 91. As a result, a bent part 213B is formed on both sides of a stripe part 213A, and the index of diffraction changes when viewed laterally from the active layer 213 or the stripe part 213A in the vicinity thereof. This change in the index of diffraction may be utilized to trap the light. The sloping surface of the bent part 213B is the (311)B face.

In this embodiment, the thickness and the like of each semiconductor layer are as follows.
Blocking layer 211
  Material: p-type GaAs
  Impurity concentration: $1 \times 10^{18}$ cm$^{-3}$
  Thickness: 0.5 μm
Cladding layer 212
  Material n-type AlGaInP
  Impurity concentration: $7 \times 10^{17}$ cm$^{-3}$
  Thickness: 1 μm
Active layer 213
  Material: Non-doped InGaP
  Thickness: 0.07 μm
Cladding layer 214
  Material: p-type AlGaInP
  Impurity concentration: $3 \times 10^{17}$ cm$^{-3}$
  Thickness: 1 μm
Electrode contact layer 215
  Material: p-type GaAs
  Impurity concentration: $1 \times 10^{19}$ cm$^{-3}$
  Thickness: 0.5 μm In FIG. 92, a vacuum deposition is used, for example, to form a p side electrode 216P of Ti/Pt/Au and an n side electrode 216N of AuGe/Au, and the semiconductor laser is completed.

Next, a description will be given of an eighth embodiment of the method of producing the semiconductor laser according to the present invention, by referring to FIGS. 93 through 101. In FIGS. 93 through 101, those parts which are the same as those corresponding parts in FIGS. 89 through 92 are designated by the same reference numerals, and a description thereof will be omitted.

Figure 93:
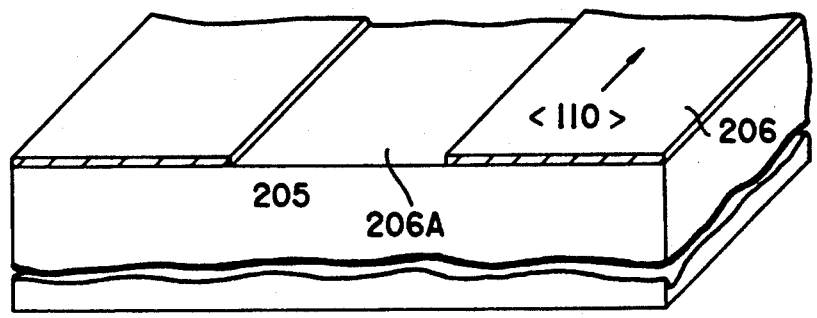
FIG. 93 is a perspective view showing an essential part of a semiconductor laser at a production stage for explaining an eighth embodiment of the method of producing the semiconductor laser according to the present invention.

In FIG. 93, a CVD is used to form the SiO$_2$ insulator layer 206 having a thickness of 2000 Å, for example, on the n-type GaAs substrate 205. Then, a resist process of a photolithography technique and a RIE using CF$_4$ or CHF$_3$ etching gas are used to etch the insulator layer 206 to form the stripe opening 206A. This stripe opening 206A extends in the <110> direction of the n-type GaAs substrate 205 and has a width of 3 μm, for example.

Figure 94:
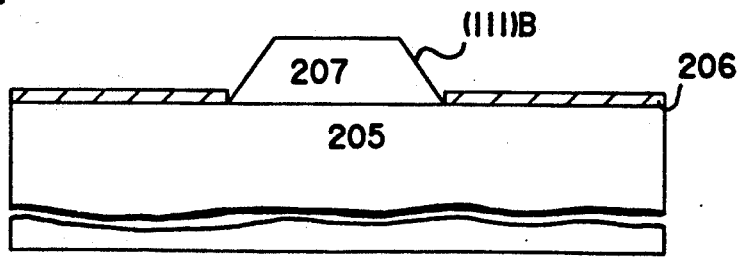
FIGS. 94 through 101 are cross sectional views showing an essential part of the semiconductor laser at various production stages for explaining the eighth embodiment of the method of producing the semiconductor laser according to the present invention.

In FIG. 94, a low pressure MOVPE is used to grow the n-type GaAs layer 207 on the n-type GaAs substrate 205 which is exposed within the stripe opening 206A. When the stripe opening 206A has the width of 3 μm, the cross section of the grown n-type GaAs layer 207 becomes trapezoidal as shown when the growth temperature is 690° C. and the growth time is 15 minutes. The sloping surface of the n-type GaAs layer 207 is the (111)B face, and the maximum thickness (height) of the n-type GaAs layer 207 is 1.5 μm.

Figure 95:
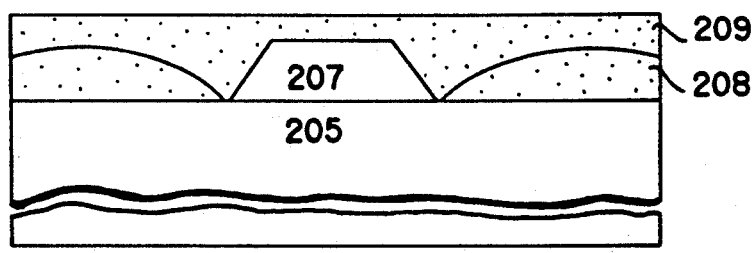

The structure shown in FIG. 94 is submerged into a hydrofluoric acid system etchant so as to remove the insulator layer 206 which is used as the mask during the selective growth process, as shown in FIG. 95. Then, a resist process of a photolithography technique is used to form a photoresist layer 208 having an opening with the same width as the stripe of the n-type GaAs layer 207. Thereafter, a spin-coating process is used to further form a photoresist layer 209 so as to smoothen the surface.

Figure 96:
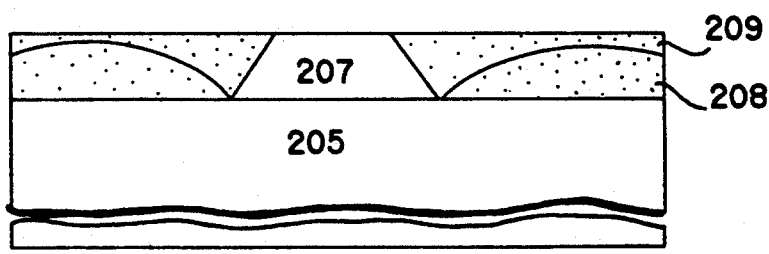

In FIG. 96, an ashing process using oxygen plasma is used to subject the photoresist layer 209 to an ashing and expose the top surface of the n-type GaAs layer 207.

Figure 97:
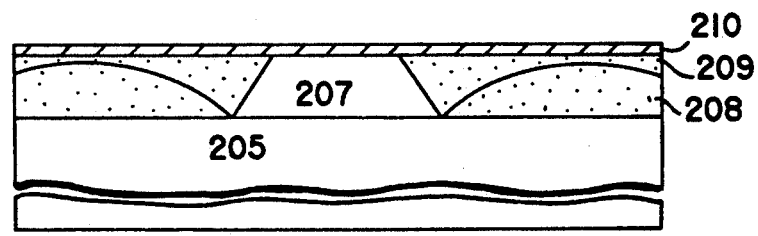

In FIG. 97, a CVD is used to form an insulator layer 210 made of SiO$_2$ to a thickness of 2000 Å, for example.

Figure 98:
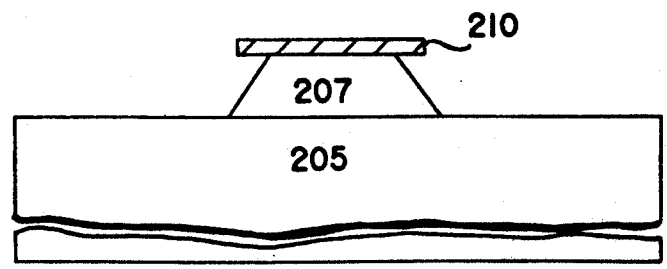

In FIG. 98, a resist process of a photolithography technique and a RIE using CF$_4$ or CHF$_3$ etching gas are used to pattern the insulator layer 210. Hence, only the part of the insulator layer 210 covering the n-type GaAs layer 207 remains and the other parts of the insulator layer 210 are removed by the patterning. In addition, an ashing process using oxygen plasma is used to remove the photoresist layers 209 and 208, so as to expose the side surfaces of the n-type GaAs substrate 205 and the n-type GaAs layer 207.

Figure 99:
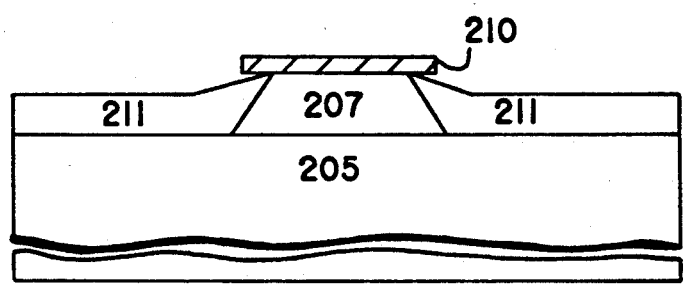
Figure 100:
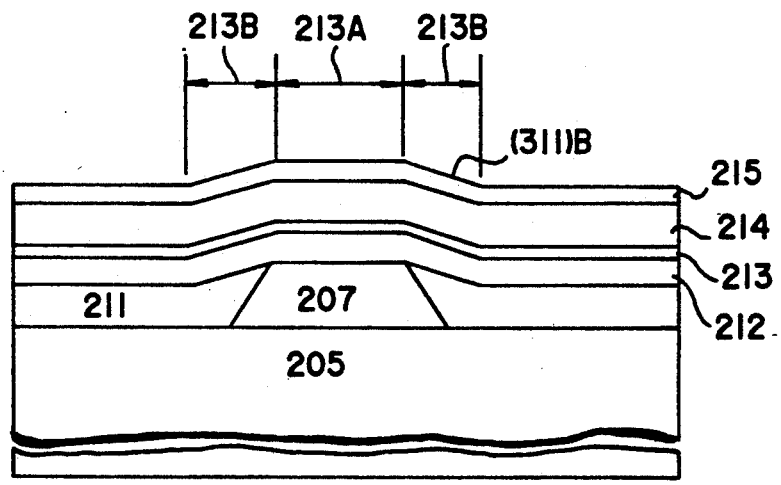

In FIG. 99, a low pressure MOVPE is used to successively form the blocking layer 211. As shown, the blocking layer 211 enters below the insulator layer 210 in the vicinity of the side surface of the n-type GaAs layer 207. The thickness and the like of the blocking layer 211 are as follows.

Blocking layer
  Material: p-type GaAs
  Impurity concentration: $1 \times 10^{18}$ cm$^{-3}$
  Thickness: 0.5 μm In FIG. 100, the structure shown in FIG. 99 is submerged into a hydrofluoric acid etchant to remove the insulator layer 210 which is used as a mask when forming the blocking layer 211. In addition, a low pressure MOVPE is used to successively form the cladding layer 212, the active layer 213, the cladding layer 214 and the electrode contact layer 215. As a result, the bent part 213B is formed on both sides of the stripe part 213A, and the index of diffraction changes when viewed laterally from the active layer 213 or the stripe part 213A in the vicinity thereof. This change in the index of diffraction may be utilized to trap the light. The sloping surface of the bent part 213B is the (311)B face.

The thickness and the like of each layer grown on the blocking layer 211 are as follows.

Cladding layer 212
  Material: n-type AlGaInP
  Impurity concentration: $7 \times 10^{17}$ cm$^{-3}$
  Thickness: 1 μm
Active layer 213
  Material: Non-doped InGaP
  Thickness: 0.07 μm
Cladding layer 214
  Material: p-type AlGaInP
  Impurity concentration: $3 \times 10^{17}$ cm$^{-3}$
  Thickness: 1 μm
Electrode contact layer 215
  Material: p-type GaAs
  Impurity concentration: $1 \times 10^{19}$ cm$^{-3}$
  Thickness: 0.5 μm In FIG. 101, a vacuum deposition is used, for example, to form the p side electrode 216P of Ti/Pt/Au and the n side electrode 261N of AuGe/Au, and the semiconductor laser is completed.

According to this embodiment, the cross sectional shape of the n-type GaAs layer 207 is trapezoidal. For this reason, it is possible to make the thickness of the cladding layer 212 which is formed above the n-type GaAs layer 207 extremely thin, and thus reduce the thermal resistance.

In the sixth and seventh embodiments of the method according to the present invention, the n-type GaAs is used as the substrate material. However, it is of course possible to use a p-type GaAs as the substrate material. In this case, the conductor types of each semiconductor layer must be reversed from p-type to n-type or vice versa.

Figure 102:
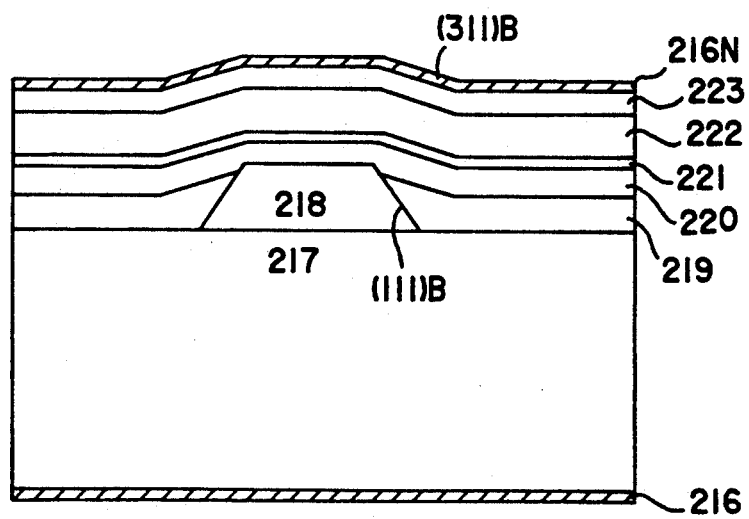
FIG. 102 is a cross sectional view showing an essential part of a semiconductor laser which is produced by a ninth embodiment of the method of producing the semiconductor laser according to the present invention.

FIG. 102 shows a semiconductor laser which is produced by a ninth embodiment of the method of producing the semiconductor laser according to the present invention. In FIG. 102, those parts which are the same as those corresponding parts in FIGS. 89 through 92 are designated by the same reference numerals, and a description thereof will be omitted.

In FIG. 102, the semiconductor laser includes a p-type GaAs substrate 217, a p-type GaAs layer 218, an n-type GaAs blocking layer 219, a p-type AlGaInP cladding layer 220, a non-doped InGaP active layer 221, an n-type AlGaInP cladding layer 222 and an n-type GaAs electrode contact layer 223.

Figure 101:
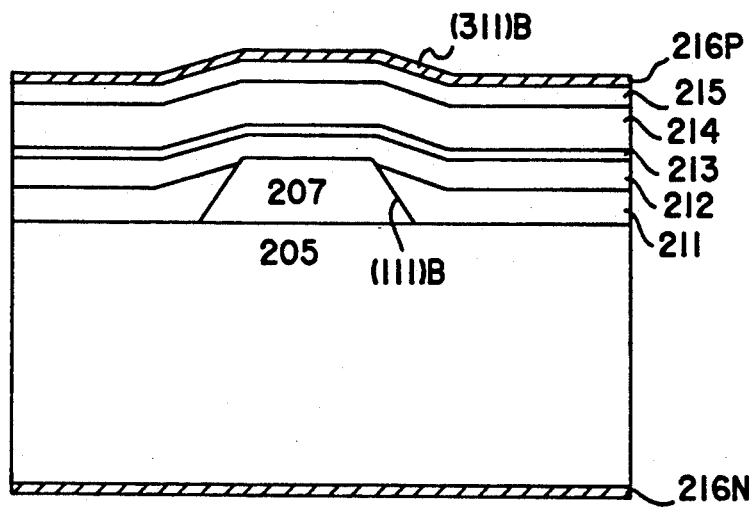

The semiconductor laser shown in FIG. 102 differs from the semiconductor laser shown in FIG. 101, for example, only in that the p-type GaAs substrate material is used for the substrate 217 and the semiconductor layers formed thereof have the opposite conductor types when compared to the semiconductor laser shown in FIG. 101. Hence, the semiconductor laser shown in FIG. 102 can be produced by processes similar to those described with reference to FIGS. 91 through 101.

According to the sixth through eighth embodiments of the method of the present invention, the stripe projection part which becomes the base for forming the stripe part which acts as the waveguide and the bent parts which trap the light is not formed by an etching. Instead, the stripe projection part is grown on a substrate having a satisfactory crystal orientation. Hence, the semiconductor layers formed on such a substrate will not include crystal defects, and it becomes possible to realize a semiconductor laser having a high performance free of abberation loss or the like.

Further, the present invention is not limited to these embodiments, but various variations and modifications may be made without departing from the scope of the present invention.

What is claimed is:
1. A method of producing a semiconductor laser comprising the steps of:
  (a) patterning a dielectric layer which is formed on a (100) face of a substrate into a stripe;
  (b) forming a stripe of a first mesa by making a mesa etching of the substrate using the stripe of the dielectric layer as a mask, said stripe of the first mesa including a (111)B face as its sloping surface;
  (c) removing eaves of the dielectric layer which is used as the mask in said step (b) by an etching;
  (d) forming a buried layer by a metal organic vapor phase epitaxy (MOVPE) using the remaining dielectric layer as a mask so that the buried layer is formed on said substrate excluding a top surface of the stripe of the first mesa and the (111)B face of the stripe of the first mesa is covered a sloping surface part of said buried layer, said top surface of the stripe of the first mesa being the (100) face of the substrate and forming a stripe of a second mesa together with the sloping surface of said buried layer, said stripe of the second mesa having a smaller inclination than said stripe of the first mesa;
  (e) removing the dielectric layer by an etching; and
  (f) forming a double heterostructure made up of a plurality of semiconductor layers on the stripe of the second mesa by a metal organic vapor phase epitaxy (MOVPE), said double heterostructure including an active layer and first and second cladding layers which sandwich the active layer, and is provided along the (100) face of the first mesa and along the sloping surface of the second mesa.

2. The method of producing the semiconductor laser as claimed in claim 1, wherein said step (c) uses am etchant which etches both the dielectric layer and the substrate.

3. The method of producing the semiconductor laser as claimed in claim 2, wherein said etchant has approximately the same etching rate with respect to the dielectric layer and the substrate.

4. The method of producing the semiconductor laser as claimed in claim 1, which further comprises the step (g) of forming a buffer layer between the stripe of the second mesa and the double heterostructure.

5. The method of producing the semiconductor laser as claimed in claim 1, wherein said step (a) patterns the dielectric layer so that a width along the $<1\bar{1}0>$ direction is tapered and decreases towards an edge surface of the semiconductor laser.

6. The method of producing the semiconductor laser as claimed in claim 5, wherein said step (c) removes the eaves so that the width of the stripe of the dielectric layer along the $<1\bar{1}0>$ direction becomes zero in a vicinity of the edge surface of the semiconductor laser.

7. The method of producing the semiconductor laser as claimed in claim 1, wherein said step (f) forms each of the semiconductor layers at a growth temperature in the range of 710° to 800° C.

8. The method of producing the semiconductor laser as claimed in claim 1, which further comprises the step (g) of removing a part of the stripe of the first mesa by an additional etching prior to said step (c) so that eaves of a predetermined length is formed by the dielectric layer.

9. The method of producing the semiconductor laser as claimed in claim 8, wherein said step (d) forms the buried layer so that the buried layer completely covers the (111)B face at the sloping surface of of the stripe of the first mesa.

10. The method of producing the semiconductor laser as claimed in claim 1, wherein the substrate is made of GaAs, and the buried layer is made of a material selected from a group consisting of GaAs and AlGaAs.

11. The method of producing the semiconductor laser as claimed in claim 10, wherein the buried layer is of a conductor type opposite to that of the substrate or has a resistance which is high compared to that of the substrate.

12. The method of producing the semiconductor laser as claimed in claim 10, wherein said active layer is made of a material selected from a group consisting of InGaP and AlGaInP, and said first and second cladding layers are made of a material selected from a group consisting of AlGaInP and AlInP of mutually opposite conductor types and having an energy band gap greater than that of the active layer.

13. The method of producing the semiconductor laser as claimed in claim 12, wherein said step (f) forms the first and second cladding layers at a growth temperature in a range of 710° to 800° C.

14. The method of producing the semiconductor laser as claimed in claim 1, wherein the substrate is made of GaAs, and said step (a) forms the dielectric layer on the (100) face of the substrate by a sputtering.

15. The method of producing the semiconductor laser as claimed in claim 1, wherein the substrate is made of GaAs, and said step (b) forms the stripe of the first mesa using as an etchant a mixed solution of $H_2SO_4$, $H_2O_2$ and $H_2O$, said etchant in use being heated to approximately 50° C.

16. The method of producing the semiconductor laser as claimed in claim 1, wherein the substrate is made of InP, and the buried layer is made of a material selected from a group consisting of InGaAs and AlInAs.

17. The method of producing the semiconductor laser as claimed in claim 16, wherein the buried layer is of a conductor type opposite to that of the substrate.

18. The method of producing the semiconductor laser as claimed in claim 16, wherein the double heterostructure includes an active layer and first and second cladding layers which sandwich the active layer, said active layer is made of a material selected from a group consisting of InGaAs and AlGaAsP, and said first and second cladding layers are made of a material selected from a group consisting of InGaAsP, InP and AlInAs of mutually opposite conductor types and having an energy band gap greater than that of the active layer.

19. A method of producing a semiconductor laser comprising the steps of:
(a) patterning a dielectric layer which is formed on a main surface of a substrate into a stripe;
(b) forming a stripe of a first mesa by making a mesa etching of the substrate using the stripe of the dielectric layer as a mask, said stripe of the first mesa having a top surface and a sloping surface;
(c) removing eaves of the dielectric layer which is used as the mask in said step (b) by an etching;
(d) forming a buried layer by a metal organic vapor phase epitaxy (MOVPE) using the remaining dielectric layer as a mask so that the buried layer is formed on said substrate excluding the top surface of the stripe of the first mesa and the sloping surface of the stripe of the first mesa is covered a sloping surface part of said buried layer, said step (d) being carried out under conditions such that the growth rate of the buried layer on the sloping surface of the stripe of the first mesa is slower than that at other parts of the substrate, said top surface of the stripe of the first mesa forming a stripe of a second mesa together with the sloping surface of said buried layer, said stripe of the second mesa having a smaller inclination than said stripe of the first mesa;
(e) removing the dielectric layer by an etching; and
(f) forming a double heterostructure made up of a plurality of semiconductor layers on the stripe of the second mesa by a metal organic vapor phase epitaxy (MOVPE), said double heterostructure including an active layer and first and second cladding layers which sandwich the active layer, and is provided along the main face of the first mesa and along the sloping surface of the second mesa.

20. A method of producing a semiconductor laser comprising the steps of:
(a) forming on a substrate a mask having a stripe opening which extends in a $<110>$ direction of the substrate, said substrate being made of a compound semiconductor of a first conductor type;
(b) forming a stripe projection part on the substrate which is exposed within the stripe opening by a metal organic vapor phase epitaxy (MOVPE), said stripe projection part having one of a triangular and a trapezoidal cross section with a (111)B face as its sloping surface and being made of a compound semiconductor;
(c) forming a blocking layer on the substrate by a metal organic vapor phase epitaxy (MOVPE) so as to cover the (111)B face under a predetermined condition such that a growth rate of the blocking layer on the sloping surface of the stripe projection part is slower than that at other parts of the substrate; and (d) forming a stripe part which acts as a wave guide and a bent part provided on both sides of the stripe part for trapping light by successively growing a first cladding layer, an active layer and a second cladding layer, said stripe part being formed above said stripe projection part, said bent part having a (311)B face as its sloping surface, said first and second cladding layers being respectively made of mutually opposite first and second conductor types.

* * * * *